US009472660B2

(12) United States Patent
Lu

(10) Patent No.: US 9,472,660 B2
(45) Date of Patent: Oct. 18, 2016

(54) SEMICONDUCTOR DEVICE

(71) Applicant: FUJI ELECTRIC CO. LTD., Kawasaki-shi (JP)

(72) Inventor: Hong-fei Lu, Matsumoto (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 0 days.

(21) Appl. No.: 14/274,170

(22) Filed: May 9, 2014

(65) Prior Publication Data

US 2014/0246721 A1    Sep. 4, 2014

Related U.S. Application Data

(63) Continuation of application No. 13/070,182, filed on Mar. 23, 2011, now Pat. No. 8,749,017.

(30) Foreign Application Priority Data

Mar. 24, 2010    (JP) .................................. 2010-067569

(51) Int. Cl.
   *H01L 29/66*    (2006.01)
   *H01L 29/78*    (2006.01)
   (Continued)

(52) U.S. Cl.
   CPC ....... *H01L 29/7818* (2013.01); *H01L 29/0615* (2013.01); *H01L 29/1095* (2013.01);
   (Continued)

(58) Field of Classification Search
   CPC ...................... H01L 29/0619; H01L 29/0615;
      H01L 29/7811; H01L 29/0634; H01L 29/402;
      H01L 29/404; H01L 29/408
   See application file for complete search history.

(56) References Cited

U.S. PATENT DOCUMENTS

| 4,648,174 A | 3/1987 | Temple et al. |
| 4,672,738 A | 6/1987 | Stengl et al. |

(Continued)

FOREIGN PATENT DOCUMENTS

| JP | 61-084830 A | 4/1986 |
| JP | 01-270346 A | 10/1989 |

(Continued)

OTHER PUBLICATIONS

Baliga, Jayant B. "Fundamentals of Power Semiconductor Devices" (US), first edition, Springer Science & Business Media, 2008, p. 137.

(Continued)

*Primary Examiner* — Bradley K Smith
*Assistant Examiner* — David Goodwin
(74) *Attorney, Agent, or Firm* — Rossi, Kimms & McDowell LLP

(57) ABSTRACT

A semiconductor device including: a first conductivity type n-type drift layer; a second conductivity type VLD region which is formed on a chip inner circumferential side of a termination structure region provided on one principal surface of the n-type drift layer and which is higher in concentration than the n-type drift layer; a second conductivity type first clip layer which is formed on a chip outer circumferential side of the VLD region so as to be separated from the VLD region and which is higher in concentration than the n-type drift layer; and a first conductivity type channel stopper layer which is formed on a chip outer circumferential side of the first clip layer so as to be separated from the first clip layer and which is higher in concentration than the n-type drift layer. Thus, it is possible to provide a semiconductor device having a stable and high breakdown voltage termination structure in which the length of a termination structure region is small as well as the immunity to the influence of external charge is high.

13 Claims, 42 Drawing Sheets

(51) Int. Cl.
  *H01L 29/739* (2006.01)
  *H01L 29/10* (2006.01)
  *H01L 29/06* (2006.01)
  *H01L 29/40* (2006.01)
  *H01L 21/266* (2006.01)
  *H01L 29/861* (2006.01)
  *H01L 29/08* (2006.01)

(52) U.S. Cl.
  CPC ... *H01L29/66348* (2013.01); *H01L 29/66734* (2013.01); *H01L 29/7397* (2013.01); *H01L 29/7811* (2013.01); *H01L 29/7813* (2013.01); *H01L 21/266* (2013.01); *H01L 29/0619* (2013.01); *H01L 29/0638* (2013.01); *H01L 29/0878* (2013.01); *H01L 29/402* (2013.01); *H01L 29/8611* (2013.01)

(56) References Cited

U.S. PATENT DOCUMENTS

| | | | |
|---|---|---|---|
| 5,113,237 A | | 5/1992 | Stengl |
| 5,552,625 A * | | 9/1996 | Murakami et al. ............ 257/409 |
| 6,445,054 B1 | | 9/2002 | Traijkovic et al. |
| 6,770,917 B2 | | 8/2004 | Barthelmess et al. |
| 7,541,643 B2 * | | 6/2009 | Ono et al. ..................... 257/341 |
| 7,586,161 B2 * | | 9/2009 | Pfirsch ............... H01L 29/0615 257/378 |
| 7,737,469 B2 | | 6/2010 | Saito et al. |
| 7,897,471 B2 * | | 3/2011 | Hao ............................. 438/288 |
| 8,013,340 B2 | | 9/2011 | Schmidt |
| 8,125,036 B2 | | 2/2012 | Schmidt |
| 2003/0006497 A1 | | 1/2003 | Hiyoshi et al. |
| 2006/0043480 A1 * | | 3/2006 | Tsuchitani et al. ............ 257/341 |
| 2009/0045481 A1 | | 2/2009 | Niimura et al. |
| 2010/0052047 A1 * | | 3/2010 | Schmidt ......................... 257/330 |
| 2012/0012306 A1 | | 1/2012 | Treadaway et al. |

FOREIGN PATENT DOCUMENTS

| | | | |
|---|---|---|---|
| JP | 07-273325 A | | 10/1995 |
| JP | 08-088346 A | | 4/1996 |
| JP | 2003-023158 A | | 1/2003 |
| JP | 2003-101039 A | | 4/2003 |
| JP | 2003-197911 A | | 7/2003 |
| JP | 2004-349556 A | | 12/2004 |
| JP | 2008-004643 A | | 1/2008 |
| JP | 2009-016618 A | | 1/2009 |
| JP | 2009-038356 A | | 2/2009 |
| JP | 2009-187994 A | | 8/2009 |

OTHER PUBLICATIONS

Trajkovic, T. et al. "The effect of static and dynamic parasitic charge in the termination area of high voltage devices and possible solutions" ISPSD'2000 Copyright 2000 by the IEEE Catalog No. 00CH37094C.

Stengl, R. et al. "Variation of Lateral Doping—A New Concept to Avoid High Voltage Breakdown of Planar Junctions" p. 154-157; 1985 IEEE, Siemens Research Laboratories, Otto-Hahn-Ring 6, 8000 Munchen 83.

Stengl, R. et al. "Variation of Lateral Doping as a Field Terminator for High Voltage Power Devices" IEEE Transactions on Electron Devices, vol. Ed-33, No. 3, Mar. 1986; p. 426-428.

Japanese Office Action cited in Japanese counterpart application No. JP2010-067569, dated Nov. 12, 2013. English translation provided.

* cited by examiner

FIG. 1

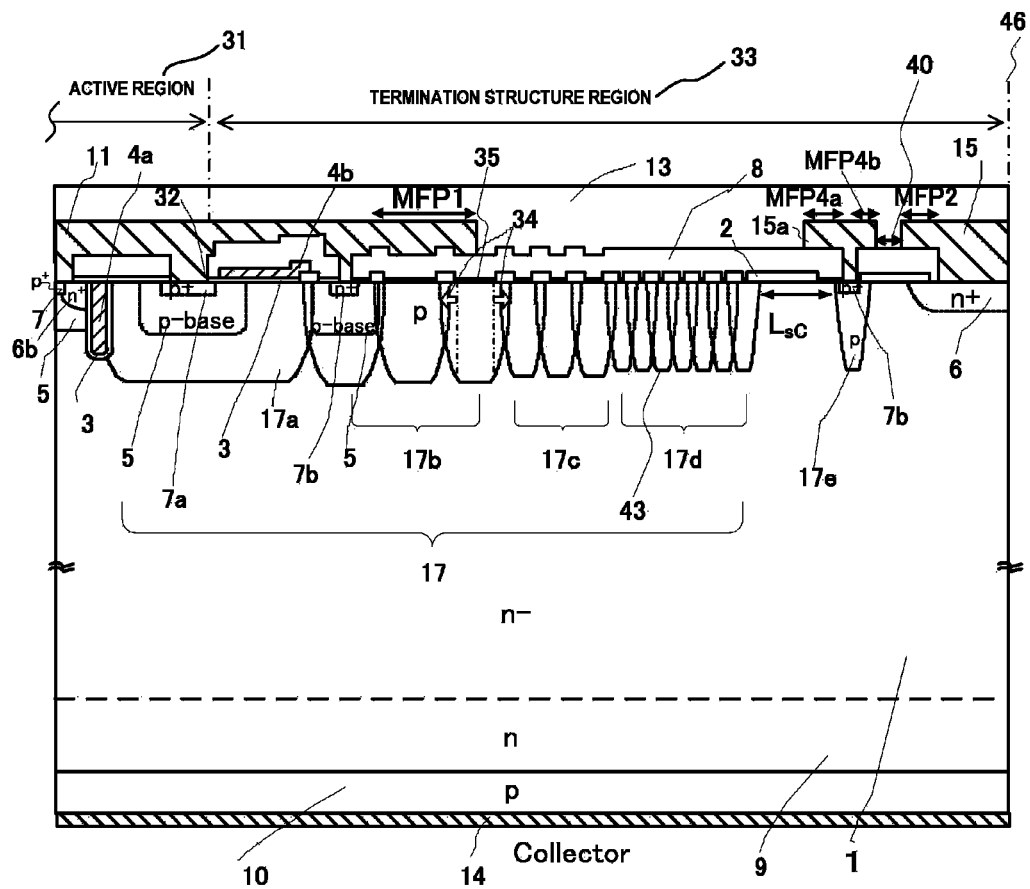

| 1 · · · | n-TYPE DRIFT LAYER | 14 · · · | COLLECTOR ELECTRODE |
| 2 · · · | SEPARATION OXIDE FILM | 15 · · · | STOPPER FIELD PLATE |
| 3 · · · | GATE OXIDE FILM | 15a · · · | CLIP FIELD PLATE |
| 4a · · · | GATE POLYSILICON | 17 · · · | VLD REGION |
| 4b · · · | GATE POLYSILICON RUNNER | 17a,17b,17c,17d · · · | p-TYPE DIFFUSION LAYER |
| 5 · · · | p-TYPE BASE LAYER | 17e · · · | CLIP p LAYER |
| 6 · · · | CHANNEL STOPPER LAYER | 31 · · · | ACTIVE REGION |
| 6b · · · | n+ EMITTER LAYER | 32 · · · | ACTIVE END PORTION |
| 7,7a,7b · · · | p+ REGION | 33 · · · | TERMINATION STRUCTURE REGION |
| 8 · · · | INTERLAYER INSULATING FILM | 34 · · · | LATERAL DIFFUSION PORTION |
| 9 · · · | n-TYPE FIELD STOP LAYER | 40 · · · | SPACING REGION |
| 10 · · · | p-TYPE COLLECTOR LAYER | 43 · · · | pn JUNCTION |
| 11 · · · | EMITTER ELECTRODE | 46 · · · | CHIP OUTER CIRCUMFERENTIAL END |
| 13 · · · | PASSIVATION FILM | | |

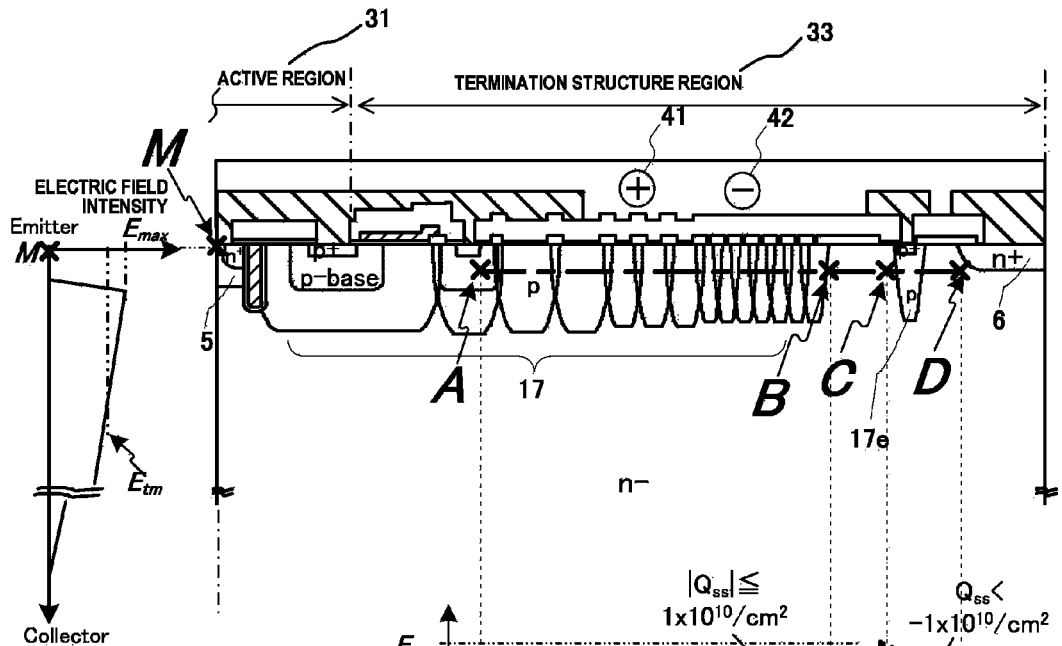
FIG. 2(a)
FIG. 2(b)
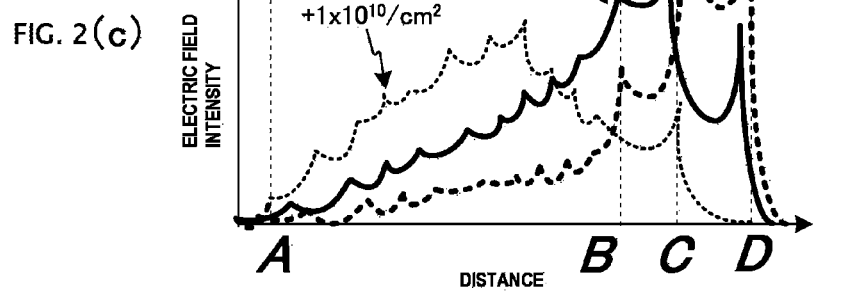
FIG. 2(c)
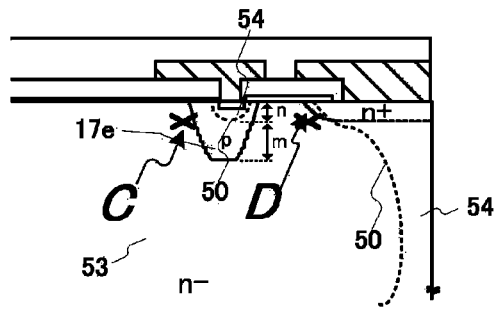
FIG. 2(d)

FIG. 3

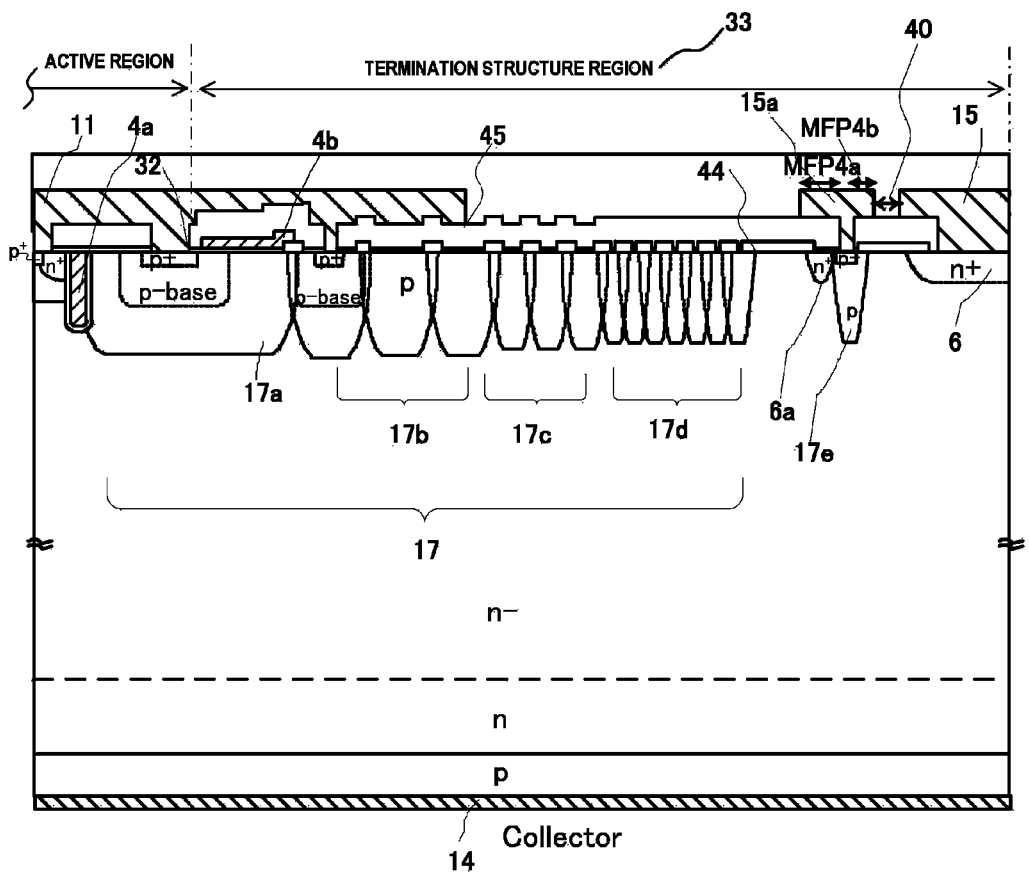

| | | | |
|---|---|---|---|
| 4a · · · | GATE POLYSILICON | 14 · · · | COLLECTOR ELECTRODE |
| 4b · · · | GATE POLYSILICON RUNNER | 15 · · · | STOPPER FIELD PLATE |
| 6 · · · | CHANNEL STOPPER LAYER | 15a · · · | CLIP FIELD PLATE |
| 6a · · · | CLIP n LAYER | 17 · · · | VLD REGION |
| 6b · · · | n+ EMITTER LAYER | 17a,17b,17c,17d · · · | p-TYPE DIFFUSION LAYER |
| 11 · · · | EMITTER ELECTRODE | 17e · · · | CLIP p LAYER |
| | | 32 · · · | ACTIVE END PORTION |
| | | 33 · · · | TERMINATION STRUCTURE REGION |
| | | 40 · · · | SPACING REGION |
| | | 44 · · · | VLD REGION |
| | | 45 · · · | EMITTER END PORTION |

FIG. 9(a)
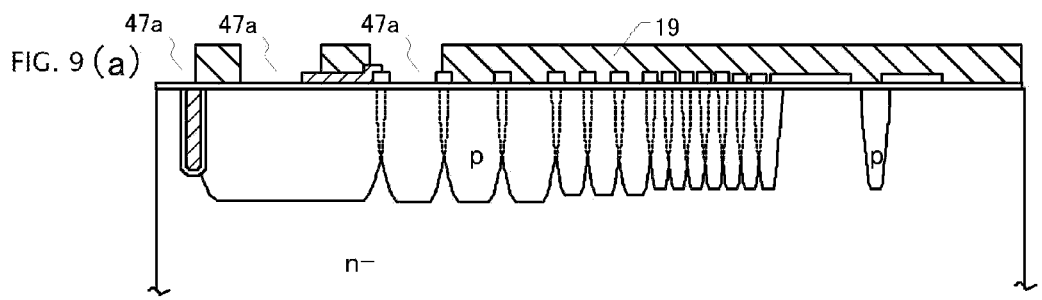
FIG. 9(b) Boron
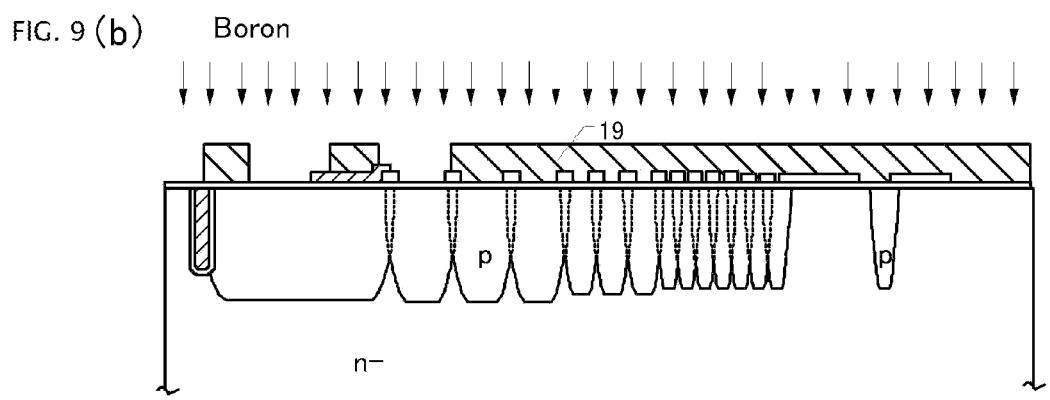
FIG. 9(c)
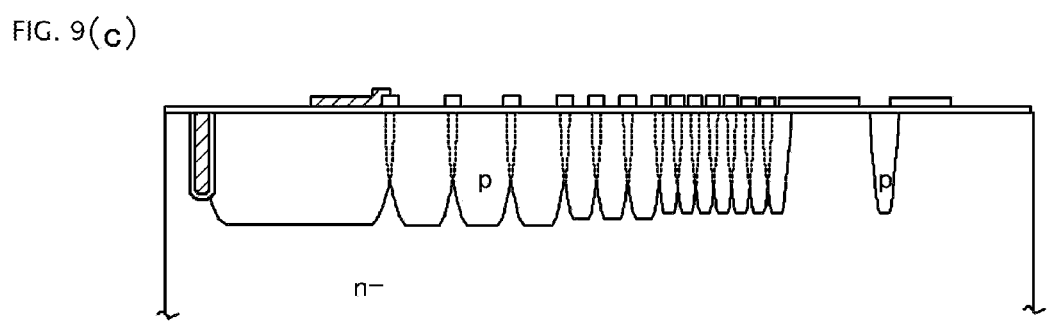
FIG. 9(d)
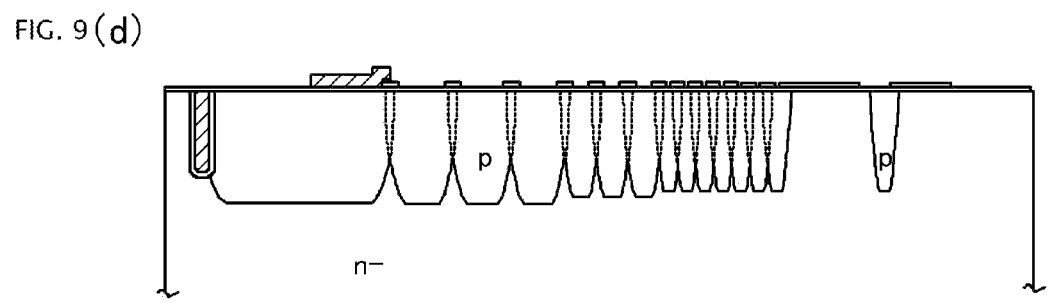

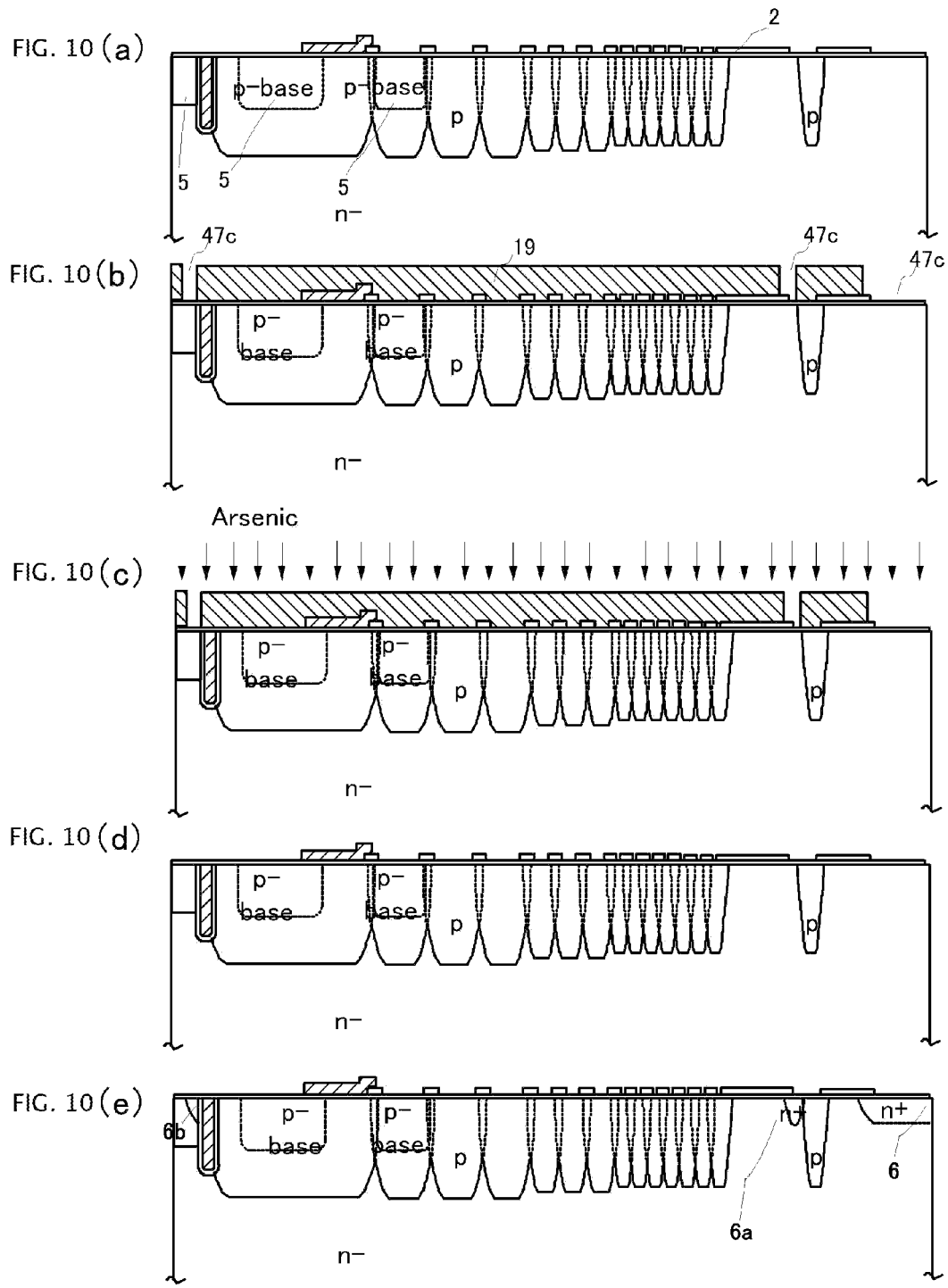

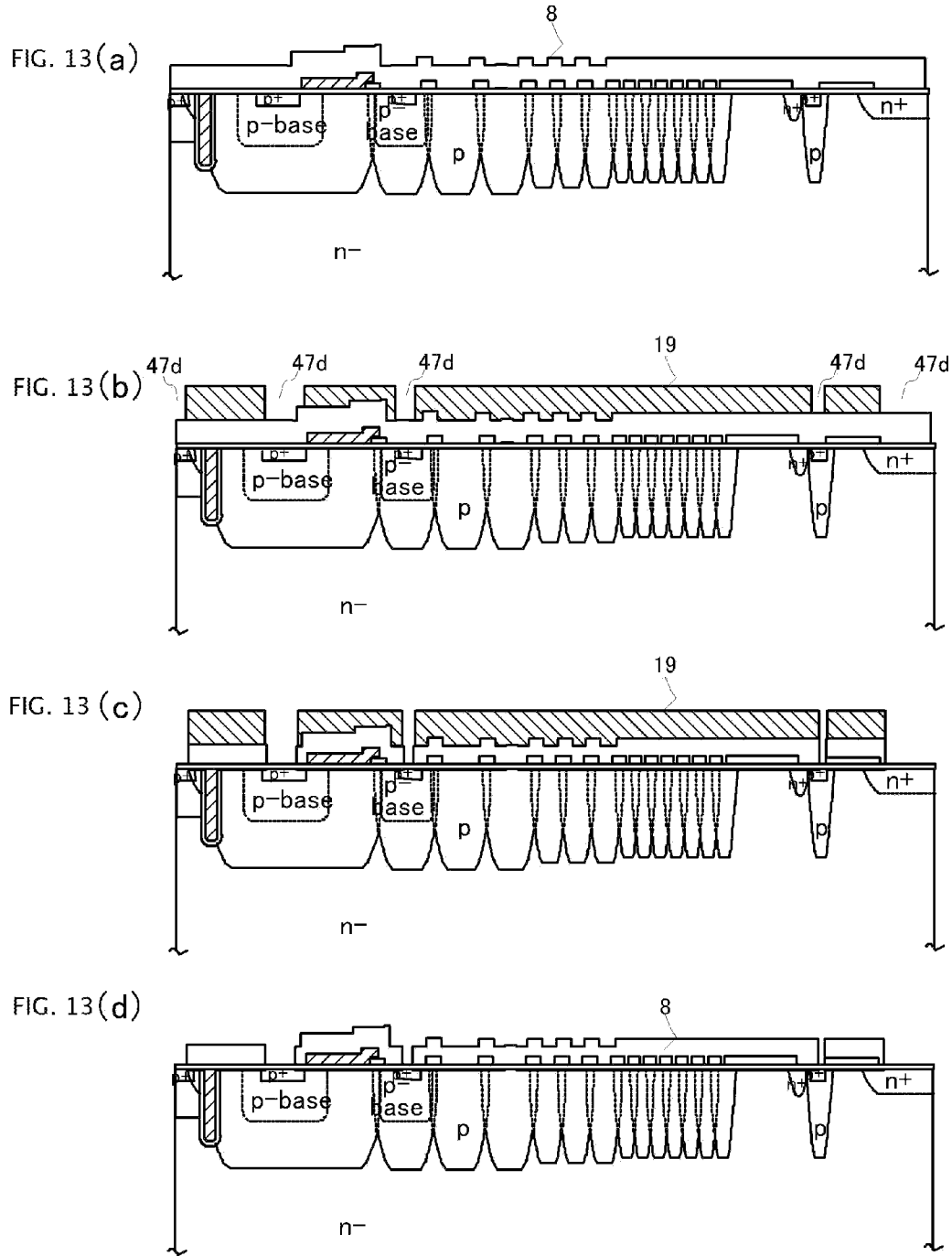

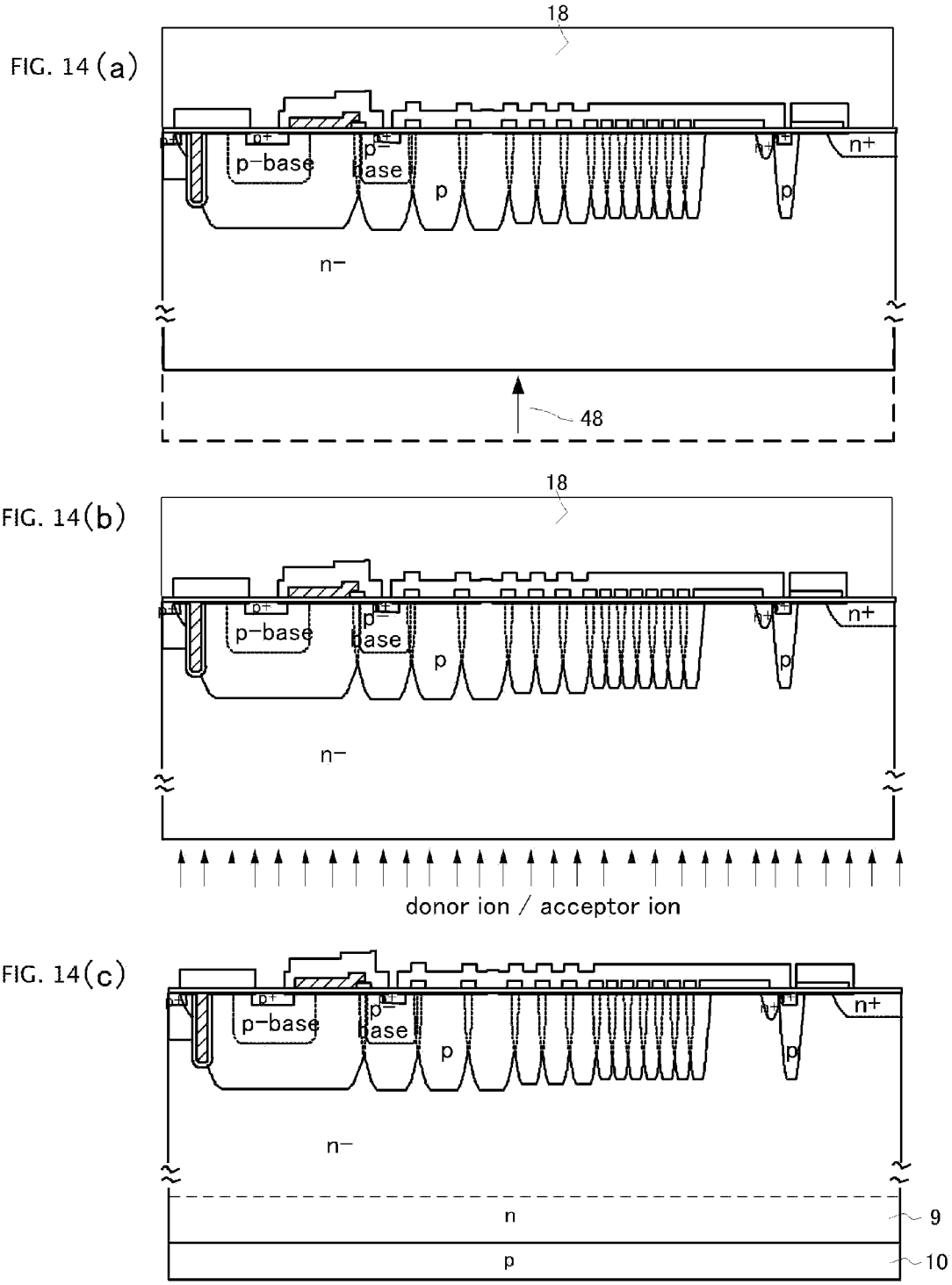

17 · · · VLD REGION
17a,17b,17c,17d · · · p-TYPE DIFFUSION LAYER
28 · · · ENVELOPE CURVE

SEMICONDUCTOR DEVICE

BACKGROUND OF THE INVENTION

1. Field of the Invention

The present invention relates to a termination structure for semiconductor devices, especially, high breakdown voltage semiconductor devices (such as diodes, IGBTs or MOSFETs) used in power converters or the like.

2. Description of the Related Art

High breakdown voltage discrete power devices play a central role in power converters. The devices include elements such as insulated gate bipolar transistors (IGBTs), and metal oxide semiconductor field-effect transistors (MOSFETs). Each of the devices consists of an active portion which controls a current, and a termination structure (or edge structure) which ensures breakdown voltage. Although it is a matter of course that the breakdown voltage of an ideal termination structure is higher than that of the active portion, the breakdown voltage of the termination structure must endure the influence of external ions. For example, a discrete element formed in such a manner that a power semiconductor chip is sealed with a resin is a form type of power semiconductor device (IGBT, MOSFET, diode, etc.) products. A power module formed in such a manner that a power semiconductor chip is housed in a housing or a power semiconductor chip and a control circuit chip are housed in a housing is another form type. External ions always exist in a peripheral environment of power converters using these power semiconductor devices. The external ions come from a sealing material (gel, epoxy resin, etc.) used in packages of these discrete elements or power modules and reach a surface of a termination structure. The external ions which have reached the surface of the termination structure pass through a passivation layer of the device and reach an upper portion of a silicon region of the device to cause deterioration of the breakdown voltage of the termination portion. Accordingly, not only the module/package material and the passivation material of the element must have functions of suppressing the influence of external ions but also the configuration of the termination structure region per se must be designed as a structure capable of suppressing the influence of external charge (external ions), that is, to have resistance thereto.

A guard ring structure (hereinafter simply referred to as guard ring structure) flanked with conductive field plate has been heretofore used widely as a termination structure. For example, the guard ring structure has been disclosed in B. Jayant Baliga "Fundamentals of Power Semiconductor Devices" (US), first edition, Springer Science+Business Media, 2008, p. 137. FIG. 41 is a sectional view showing the guard ring structure. A p$^+$ guard ring 20a which is connected to an emitter electrode 11 and p$^+$ guard rings 20b to 20f which are not connected to the emitter electrode 11 so as to be electrically floating are formed in a termination structure region 33. A channel stopper layer 6 is formed at an outer circumferential end of the device (at a right end of the termination structure region 33 in FIG. 41) so as to be distant from the p$^+$ guard ring 20f. Conductive field plates 21a to 21e are connected to the p$^+$ guard rings 20b to 20f respectively and a field plate (stopper field plate 15) of the channel stopper layer 6 is connected to the channel stopper layer 6. This field plate-including guard ring structure has excellent characteristics in charge resistance because the influence of external charge coming from the outside on electric characteristic is a little. In the termination structure region 33, silicon oxide films such as separation oxide films 2 or interlayer insulating films 8 formed on a surface are covered with the field plates 21a to 21e to thereby prevent movement of an equipotential surface generated when external charge reaches the vicinity of the oxide films. Moreover, because potential in the vicinity of each of the p$^+$ guard rings 20a to 20f follows the equipotential surface distribution of a depletion layer spread inside silicon, potential of each of the p$^+$ guard rings 20a to 20f per se is stable. Because the stable potential determines potential of each of the field plates 21a to 21e, the silicon oxide film exposed from the surface of the termination structure region is prevented more sufficiently from being affected by external charge.

A structure for preventing more sufficiently the influence of external charge coming from the outside has been disclosed in U.S. Pat. No. 6,445,054 (FIG. 42). When external charge is present in the surface of the termination structure region 33, charge is induced between the surface of the n-type drift layer 1 confronting the separation oxide film 2 and the separation oxide film 2 and between the surface of the n-type drift layer 1 and the interlayer insulating film 8. The n-channel stopper layer 6 equipotential to a collector electrode 14 is electrically connected to the emitter electrode 11 by the charge, so that a large leakage current is generated or the breakdown voltage is deteriorated. To prevent the electrical connection, n-type channel stopper layers 23 higher in concentration than the n-type drift layer are formed so as to be adjacent to the active region sides of the p$^+$ guard rings 20b to 20f, respectively. Similarly, p-type channel stopper layers 22 are formed so as to be adjacent to the device outer circumferential sides of the p$^+$ guard rings 20a to 20f, respectively. For example, when positive external charge comes into the surface of the termination structure region, an electron storage layer where electrons are stored as negative charge is formed in an SiO$_2$/Si interface of the n-type drift layer 1. Therefore, electrical connection between the collector electrode and the emitter electrode by the electron storage layer is suppressed by the p-type channel stopper layers 22. On the other hand, when negative external charge comes into the surface of the termination structure region, a hole storage layer where holes are stored as positive charge is formed in the SiO$_2$/Si interface of the n-type drift layer 1. Therefore, electrical connection between the collector electrode and the emitter electrode by the hole storage layer is suppressed by the n-type channel stopper layers 23.

On the other hand, a structure shown in FIG. 43 has been disclosed in JP-A-2003-23158 in order to shorten the length of the termination structure region. According to FIG. 43, a RESURF (Reduced Surface Electric Field) layer 38 having a RESURF effect is formed in the termination structure region so as to be adjacent to a p$^+$ layer connected to the emitter electrode 11. The RESURF layer 38 is a layer sufficiently lower in concentration than a general guard ring layer, so that the RESURF layer 38 can have a shorter distance than that of the guard ring structure to relax electric field intensity.

A termination structure dubbed VLD (Variation of Lateral Doping) has been disclosed in JP-A-Sho-61-84830 (FIG. 40). That is, a p-type dopant (such as boron) is imported and diffused into a terminal structure region through a large number of opening portions in the separation oxide film 2. As shown in FIG. 40, lateral diffusion portions of p-type diffusion layers 17a to 17d adjacent to one another overlap with one another. The widths of the opening portions are reduced in a direction of from the chip inner circumferential side to the chip outer circumferential side, and the ratio of each opening portion to the separation oxide film is reduced.

Therefore, the p-type diffusion layers 17a to 17d are formed so that both diffusion depth and concentration are reduced in a direction of from the chip inner circumferential side to the chip outer circumferential side. A pn junction between the p-type diffusion layers 17a to 17d and the n-type drift layer 1 is generally formed as a distribution of envelop curves of the p-type diffusion layers 17a to 17d or wavy curves based on the envelope curves. The aforementioned termination structure shown in FIG. 40 is called VLD structure. A region where the p-type diffusion layers 17a to 17d overlap with one another is called VLD region 17. Because the lateral diffusion portions of the adjacent p-type diffusion layers 17a to 17d overlap with one another, the length of the termination structure region is substantially equal to the length of the RESURF layer, so that the VLD structure becomes sufficiently shorter than the guard ring structure.

In the aforementioned guard ring structure, the length occupied by the termination structure region in the chip generally becomes large because of the width of each p+ guard ring layer per se and the number of p+ guard ring layers arranged. For this reason, the ratio of the area occupied by the termination structure region in the chip becomes large when the guard ring structure is used for a high breakdown voltage (e.g. 1700 V or higher) device in which the termination structure region must be long inevitably or when the guard ring structure is used for a small current purpose in which the area of a device chip becomes small. As a result, the number of chips fractionated from one silicon wafer is reduced to cause a problem that chip cost increases.

In the RESURF structure, it is necessary to distribute potential of silicon surface (equipotential surface) equally. For this reason, the silicon oxide films cannot be covered with the field plates, so that the equipotential surface distribution shape of the RESURF structure portion varies sensitively according to external charge to thereby lower the breakdown voltage.

In the VLD structure, the concentration of the p-type diffusion layers (hereinafter referred to as VLD region) of the termination structure region can be set to be relatively higher than that of the RESURF structure, so that in this respect, the VLD structure is hardly affected by external charge. However, the stability of the VLD structure is inferior to that of the guard ring structure yet. As described above, when external charge comes flying, the equipotential surface distribution shape in the termination structure region changes. For this reason, the electric field intensity distribution in the vicinity of the semiconductor surface of the termination structure region changes, so that the position of maximum electric field intensity shifts to the chip inner circumferential side or outer circumferential side in accordance with the polarity of external charge. In the case of a p-type VLD structure, the maximum electric field intensity according to positive external charge moves only in the inside of the VLD structure because the depletion layer shifts to the chip inner circumferential side. That is, the VLD structure can absorb the influence of positive external charge. However, one of the maximum electric field intensity maxima according to negative external charges moves to the outer circumferential side of the VLD region because the depletion layer shifts to the chip outer circumferential side. As a result, the electric field intensity in the VLD region is reduced. The voltage allowed to be withstood by the voltage breakdowning structure is a laterally integrated value of electric field intensity. As a result of shifting of the depletion layer, the integrated value in the VLD structure portion is reduced so that the voltage change cannot be absorbed. For this reason, even in the VLD structure, the breakdown voltage according to negative external charge is reduced.

SUMMARY OF THE INVENTION

In consideration of the above described prior arts, object of the invention is to provide a semiconductor device having a stable and high breakdown voltage termination structure in which a termination structure region is short as well as highly immune to the influence of external charge To solve the problem and achieve the object of the invention, the invention provides a semiconductor device including: a first electrode formed on one principal surface of a first conductivity type semiconductor substrate; a second electrode formed on the other principal surface of the semiconductor substrate; a second conductivity type base layer formed on the one principal surface of the semiconductor substrate so as to be connected to the first electrode; a second conductivity type VLD region provided on an outer circumferential side of the base layer; and a first or second conductivity type stopper layer provided on an outer circumferential side of the VLD region so as to be separated from the VLD region; wherein: the semiconductor device further includes a second conductivity type first clip layer which is provided between the VLD region and the stopper layer so as to be separated from the VLD region and the stopper layer and which is higher in concentration than the semiconductor substrate.

The structure of the semiconductor device according to the invention is characterized in that the second conductivity type first clip layer is provided on the outer circumferential side of the VLD region. According to this structural characteristic, electric field intensity in the vicinity of the first clip layer can be increased even when a depletion layer is spread to the chip outer circumferential side because of external charge coming flying on an upper surface of the termination structure region, so that a lowering of a bearable voltage (breakdown voltage) can be suppressed.

The invention is further characterized in that a spacing region is provided for separating the first clip layer and the stopper layer from each other. According to this characteristic, maximum electric field intensity is fixed in the vicinity of the first clip layer even when the place of maximum electric field intensity shifts to the outer circumferential side of the VLD region. Moreover, the provision of the spacing region permits a high voltage to be endured by the spacing region. As a result, lowering of the breakdown voltage can be prevented against external charge with both positive and negative polarities.

Preferably, a depletion layer spreading from a joint surface between the first clip layer and the first conductivity type semiconductor substrate into the first clip layer when a voltage equivalent to an avalanche breakdown voltage of the semiconductor device is applied between the second electrode and the first electrode is thicker than a charge neutral region which is a remaining non-depleted portion of the first clip layer.

Assume now that the concentration of the first clip layer is so high that no depletion occurs. Then, when the depletion layer (equipotential surface) shifts to the outer circumferential side of the VLD region because of external charge, the first clip layer prevents the depletion layer from spreading. For this reason, a high electric field region is generated locally in the vicinity of the first clip layer, so that an avalanche current is generated to reduce the breakdown voltage. To prevent high electric field intensity from being generated locally in the vicinity of the first clip layer, equipotential surface density in the inside of the first clip layer may be reduced. It is therefore preferable that the depletion layer is spread into the first clip layer as sufficiently as possible. It is particularly preferable that the depletion layer spreading into the first clip layer is deeper than a remaining non-depletion portion of the first clip layer. In this manner, electric field intensity in the first clip layer can be absorbed so sufficiently that high electric field intensity can be prevented from being generated locally.

Preferably, the semiconductor device further includes a first conductivity type second clip layer which is provided on an outer circumferential side of the VLD region and on an inner circumferential side of the first clip layer so as to be separated from the VLD region and which is higher in concentration than the semiconductor substrate.

When negative external charge reaches an upper surface of the termination structure region, a channel of carriers (holes) is formed in a semiconductor surface in an interface between an oxide film for protecting the upper surface of the semiconductor region and the semiconductor region. A leakage current path is generated between the first electrode and the second electrode through the carrier channel, so that this causes a leakage current. On the contrary, the channel of holes can be eliminated by the second clip layer.

Chief ones of preferred means concerned with the invention will be described. Other means will be described later in "DETAILED DESCRIPTION OF THE INVENTION".

Preferably, the first clip layer is deeper than the second clip layer.

When the depletion layer spreads in the termination structure region from the chip inner circumferential side to the chip outer circumferential side, the depletion layer is not stopped by the second clip layer and can reach the first clip layer if the first clip layer is deeper than the second clip layer.

Preferably, the second clip layer is adjacent to the first clip layer.

In this case, the depletion layer little collides with the second clip layer and can reach the first clip layer, so that electric field intensity can be relaxed.

Preferably, a first field plate is formed on a surface of the first clip layer.

In this case, surface potential of the first clip layer is fixed over the whole of the region where the first field plate is formed. Accordingly, equipotential surface change based on external charge coming flying can be reduced more sufficiently.

Preferably, the length of the first field plate toward an inner circumferential side of the first clip layer is larger than the length of the first field plate toward an outer circumferential side of the first clip layer.

Spreading of the depletion layer into the first clip layer on the chip inner circumferential side is larger than that on the chip outer circumferential side. For this reason, electric field intensity in the vicinity of the chip inner circumferential side of the first clip layer increases. Accordingly, the length on the chip inner circumferential side of the first field plate should be set to be larger than the length on the chip outer circumferential side of the first field plate, by this way the electric field intensity in the vicinity of the chip inner circumferential side of the first clip layer can be relaxed.

Preferably, the second clip layer is covered with the first field plate through an insulating film.

The second clip layer is of the same first conductivity type as that of the semiconductor substrate and higher in concentration than the semiconductor substrate. For this reason, when the depletion layer reaches the second clip layer, electric field intensity increases to a very large value. When the second clip layer is formed on the outer circumferential side of the inner circumferential side end portion of the first field plate, the second clip layer is covered with the first field plate. For this reason, the depletion layer does not reach the second clip layer, so that the local increase of electric field intensity can be prevented.

Preferably, an outer circumferential side end portion of the VLD region is located on an outer circumferential side of an outer circumferential side end portion of the first electrode.

Relaxation of electric field intensity in the VLD region is obtained when an equipotential surface is brought out of the protection oxide films formed on the surface of the VLD region. It is therefore preferable that the outer circumferential side end portion of the first electrode is provided on an inner circumferential side of the outer circumferential side end portion of the VLD region.

Preferably, a second field plate is provided in the stopper layer so that the first field plate is separated from the second field plate.

When the first field plate and the second field plate are separated from each other in the upper surface of the spacing region, equipotential surfaces are distributed to the spacing region. As a result, the voltage can be endured by the spacing region even when the depletion layer shifts to the chip outer circumferential side as described above.

As described above, in accordance with the invention, it is possible to provide a semiconductor device having a stable and high breakdown voltage termination structure in which the length of a termination structure region is so small that the influence of external charge is very little.

BRIEF DESCRIPTION OF THE DRAWINGS

FIG. 1 is a sectional view showing important part of a semiconductor device according to an embodiment of the invention;

FIG. 2A is a sectional view showing important part of the semiconductor device according to this embodiment;

FIGS. 2B to 2D are schematic views showing operation of the semiconductor device according to this embodiment;

FIG. 3 is a sectional view showing important part of a semiconductor device according to an embodiment of the invention;

FIGS. 9A to 9D are sectional views of important part showing a process of producing the semiconductor device according to the embodiment of the invention;

FIGS. 10A to 10E are sectional views of important part showing a process of producing the semiconductor device according to the embodiment of the invention;

FIGS. 13A to 13D are sectional views of important part showing a process of producing the semiconductor device according to the embodiment of the invention;

FIGS. 14A to 14C are sectional views of important part showing a process of producing the semiconductor device according to the embodiment of the invention;

DETAILED DESCRIPTION OF THE INVENTION

Figure 4:
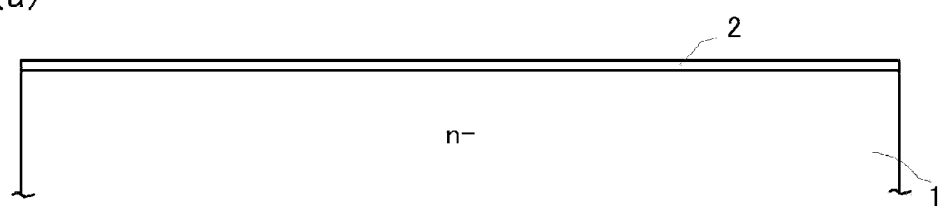
FIGS. 4A and 4B are sectional views of important part showing a process of producing the semiconductor device according to the embodiment of the invention.
Figure 4:
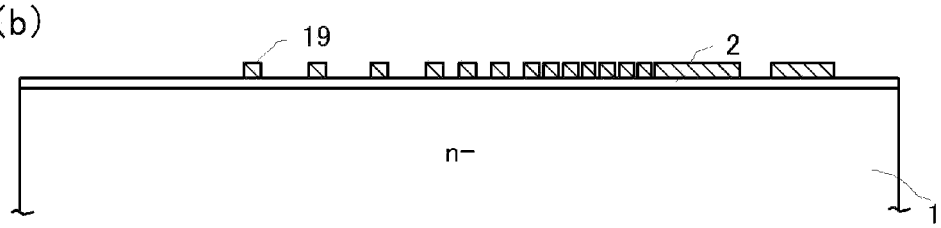
Figure 5A:
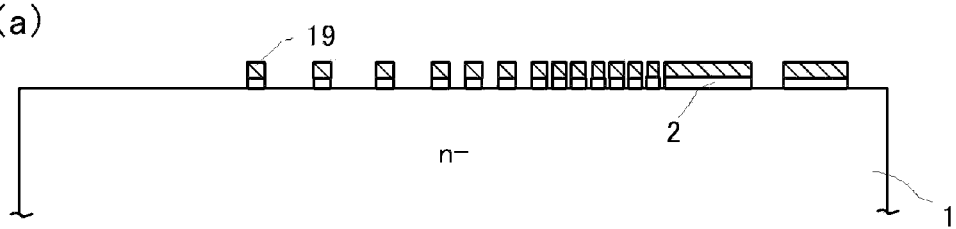
FIGS. 5A to 5E are sectional views of important part showing a process of producing the semiconductor device according to the embodiment of the invention.
Figure 5B:
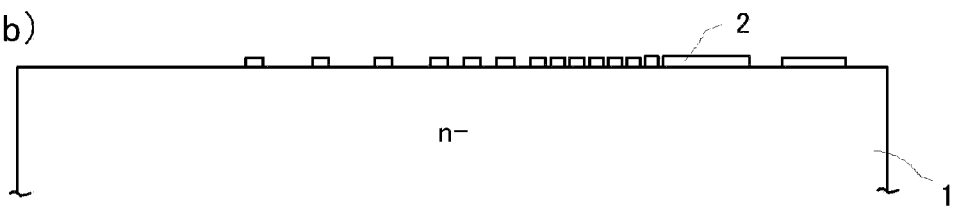
Figure 5C:
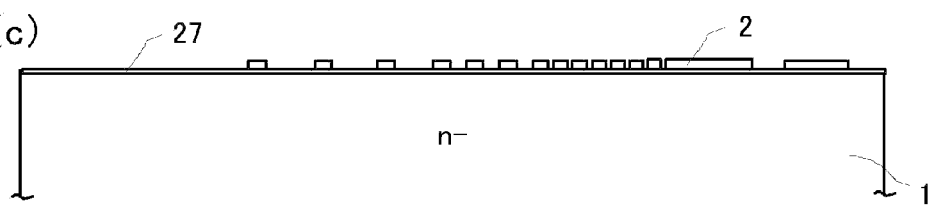
Figure 5D:
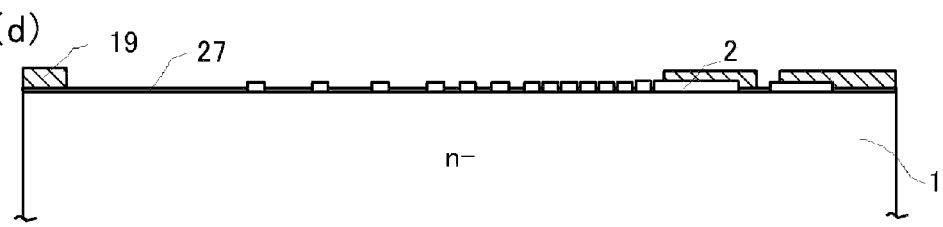
Figure 5E:
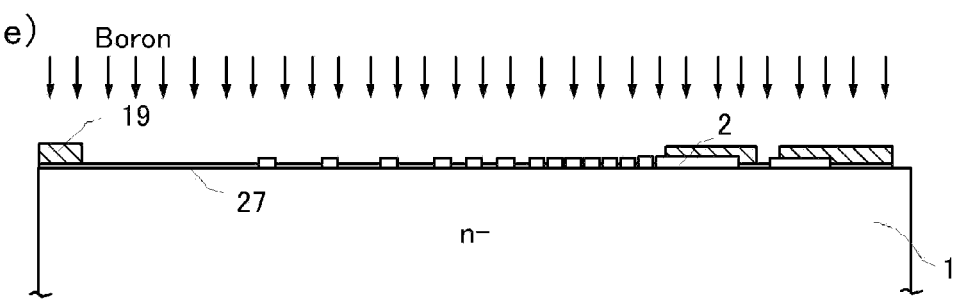
Figure 6A:
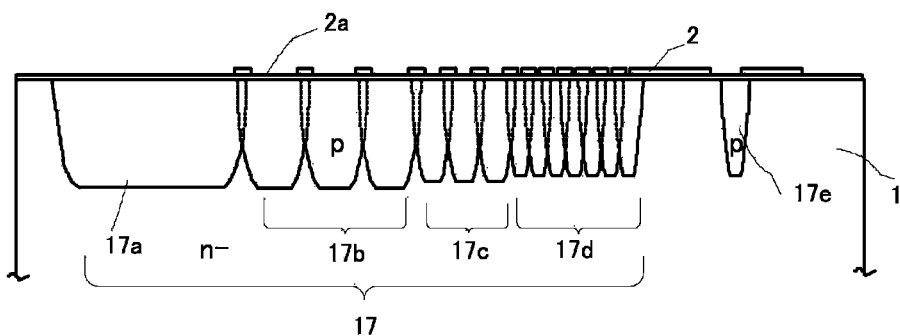
FIGS. 6A to 6D are sectional views of important part showing a process of producing the semiconductor device according to the embodiment of the invention.
Figure 6B:
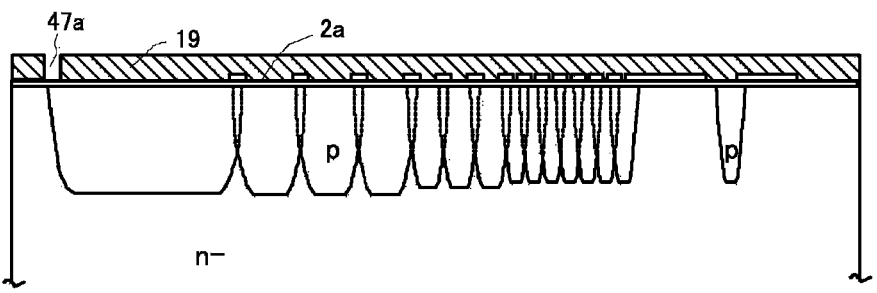
Figure 6C:
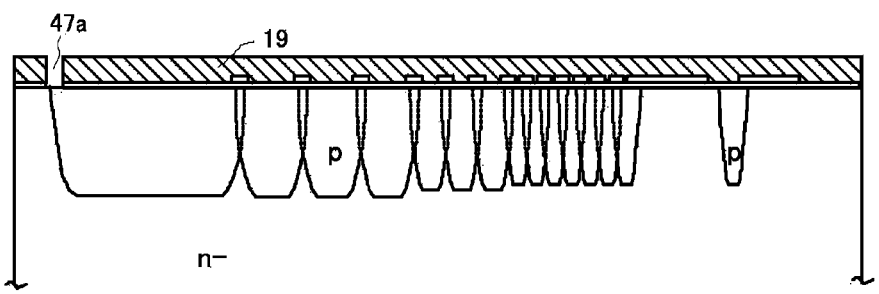
Figure 6D:
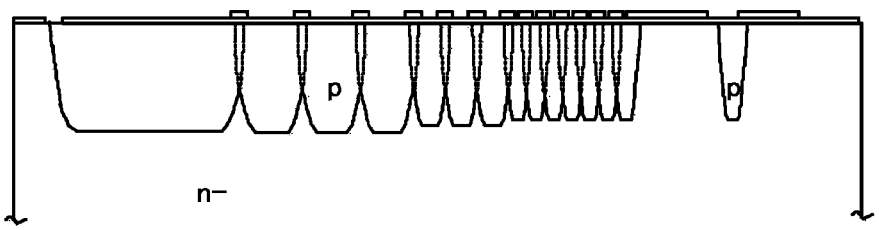
Figure 7A:
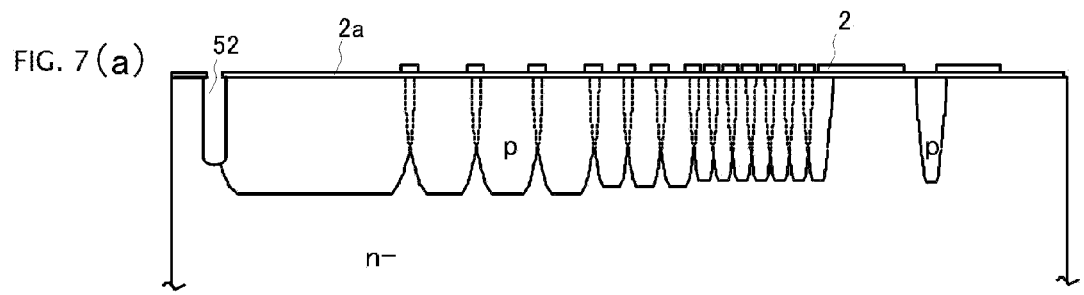
FIGS. 7A to 7D are sectional views of important part showing a process of producing the semiconductor device according to the embodiment of the invention.
Figure 7B:
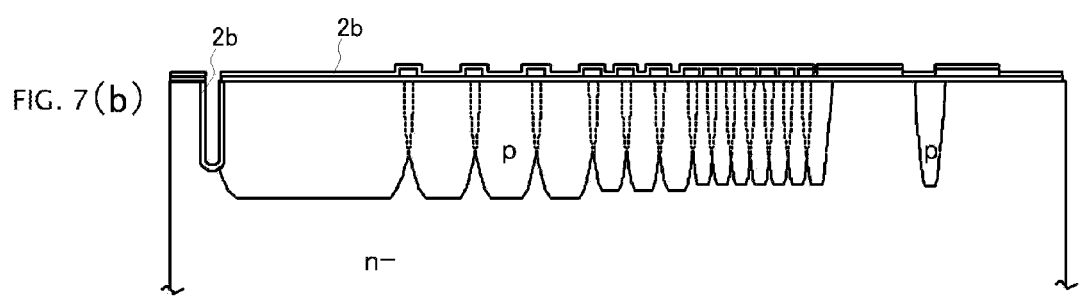
Figure 7C:
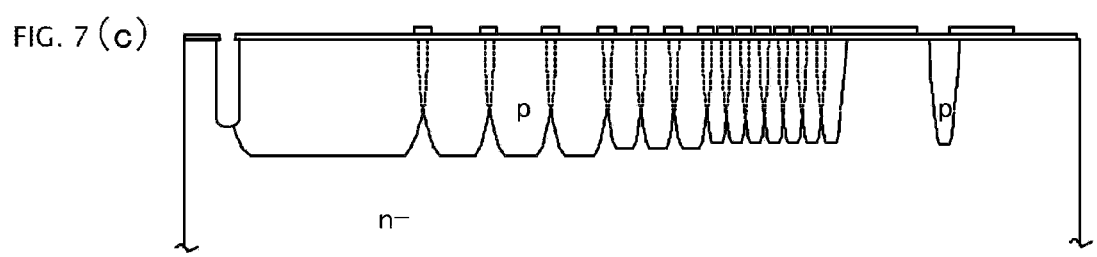
Figure 7D:
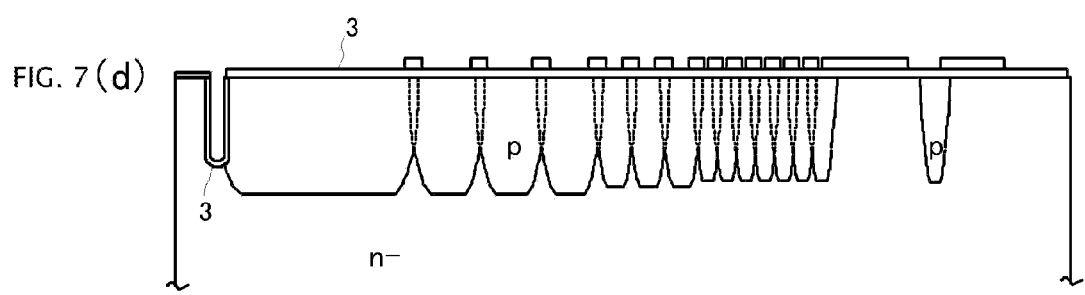
Figure 8:
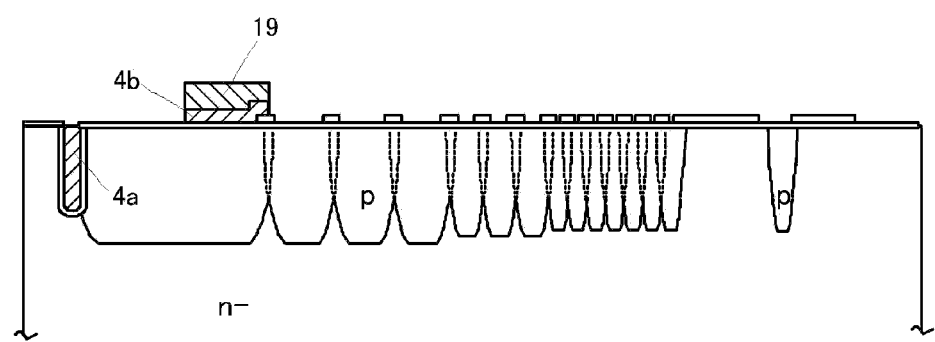
FIG. 8 is a sectional view of important part showing a process of producing the semiconductor device according to the embodiment of the invention.

Although a first conductivity type and a second conductivity type will be regarded as an n type and as a p type, respectively, the invention can be operated equally even when the n type and the p type are replaced with each other. Although the terms "device", "element", "semiconductor chip" and simply "chip" are used for a semiconductor device in this specification, each of the terms means a semiconductor device produced as a chip and indicates the same object. Although the device according to the invention will be described while an insulated gate bipolar transistor (IGBT) is taken as an example, the device according to the invention can be applied also to a well-known unipolar device such as an insulated gate transistor (MOSFET), or a well-known p-i-n diode.

A first clip layer and a second clip layer will be hereinafter referred to as "clip p layer" and "clip n layer" respectively based on the polarity relation between the p type and the n type.

The term "wafer" means a silicon substrate which has not been fragmented into chips yet.

In a semiconductor chip, a region where a first electrode (hereinafter referred to as emitter electrode) is formed so that a current can be applied to the region is called "active region". Then, a chip outer circumferential end portion in a region where the emitter electrode is in contact with the semiconductor substrate (hereinafter referred to as "n-type drift layer") or the like is defined as an outer circumferential end portion of the active region and called as "active end portion". A region which ranges from the active end portion to an outer circumferential end portion of the chip and which is a structure portion for relaxing electric field intensity generated in a chip surface when a voltage is applied to the element is called "termination structure region".

For example, the expression "1.0E12/cm$^2$" is used in description of concentration or the like. This means 1.0× 10$^{12}$/cm$^2$. The symbol "+" ("−") written in the right of each layer (p layer or n layer) shown in each drawing means that the impurity concentration of this layer is relatively higher (lower) than that of any other layer.

Specifically, the term "VLD region" means the following structure. That is, second conductivity type diffusion layers are formed over the termination structure region in a range of from the active end portion to the outer circumferential end of the chip so that lateral diffusion (diffusion in directions parallel to the chip surface) portions of the second conductivity type diffusion layers overlap with one another. Such a region where the second conductivity type diffusion layers are collected is called "VLD region". Typically, the VLD region has a structure in which the diffusion depth of the VLD region is deepest in the vicinity of the active end portion and becomes shallow gradually toward the outer circumference of the chip.

A basic structure of the invention will be described with reference to FIG. 1.

FIG. 1 is a sectional view of important part showing a basic structure of a semiconductor device according to the invention.

An active region 31 and a termination structure region 33 are formed on an upper surface of an n-type drift layer 1 which is an n-type semiconductor substrate. For example, a so-called MOS gate structure of trench type metal (conductive polysilicon)-insulator (silicon oxide film)-semiconductor will be described as the active region 31 in this embodiment. A p-type base layer 5 higher in concentration than the n-type drift layer 1 is provided so as to be in contact with an emitter electrode 11 in an upper surface of the active region 31 through p$^+$ regions 7, 7a and 7b to reduce contact resistance. Trenches (grooves) are formed so that each trench passes through the p-type base layer 5 from a surface of the device being in contact with the emitter electrode 11 and reaches the n-type drift layer 1. Conductive gate polysilicon 4a is embedded inside the trench through a gate oxide film 3. An n$^+$ emitter layer 6b is formed on a side wall of the trench so as to be in contact with the emitter electrode. Besides the trench type MOS gate structure, a well-known planar type MOS gate structure may be used. A region where the n$^+$ emitter region 6b is not formed may be suitably provided in an MOS gate structure of a portion of the active region 31 near the termination structure region 33. A wave mark is written at the left end of an arrow indicating the active region 31 in FIG. 1. The wave mark means that a plurality of MOS gate structures, etc. for forming the active region of the device are formed in the left of the left end of the device sectional view shown in FIG. 1.

In addition to the p-type base layer 5 being in contact with the emitter electrode 11, a p-type diffusion layer 17a lower in concentration than the p-type base layer 5 and deeper in diffusion than the p-type base layer 5 is provided in an active end portion 32 without provision of any MOS gate. The p-type diffusion layer 17a is provided as an active region side (chip inner circumferential) end portion of the VLD region 17. Although there is a possibility that the p-type diffusion layer 17a will be shallower in diffusion than the p-type base layer 5, the concentration of the p-type diffusion layer 17a is lower than that of the p-type base layer 5 even in this case.

A plurality of p-type diffusion layers 17a to 17d are formed in the upper surface of the n-type drift layer 1 in a range of from the active end portion 32 to the outer circumference of the chip. The respective widths of the p-type diffusion layers 17a to 17d are formed in accordance with the widths of opening portions 35 of a separation oxide film 2. That is, the distance between the respective opening portions 35 of the p-type diffusion layers 17a to 17d is reduced gradually toward a chip outer circumferential end 46 located in the outer circumferential end portion of the chip. The p-type diffusion layers 17a to 17d adjacent to one another are provided so that lateral diffusion portions 34 (portions where p-type dopant is diffused in parallel to the chip surface from each opening portion 35) overlap with one another. When the concentration of the p-type diffusion layer 17a nearest to the active portion 31 is set to be highest in the VLD region 17, the width of the separation oxide film 2 located on the lateral diffusion portions 34 overlapping with one another is 6.0 µm. The width of each opening portion 35 of the p-type diffusion layer 17a is 40.5 µm. Successively, in a region where the p-type diffusion layer 17b is formed, the width of each opening portion 35 is, for example, 10.5 µm. Successively, in a region where the p-type diffusion layer 17c is formed, the width of each opening portion 35 is, for example, 5.5 µm. As to the p-type diffusion layer 17d in a region nearest to a VLD end portion 44, the width of each opening portion 35 is, for example, 2.0 µm.

The diffusion depths of the p-type diffusion layers 17a to 17d are reduced gradually or stepwise in a direction of from the p-type diffusion layer 17a on the chip inner circumferential side toward the p-type diffusion layer 17d on the outer circumferential side. The average concentrations of the p-type diffusion layers 17a to 17d are reduced gradually or stepwise in a direction of from the p-type diffusion layer 17a on the chip inner circumferential side toward the p-type diffusion layer 17d on the outer circumferential side. Incidentally, the term "average concentration" means a depth-direction total impurity concentration per unit area or an impurity concentration per unit area integrated in a depth direction. For example, the average concentration is expressed in atoms/cm$^2$. The gradients of the average concentration distributions of the p-type diffusion layers 17a to 17d can be adjusted based on the widths of the opening portions 35 in the separation oxide film 2 of the VLD region 17. That is, as will be described in the production method, the separation oxide film 2 serves as a shield mask when the p-type dopant is ion-implanted. For this reason, in a region where the remaining width of the separation oxide film 2 is small and the width of each opening portion 35 is large as in the p-type diffusion layer 17a, the average acceptor concentration of the region becomes sufficiently close to the dose quantity of the implanted p-type dopant. On the other hand, in a region where the remaining width of the separation oxide film 2 is large and the width of each opening portion 35 is small as in the p-type diffusion layer 17d, the average acceptor concentration of the region becomes sufficiently lower than the dose quantity of the implanted p-type dopant. For example, the dose quantity of boron is kept constant over the wafer surface. In the p-type diffusion layer 17b in FIG. 1, the ratio of the area of each opening portion 35 to the area of the separation oxide film 2 adjacent to the opening portion 35 and serving as a mask shielding region (hereinafter referred to as aperture ratio) is, for example, 4:1. The average total impurity quantity (hereinafter referred to as effective dose quantity) of the p-type diffusion layer 17b on this occasion is 80% of the dose quantity of the ion-implanted p-type dopant. When the aperture ratio in the p-type diffusion layer 17c is 1:1 likewise, the effective dose quantity of the p-type diffusion layer 17b is 50% of the ion-implantation dose quantity. When the aperture ratio in the p-type diffusion layer 17d is 1:9 likewise, the effective dose quantity of the p-type diffusion layer 17b is 10% of the ion-implantation dose quantity. In this manner, the lateral concentration distribution of the VLD region 17 can be adjusted. As the effective dose quantity becomes smaller, the VLD region 17 becomes shallower gradually toward the chip outer circumferential side because the diffusion depth of dopant in the same heat budget becomes smaller. The region formed from the p-type diffusion layers 17a to 17d is the VLD region 17. The upper surface of the VLD region 17 is covered with the separation oxide film 2 and an interlayer insulating film 8.

A clip p layer 17e distant by a length $L_{sC}$ from the VLD region 17 and higher in concentration than the n-type drift layer 1 is formed on the chip outer circumferential side of the VLD region 17. An n-type channel stopper layer 6 distant from the clip p layer 17e and higher in concentration than the n-type drift layer 1 is formed on the chip outer circumferential side of the clip p layer 17e. Incidentally, the channel stopper layer 6 may be of a p type as long as the channel stopper layer 6 is higher in concentration than the n-type drift layer 1. Specific structure parameters of the p-type diffusion layers 17a to 17d and the clip p layer 17e in the VLD region 17 and specific numerical values thereof will be described in Table 1. Incidentally, the p-type diffusion layers 17a to 17d in the VLD region 17 are repeatedly shown in FIG. 40 for describing the background art and with the same condition as that in FIG. 40.

between the p⁺ regions 7a and 7b, through a gate oxide film 3 formed on the upper surface of the p-type diffusion layer 17a.

The emitter electrode 11 is provided with a roof which has a length MFP1 and which is formed in a range of from a portion connected to the p⁺ region 7b toward the chip outer circumferential side. A clip field plate 15a is connected to an upper surface of the clip p layer 17e through the p⁺ region 7b higher in concentration than the clip p layer 17e. The clip field plate 15a is formed so that the length MFP4a of a chip inner circumferential side roof is larger than a length MFP4b of a chip outer circumferential side roof. A stopper field plate 15 is provided on an upper surface of the channel stopper layer 6 so as to be separated from the clip field plate 15a. Here, the region where the clip field plate 15a and the stopper field plate 15 are separated from each other is referred to as spacing region 40. The length of the chip inner circumferential side roof of the stopper field plate 15 is referred to as MFP2. A passivation film 13 is formed for protecting a part of the active region 31 and the upper surface of the termination structure region 33.

A well-known n-type field stop layer 9 is formed on a lower surface side of the n-type drift layer 1. A p-type collector layer 10 is further formed so as to be adjacent to a lower surface of the n-type field stop layer 9. A collector electrode 14 is connected to a lower surface of the p-type collector layer 10. It is a matter of course that the semiconductor device may be an IGBT having no n-type field stop layer 9.

TABLE 1

STRUCTURAL PARAMETER OF VLD REGION
IN EMBODIMENT 1 AND BACKGROUND ART

| REGION | 17a | 17b | 17c | 17d | 17e |
|---|---|---|---|---|---|
| DEPTH (μm) | 6 | 6 | 6 | 5.8 | 5.8 |
| WIDTH (μm) | 42.5 | 12.5 | 7.5 | 5.5 | 10.7 |
| SURFACE CONCENTRATION (cm⁻³) | 7.4E+15 | 7.4E+15 | 7.2E+15 | 5.6E+15 | 5.6E+15 |
| THE NUMBER OF STEPS | 1 | 8 | 4 | 9 | 1 |

Figure 40:
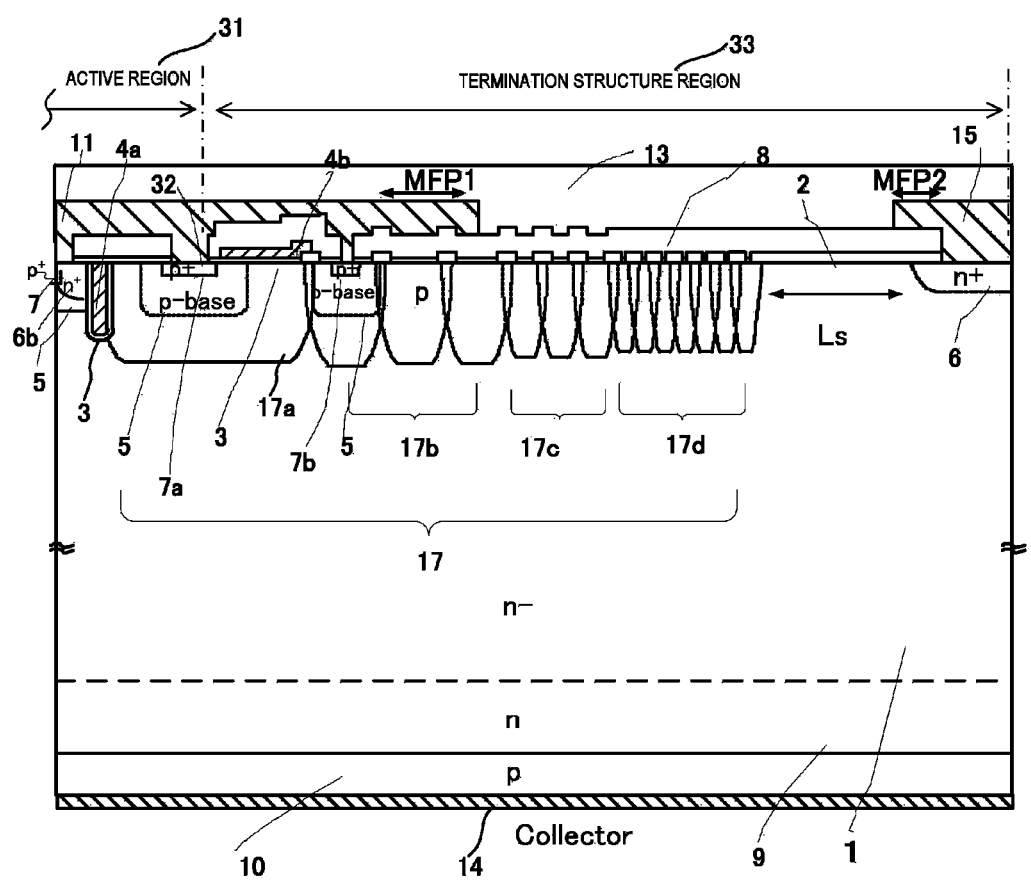
FIG. 40 is a sectional view showing important part of a semiconductor device according to the background art.

In the leftmost column of Table 1, "region" designates the reference numeral described in FIG. 1. "Depth" designates a diffusion depth of a pn junction 43 in each of the p-type diffusion layers 17a to 17d. "Width" designates a length of a region in each of the p-type diffusion layers 17a to 17d. For example, the length of the p-type diffusion layer 17b is a distance from the active region 31-side end portion of the opening portion 35 of the p-type diffusion layer 17b to the chip outer circumferential side end portion of the chip outer circumferential side opening portion 35 of the p-type diffusion layer 17b. "Surface concentration" designates a p-type acceptor concentration in the chip surface in each of the p-type diffusion layers 17a to 17d. "The number of steps" designates the number of opening portions in each of the p-type diffusion layers 17a to 17d. The background art designates a VLD structure with provision of neither clip p layer 17e nor clip n layer 6a as shown in FIG. 40.

The emitter electrode 11 is connected to the p-type base layer 5 through the contact p⁺ regions 7, 7a and 7b higher in concentration than the VLD region 17. In the VLD region 17, the p-type diffusion layers 17a and 17b are partially connected to the emitter electrode 11 through the p⁺ regions 7, 7a and 7b and the p-type base layer 5. A gate polysilicon runner 4b which will be described later is formed on an upper surface of the p-type diffusion layer 17a wedged Structural parameters except the VLD region 17 are as follows. The separation oxide film 2 is 0.5 μm thick. The interlayer insulating film 8 is 1.0 μm thick. The length Ls between the channel stopper layer 6 and the p-type diffusion layer 17d of the VLD region 17 as shown in FIG. 40 is 140 μm. A length MFP1 of the roof of the emitter electrode 11 is 23 μm. The length MFP2 in the stopper field plate 15 is 13 μm. The channel stopper layer 6 is 26 μm long. The p-type collector layer 10 has a peak concentration of 1.8E17/cm³ and is 0.8 μm thick (diffusion depth). The n-type field stop layer 9 has a peak concentration of 2.2E15/cm³ and is 28.5 μm thick. The distance ($L_{sC}$) between the clip p layer 17e and the nearest p-type diffusion layer 17d of the VLD region 17 is about 113 μm. The length MFP4a of the active region-side roof of the clip field plate 15a is 12 μm, and the length MFP4b of the chip outer circumferential side roof of the clip field plate 15a is 6 μm.

(Operations)

Operations and effects in the basic structure of the invention will be described with reference to FIGS. 2A to 2D.

FIGS. 2A to 2D are schematic views showing the basic operation of the invention based on the sectional configuration of important part shown in FIG. 1. FIG. 2A is a sectional view of important part showing only an element surface portion in FIG. 1. FIG. 2B is a graph of an electric field intensity distribution along a depth-direction cut line passing through a point M perpendicularly from a device surface in the sectional view shown in FIG. 2A. FIG. 2C is a graph of an electric field intensity distribution along a cut line parallel to the device surface in a range of from a point A to a point D in FIG. 2A. Incidentally, the electric field intensity distribution is a distribution in a state where a voltage equivalent to the avalanche breakdown voltage of the element is applied between the collector electrode 14 and the emitter electrode 11 under the condition that the MOS gate is off.

The structure of the semiconductor device according to the invention is characterized in that the clip p layer 17e is provided on the outer circumferential side of the VLD region 17 as described above. According to this structural characteristic, the depletion layer can be prevented from spreading to the chip outer circumferential side because of negative external charge 42 coming flying onto the upper surface of the termination structure region 33.

That is, according to the structure of the invention, as shown in FIG. 2C, potential is shared among three regions, that is, (1) the VLD region 17 (section A-B in FIGS. 2A and 2C), (2) the vicinity of the clip p layer 17e (section B-C and its vicinity in FIGS. 2A and 2C) and (3) a region between the clop p layer 17e and the channel stopper layer 6 (section C-D in FIGS. 2A and 2C), so that the breakdown voltage, that is, a bearable voltage can be prevented from being reduced. It may be here conceivable that the vicinity of the clip p layer 17e indicates a region up to the circumference of a circle, for example, with the deepest position of the clip p layer 17e as its center and the order of a diffusion depth of the clip p layer 17e from the center as its radius. As for the vicinity of another position, a region up to the circumference of a circle with the distance of similar order as its radius can be assumed.

Assume now the case where external charge is sufficiently low, specifically, the case of $|Qss| \leq 1E10/cm^2$ in which Qss is external charge. This is equivalent to the electric field intensity distribution indicated by the thick solid line in FIG. 2C. In this case, the termination structure region is formed so that the applied voltage is mainly shared to the VLD region 17 and the region near the clip p layer 17e. That is, electric field intensity becomes the highest at a point C in front of the clip p layer 17e and decreases in directions of from the point C to the active region side (point A) and the chip outer circumferential side (point D). A value obtained by integrating the electric field intensity distribution in lateral distance is equivalent to the applied voltage.

Then, assume the case of positive external charge 41, that is, the case of external charge of $Qss > +1E10/cm^2$. This is equivalent to the electric field intensity distribution indicated by the thin dotted line in FIG. 2C. In this case, the Si side surface layer of the $SiO_2$/Si interface is negatively charged, so that the depletion layer (equipotential surface) shifts to the inner circumferential side of the chip. On the other hand, the VLD region 17 is effective in relaxing electric field intensity to spread the depletion layer to the chip outer circumferential side. For this reason, the depletion layer is spread to the clip p layer 17e. On this occasion, a complementary high electric field intensity region is formed in the vicinity of the clip p layer 17e (in the vicinity of section B-C in FIG. 2A) by the operation of the clip p layer 17e. The high electric field intensity region permits the bearable voltage to be kept without reduction.

Assume next the case of negative external charge 42, that is, the case of external charge of $Qss < -1E10/cm^2$. This is equivalent to the electric field intensity distribution indicated by the thick broken line in FIG. 2C. In this case, the Si side surface layer of the $SiO_2$/Si interface is positively charged, so that the depletion layer (equipotential surface) shifts to the outer circumferential side of the chip. For this reason, electric field intensity in the section A-B indicating the VLD region 17 is further reduced, so that the VLD region 17 alone cannot bear a large voltage. On this occasion, because the clip p layer 17e of the invention is provided as described above, a complementary high electric field intensity region is formed in the vicinity of the clip p layer 17e. Moreover, because spreading of the depletion layer is stopped at an active region side point D in front of the channel stopper layer 6, a high electric field intensity region is also formed in the section C-D. As described above, the applied voltage can be shared to the high electric field intensity regions of the sections B-C and C-D, so that the breakdown voltage can be kept for negative external charge.

FIG. 2B schematically shows the electric field intensity distribution of the active portion. The electric field intensity distribution shown in FIG. 2B is a distribution along a cut line for cutting the element in a depth direction so as to pass through a point M at the left end of the element sectional view of FIG. 2A. Let $E_{max}$ be maximum electric field intensity in the active region 31 when a certain voltage ($V_0$) is applied to thereby generate avalanche breakdown. Let $E_{tm}$ be electric field intensity maximized in the termination structure region 33 regardless of the positive or negative polarity of external charge when the voltage ($V_0$) is applied. On this occasion, $E_{max} \geq E_{tm}$ is preferred. When a voltage substantially equal to the breakdown voltage is applied to the element, a current due to avalanche breakdown is generated. It is preferable that this avalanche current is not concentrated into a point but flows in the whole active region 31. This is because when avalanche breakdown is generated at a point of the termination structure region 33 prior to the active region 31, the avalanche current is concentrated into the point so that the element may be broken to make it impossible to keep the voltage in accordance with circumstances. Such breakdown of the element can be avoided when avalanche breakdown occurs in a wide range of the active region 31 at a lower voltage than that of the termination structure region 33. In other words, it is preferable that $E_{max} \geq E_{tm}$ holds when the same voltage ($V_0$) is applied. For example, the invention is designed so that avalanche breakdown occurs in the p-type base layer 5 broadly and uniformly formed in the active region 31. In this manner, the avalanche current can flow in the whole active region 31 stably. As a result, concentration of the current into the termination structure region 33 can be avoided.

Figure 41:
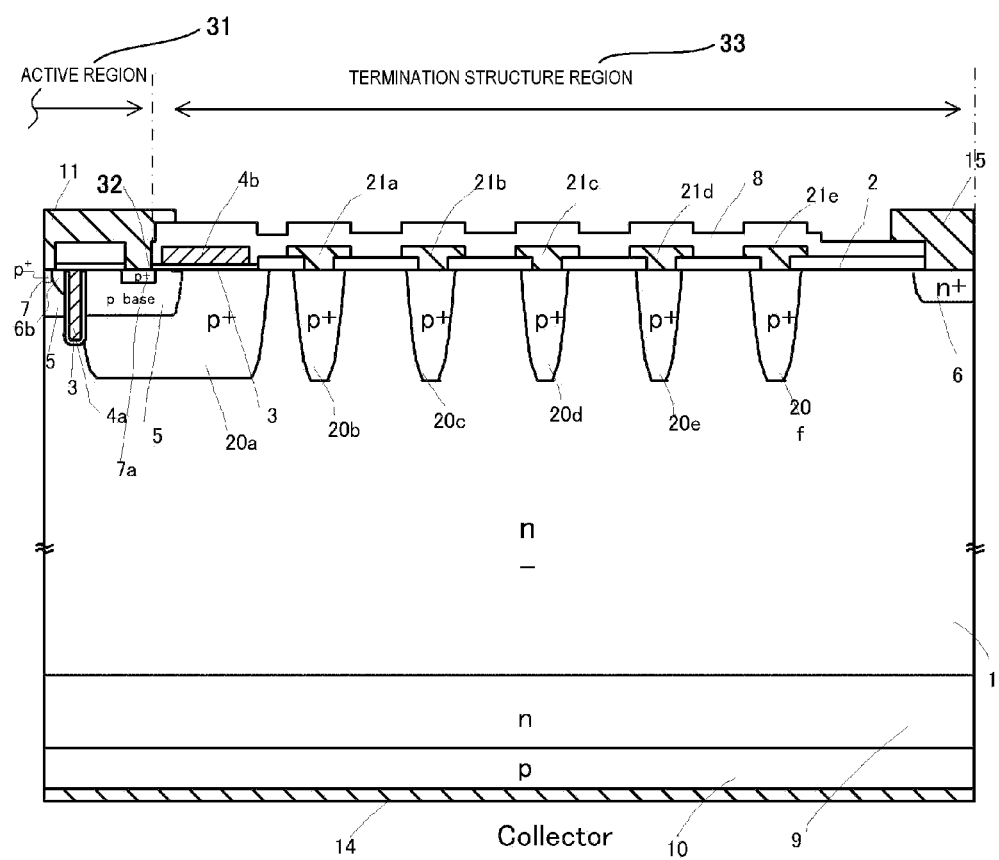
FIG. 41 is a sectional view showing important part of a semiconductor device according to the background art.

As shown in FIG. 41, in the guard ring structure, the length (hereinafter referred to as edge length) occupied by the termination structure region 33 in the chip was generally large. It was further necessary to increase the number of guard rings to give likelihood to external charge, so that this promoted increase in edge length. In this invention, the clip p layer 17e similar to the guard ring structure is intentionally inserted in the outer circumferential side of the VLD region 17. With this configuration, potential can be rather shared to the three regions, that is, (1) the VLD region 17, (2) the region near the clip p layer 17e and (3) the region between the clip p layer 17e and the channel stopper layer 6. As a result, charge resistance which has not been obtained in the background art can be obtained in spite of a distance far shorter than that in the guard ring structure.

A preferred embodiment of the invention will be described.

FIG. 2D shows a depletion layer region near the clip p layer 17e. FIG. 2D is a schematic view showing a depletion layer end 50 added to an enlarged view of the vicinity of the point C in FIG. 2A. Assume the case where a voltage equivalent to the avalanche breakdown voltage of the element is applied between the collector electrode 14 and the emitter electrode 11 under the condition that the MOS gate is off. When the voltage is applied, a depletion layer 53 spreads into the clip p layer 17e as shown in FIG. 2D. On this occasion, it is preferable that the depth m (depletion layer width) of the depletion layer 53 inside the clip p layer 17e is larger than the depth n of a non-depleted charge neutral region 54 inside the clip p layer 17e. The term "depth" means a distance in a direction perpendicular to the chip surface.

Assume that the concentration of the clip p layer 17e is a concentration so high that there is no depletion at all. Then, when the depletion layer (equipotential surface) shifts to the outer circumferential side of the VLD region 17 because of external charge, spreading of the depletion layer is stopped by the clip p layer 17e. For this reason, a local high electric field intensity point which is very narrow and sharp compared with increase of electric field intensity as shown in FIG. 2C is generated in the vicinity of the clip p layer 17e, so that an avalanche current is generated to reduce the breakdown voltage. Generation of such a pinpoint local high electric field intensity point in the vicinity of the clip p layer 17e can be avoided when both equipotential surface density and spatial gradient in the inside of the clip p layer 17e are reduced. It is therefore preferable that the depletion layer 53 is spread into the clip p layer 17e as sufficiently as possible. In the inside of the clip p layer 17e, the depletion layer 53 is located under the depletion layer end 50. In the vicinity of the point D, the depletion layer 53 is located in the left (active region 31 side) of the depletion layer end 50. Accordingly, it is preferable that the depth m (depletion layer width) of the depletion layer 53 spreading into the clip p layer 17e is larger than the depth n of the non-depleted charge neutral region 54 of the clip p layer 17e as shown in FIG. 2D.

The reason will be described below more in detail. When the clip p layer 17e is depleted, the depletion layer 53 spreads in a wide range inside the clip p layer 17e except the high concentration portion of the surface as shown in FIG. 2D. As will be described later, the voltage endured by the depletion layer 53 of the clip p layer 17e when a voltage equivalent to the avalanche breakdown voltage is applied depends on the value of a rating voltage but is, for example, about 40-50 V. This potential difference is endured by the depletion layer 53 of the clip p layer 17e. On the other hand, the critical integrated concentration causing avalanche breakdown takes a constant value of about $1.2E12$ atoms/$cm^2$ in the case of silicon regardless of the impurity concentration. Accordingly, when the diffusion depth is not larger than 10 μm on the assumption that the diffusion profile conforms to a Gaussian function, the concentration of the clip p layer 17e at the depletion layer end 50 is the order of about $1.0E16$ atoms/$cm^3$. Here, the diffusion depth of the clip p layer 17e is, for example, 5 μm. The depletion layer width m in the depth direction of the clip p layer 17e is set to be 2.5 μm which is equal to the width n of the charge neutral region 54 of the clip p layer 17e. In this case, the electric field intensity distribution in the inside of the clip p layer 17e can be approximated to a triangle, the maximum value of electric field intensity (maximum electric field intensity) is about $50(V)\times2/2.5(\mu m)=4.0E5$ V/cm when the two-dimensional curvature of the depletion layer is not considered. In practice, because the equipotential surface in the clip p layer 17e and its vicinity is curved two-dimensionally in a direction parallel to the chip surface and in a depth direction, the absolute value of electric field intensity increases more. The critical electric field intensity causing avalanche breakdown depends on the impurity concentration of the depletion layer but is about $3.0E5$ to $4.0E5$ V/cm. Accordingly, when the diffusion depth of the clip p layer 17e is 5.0 μm, maximum electric field intensity can be made smaller than the critical electric field intensity as long as the depletion layer width m of the clip p layer 17e is larger than the depth n of the charge neutral region of the clip p layer 17e. Moreover, because the integration concentration takes a constant value regardless of the impurity concentration, the concentration of the clip p layer 17e at the depletion layer end 50 is the order of $1.0E16$ atoms/$cm^3$ substantially regardless of the impurity concentration. That is, even in various rating voltages, the concentration of the clip p layer 17e at the depletion layer end 50 is the same order. Accordingly, when the depletion layer width m in the depth direction of the clip p layer 17e is larger than the width n of the charge neutral region of the clip p layer 17e, generation of the local high electric field intensity point can be suppressed because electric field intensity in the clip p layer 17e can be absorbed sufficiently.

For example, as shown in FIG. 1, the shape of the pn junction 43 of the VLD region 17 is a wavy shape on which the respective diffusion shapes of the p-type diffusion layers 17a to 17d are reflected. In this manner, electric field intensity is distributed to the VLD region 17 so that a high electric field intensity region is formed in the bottom of each of the p-type diffusion layers 17a to 17d. The VLD region 17 can endure the applied voltage higher by the high electric field intensity region.

Figure 42:
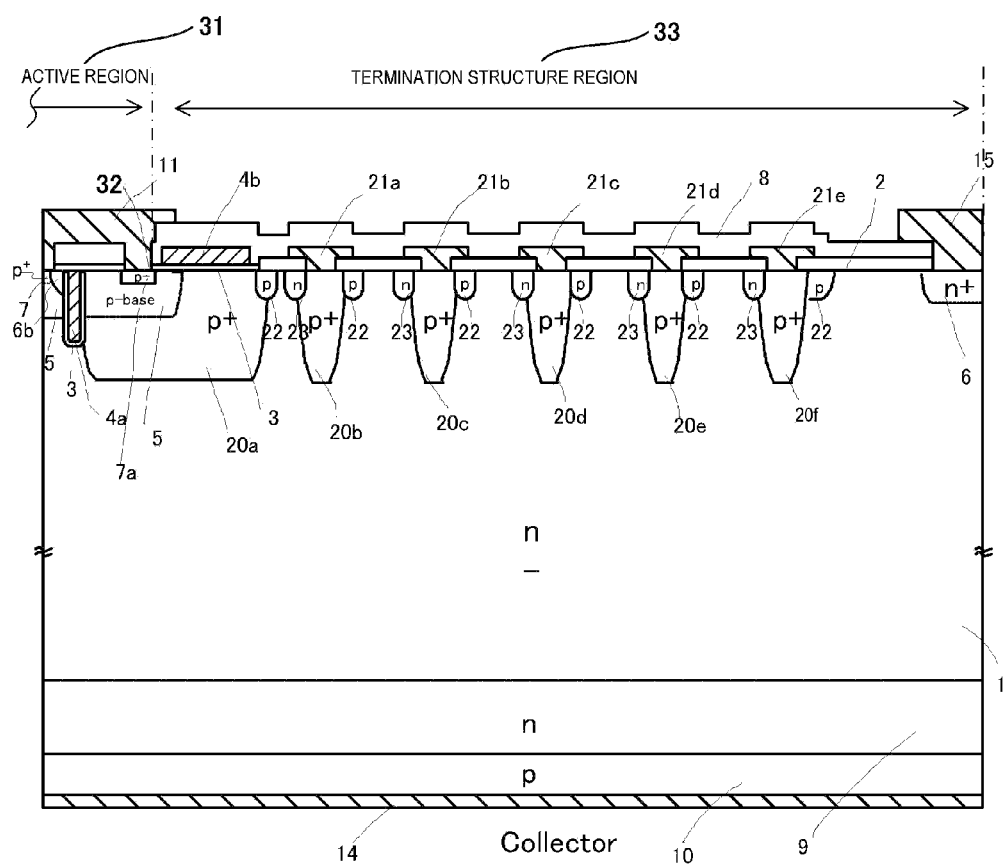
FIG. 42 is a sectional view showing important part of a semiconductor device according to the background art.
Figure 43:
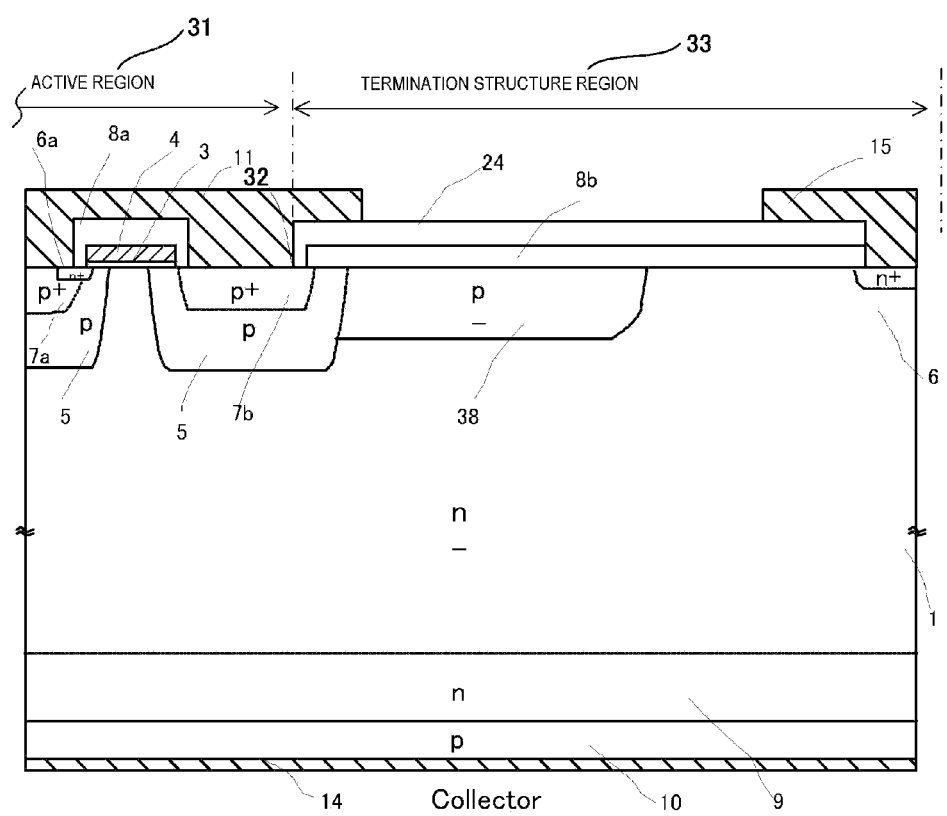
FIG. 43 is a sectional view showing important part of a semiconductor device according to the background art.

The p-type channel stopper layers 22 shown in FIG. 42 are not used in the invention. When positive external charge comes flying onto the surface of the termination structure region, an electron storage layer is induced in the $SiO_2$/Si interfaces of the n-type semiconductor substrate surrounded by the $p^+$ guard rings 20a to 20f. This electron storage layer is cut off by the p-type channel stopper layers 22 in FIG. 42. On the other hand, in this invention, the VLD region 17 is provided broadly. Even when positive external charge comes flying, the electron storage layer is hardly formed in the VLD region 17. Accordingly, the p-type channel stopper layers 22 are not used in the invention.

Embodiment 1

Embodiment 1 of the invention will be described with reference to FIG. 3.

FIG. 3 is a sectional view showing important part f a semiconductor device according to Embodiment 1 of the invention. The point of difference from the structure as a basic configuration shown in FIG. 1 lies in that a clip n layer 6a higher in concentration than the n-type drift layer 1 is formed in front of the active region side of the clip p layer 17e.

As described above, when negative external charge reaches the upper surface of the termination structure region, the Si side surface layer in the $SiO_2$/Si interfaces is positively charged. Holes are induced in the interface portion (Si surface between B and C in FIG. 2A) of the n-type drift layer 1 particularly low in concentration, so that a channel layer of holes is formed. A leakage current path is generated between the emitter electrode 11 and the collector electrode 14 through the channel layer of holes, so that this causes a leakage current. On the contrary, the channel layer of holes can be cut off by the clip n layer 6a.

Structural parameters specific to Embodiment 1 are as follows. In FIG. 3, the width of the clip n layer 6a is about 2.3 μm, and the diffusion depth of the clip n layer 6a is about 3.0 μm. The surface concentration of the clip n layer 6a is 9.8E20/cm$^3$.

A preferred mode of Embodiment 1 will be described below with reference to FIG. 3.

It is preferable that the clip p layer 17e is deeper than the clip n layer 6a.

When the depletion layer spreads into the termination structure region 33 in a direction of from the chip inner circumferential side to the chip outer circumferential side, the depletion layer is not stopped by the clip n layer 6a so that the depletion layer can reach the clip p layer 17e.

It is preferable that the clip n layer 6a is adjacent to the clip p layer 17e.

In this case, because the depletion layer little collides with the clip n layer 6a but reaches the clip p layer 17e, electric field intensity in the vicinity of the clip n layer 6a can be relaxed.

It is preferable that a clip field plate 15a is formed on the surface of the clip p layer 17e.

In this case, surface potential of the clip p layer 17e is fixed over the whole of the region of the clip field plate 15a. Accordingly, equipotential surface change due to external charge coming flying can be reduced more sufficiently.

It is preferable that the length MFP4a of the roof extending in the clip field plate 15a toward the chip inner circumferential side is larger than the length MFPb of the roof extending in the clip field plate 15a toward the chip outer circumferential side.

Spreading of the depletion layer inside the clip p layer 17e on the chip inner circumferential side is larger than that on the chip outer circumferential side. For this reason, electric field intensity in the vicinity of the chip inner circumferential side of the clip p layer 17e increases. Accordingly, when MFP4a is made longer than MFP4b, electric field intensity in the vicinity of the chip inner circumferential side of the clip p layer 17e can be relaxed.

It is preferable that the clip n layer 6a is covered with the clip field plate 15a through the separation oxide film 2 or the interlayer insulating film 8.

The clip n layer 6a is of an n type and higher in concentration than the n-type drift layer 1. For this reason, when the depletion layer reaches the clip n layer 6a, electric field intensity increases extremely largely. When the clip n layer 6a is formed on the outer circumferential side of the inner circumferential side end portion of the clip field plate 15a, the clip n layer 6a is covered with the clip field plate 15a through the separation oxide film 2 or the interlayer insulating film 8. For this reason, the depletion layer does not reach the clip n layer 6a, so that increase in electric field intensity can be prevented.

It is preferable that the VLD end portion 44 on the outer circumferential side of the VLD region 17 is located on the outer circumferential side of an emitter end portion 45 on the chip outer circumferential side of the emitter electrode 11.

Relaxation of electric field intensity in the VLD region 17 can be obtained when the potential (equipotential surface) distribution is generally made uniform without provision of the field plate on the upper surface of the VLD region 17. Accordingly, it is preferable that the emitter end portion 45 of the emitter electrode 11 is provided on the chip inner circumferential side of the VLD end portion 44 so that a portion of the upper surface of the VLD region 17 not covered with the field plate is made broad.

It is preferable that the channel stopper layer 6 is provided with a stopper field plate 15, and that there is provided a spacing region 40 by which the clip field plate 15a is separated from the stopper field plate 15.

When the clip field plate 15a and the stopper field plate 15 are separated from each other on the upper surface of the spacing region 40, the equipotential surface is distributed to the spacing region 40. As a result, even when the depletion layer shifts to the chip outer circumferential side as described above, the voltage can be endured by the spacing region 40.

Incidentally, a gate polysilicon runner 4b is described in the chip outer circumferential side of the active end portion 32 in FIGS. 1 and 3. The term "gate polysilicon runner 4b" means the following configuration. For example, gate polysilicon 4a formed in each unit cell (which is a unit structure of a cycle period structure composed of a gate, a p-type base layer and an n$^+$ emitter layer) of an IGBT is collected as one layer at an end portion of a region where the unit cells are gathered. This is the gate polysilicon runner 4b. The gate polysilicon runner 4b is connected to a gate pad region which is not shown but provided for connection to a gate terminal on the chip surface. The gate polysilicon runner 4b is a well-known technique. In the description of embodiments of the invention, the gate polysilicon runner 4b is included in the termination structure region 33, so that the VLD region 17 is formed so as to be located from the lower portion of the gate polysilicon runner 4b toward the chip outer circumferential end.

Here, a p-type base layer 5 higher in concentration than the VLD region 17 may be formed between the gate polysilicon runner 4b and the VLD region 17. That is, the innermost circumference of the VLD region 17 is a place where the p-type dopant concentration is the highest in the VLD region 17. Accordingly, even when the p-type base layer 5 is formed, the influence on the equipotential surface distribution of the termination structure region 33 is little. Because the concentration is high, the influence of external charge on the potential distribution in the vicinity of the gate polysilicon runner 4b is rather reduced.

A method of producing the semiconductor device according to Embodiment 1 of the invention will be described next. Although reference numerals and signs indicating parts not shown in respective drawings showing steps will appear in the following description, the parts are the same as shown in FIG. 3.

FIGS. 4A-4B, 5A-5E, 6A-6D, 7A-7D, 8, 9A-9D, 10A-10E, 11A-11B, 12A-12B, 13A-13D, 14A-14C, 15A-15C and 16 are sectional views of important part in respective steps showing the method of producing the semiconductor device according to Embodiment 1 of the invention.

(FIG. 4A) A separation oxide film 2 about 1.2 μm thick is formed as a thermal oxide film or a deposit film on an upper surface of an n-type drift layer 1. (FIG. 4B) A photo resist is applied on the separation oxide film 2 and photolithography is executed.

(FIG. 5A) Successively, the photo resist 19 is used as it is, so that the separation oxide film 2 is removed by wet isotropic etching or dry anisotropic etching until the n-type drift layer 1 is revealed. (FIG. 5B) Then, the photo resist 19 is removed and the wafer is washed. (FIG. 5C) Successively, thermal oxidation is performed so that a screen oxide film 27 about 50 nm thick is formed in the surface. (FIG. 5D) Successively, a photo resist 19 is applied on the whole surface of the wafer again, and photolithography is executed. (FIG. 5E) Then, boron ions are implanted with acceleration energy of 45 keV and a dose quantity of $3E12/cm^2$. Then, the photo resist 19 is removed and the wafer is washed.

(FIG. 6A) Successively, after drive-in is performed in a nitrogen atmosphere at 1100° C. for 5 hours, a thermal oxide film region 2a about 600 nm thick is formed in the surface of the n-type drift layer 1 by pyrogenic oxidation at 1150° C. Boron is diffused by the thermal budgets, so that p-type diffusion layers 17a to 17d and a clip p layer 17e in the VLD region 17 are formed. In the case of the aforementioned dose quantity ($3E12/cm^2$), the surface concentration of the clip p layer 17e is about $1E16/cm^3$ and the junction depth of the clip p layer 17e is about 5-6 μm in this stage. As a result, the depth of the depletion layer spreading into the clip p layer 17e when, for example, a voltage substantially equal to the breakdown voltage is applied to the element shown in FIG. 1 is as follows. When the surface concentration and junction depth of the clip p layer 17e are as described above, the depth m of the depletion layer spreading inside the clip p layer 17e as shown in FIG. 2D is about 4 μm. That is, the depth n of the charge neutral region (i.e. non-depleted region) remaining in the clip p layer 17e from the element surface is about 1-2 μm. Accordingly, the width m of the depletion layer spreading inside the clip p layer 17e is larger than the depth n of the charge neutral region.

(FIG. 6B) Then, a photo resist 19 is applied on the whole surface of the wafer and photolithography is performed so that the resist for selectively etching a thermal oxide film region 2a as a trench etching mask is patterned to form a resist opening portion 47a. (FIG. 6C) Successively, oxide film anisotropic etching is performed to remove the oxide film from the resist opening portion 47a. (FIG. 6D) Then, the photo resist 19 is removed.

(FIG. 7A) Silicon anisotropic etching is performed with the separation oxide film 2 and the thermal oxide film region 2a as a mask to thereby form a trench 52. Although the depth of the trench depends on device design, the depth in this embodiment is 5 μm. Isotropic chemical dry etching (CDE) may be further performed. (FIG. 7B) After the wafer is washed, sacrificial oxidation for removing trench etching damage is performed to form a sacrificial oxide film 2b. (FIG. 7C) Successively, the sacrificial oxide film 2b is removed by oxide film etching and the wafer is washed. (FIG. 7D) Successively, a gate oxide film 3 is formed by thermal oxidation or deposition or by combination of thermal oxidation and deposition. Although the thickness of the gate oxide film 3 depends on device design, the thickness of the gate oxide film 3 in this embodiment is 100 nm.

(FIG. 8) Doped polysilicon is deposited on the wafer surface so that the trench is fully filled with the doped polysilicon. Then, photolithography is performed and the polysilicon is etched by anisotropic or isotropic dry etching to form gate polysilicon 4a of a trench gate and a gate polysilicon runner 4b. Then, the photo resist 19 is removed and the wafer is washed.

(FIG. 9A) Then, a photo resist 19 is applied on the whole surface of the wafer and photolithography is performed to form resist opening portions 47b. (FIG. 9B) Then, boron ion implantation is performed with the photo resist 19 as a mask. Although the condition for ion implantation depends on device design, for example, the condition of 100 keV and $2.5E13/cm^2$ is used. (FIG. 9C) Then, the photo resist 19 is removed and the wafer is washed. (FIG. 9D) Here, the oxide film thickness of the wafer surface is reduced by wet etching to make it easy to form a clip n layer 6a, an $n^+$ emitter layer 6b and contact $p^+$ regions 7 and 7a to 7d in the following steps.

(FIG. 10A) Successively, diffusion of boron ions implanted in FIG. 9B is performed in an inert atmosphere to form a p-type base layer 5. Although the thermal budget necessary for diffusion of the p-type base layer 5 depends on device design, for example, 1100° C., 220 minutes and a nitrogen atmosphere are used. (FIG. 10B) Successively, a photo resist is applied on the whole surface of the wafer and photolithography is performed so that the resist is patterned to form a resist opening portion 47c. (FIG. 10C) Then, arsenic ion implantation is performed. Although the condition for arsenic ion implantation depends on device design, for example, the condition for arsenic ion implantation is set at 20 keV and $4\text{-}5E15/cm^2$. (FIG. 10D) Then, the photo resist 19 is removed and the wafer is washed. (FIG. 10E) Then, arsenic ions implanted in FIG. 10C are activated by heat treatment to thereby form an $n^+$ emitter layer 6b, a channel stopper layer 6 and a clip n layer 6a. As an example of a thermal budget for the heat treatment, a nitrogen atmosphere, 1100° C. and 30 minutes are used.

(FIG. 11A) Photolithography is performed so that a photo resist 19 is patterned to form resist opening portions 47. (FIG. 11B) Successively, boron ion implantation is performed. Although the condition for boron ion implantation depends on device design, for example, the condition for boron ion implantation is set at 150 keV and $2\text{-}3E15/cm^2$.

Figure 11A:
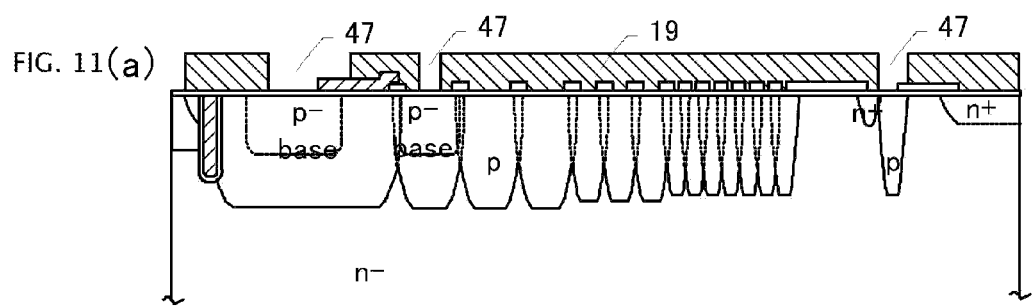
FIGS. 11A and 11B are sectional views of important part showing a process of producing the semiconductor device according to the embodiment of the invention.
Figure 11B:
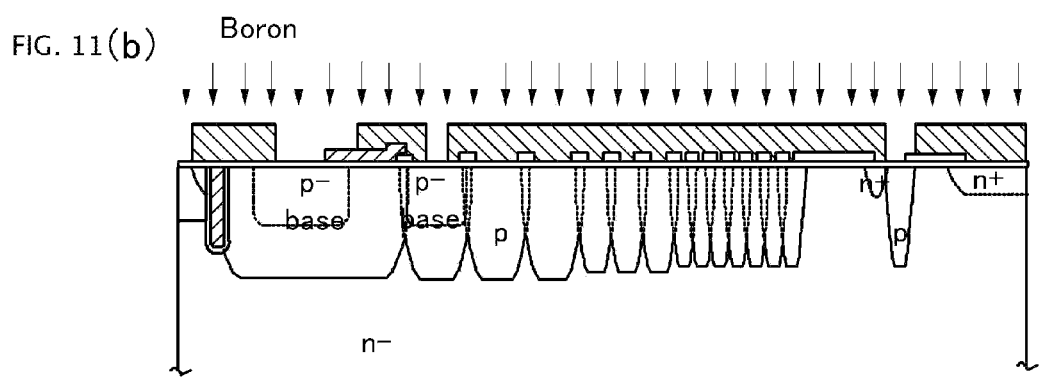
Figure 12A:
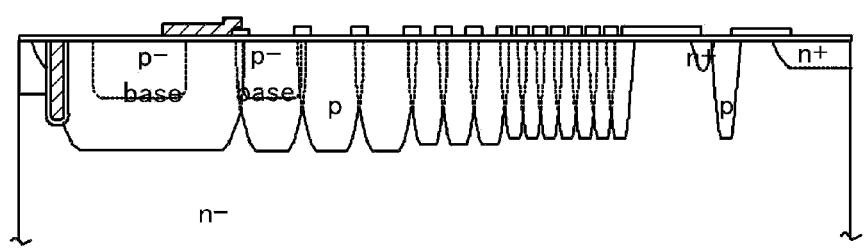
FIGS. 12A and 12B are sectional views of important part showing a process of producing the semiconductor device according to the embodiment of the invention.
Figure 12B:
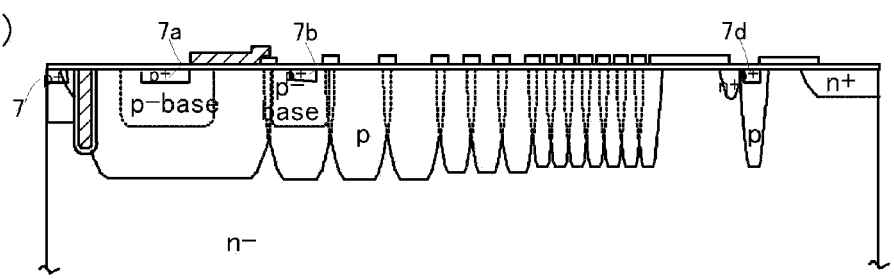
Figure 15A:
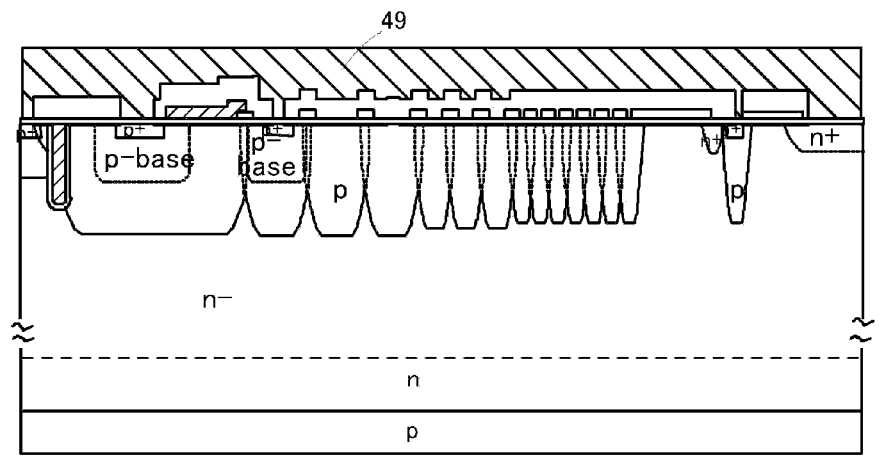
FIGS. 15A to 15C are sectional views of important part showing a process of producing the semiconductor device according to the embodiment of the invention.
Figure 15B:
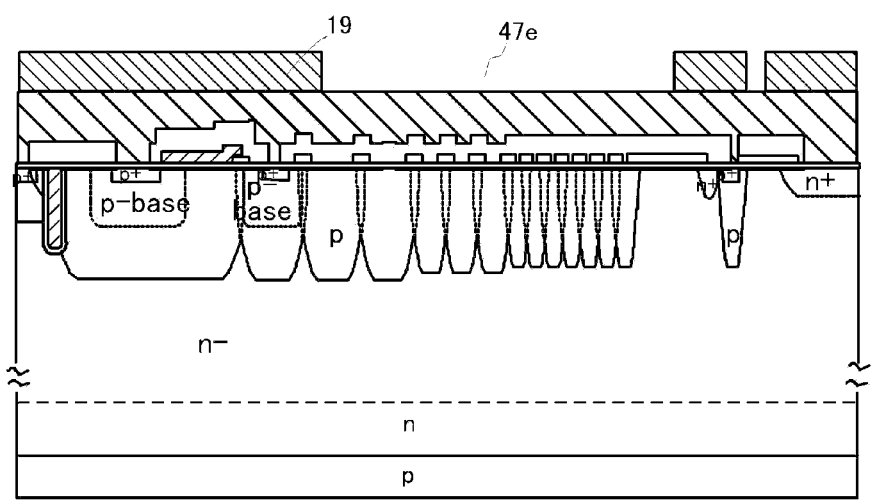
Figure 15C:
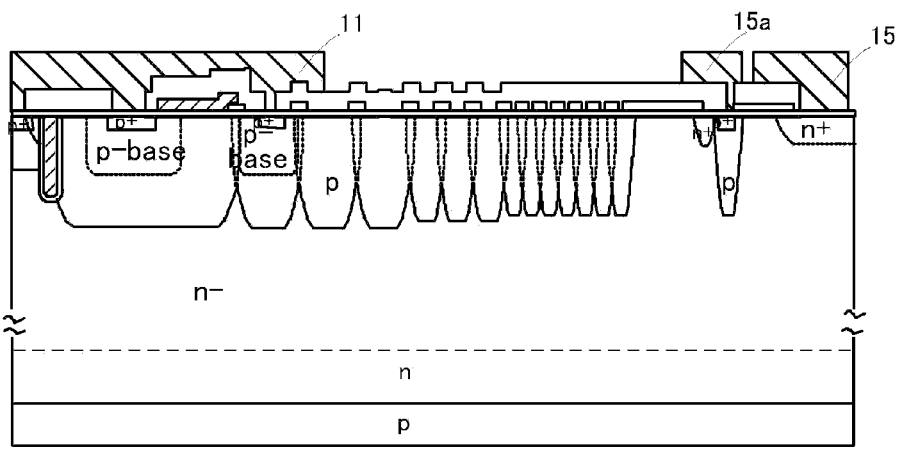
Figure 16:
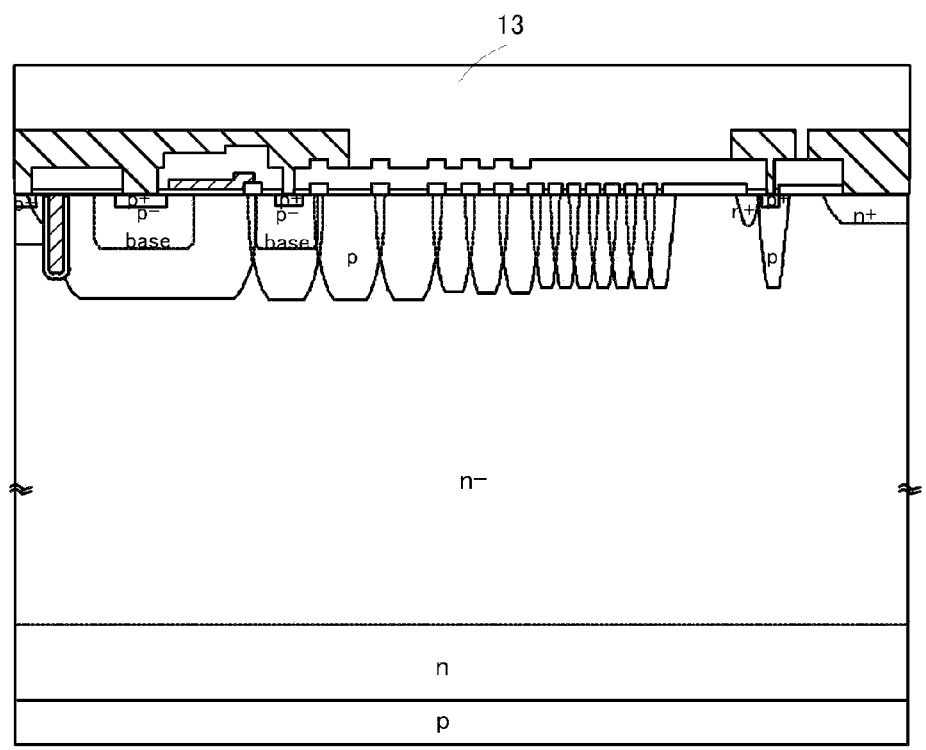
FIG. 16 is a sectional view of important part showing a process of producing the semiconductor device according to the embodiment of the invention.
Figure 17A:
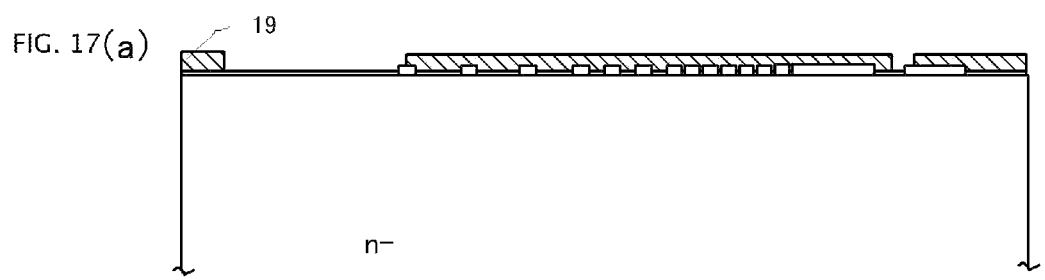
FIGS. 17A to 17C are sectional views of important part showing a process of producing the semiconductor device according to the embodiment of the invention.
Figure 17B:
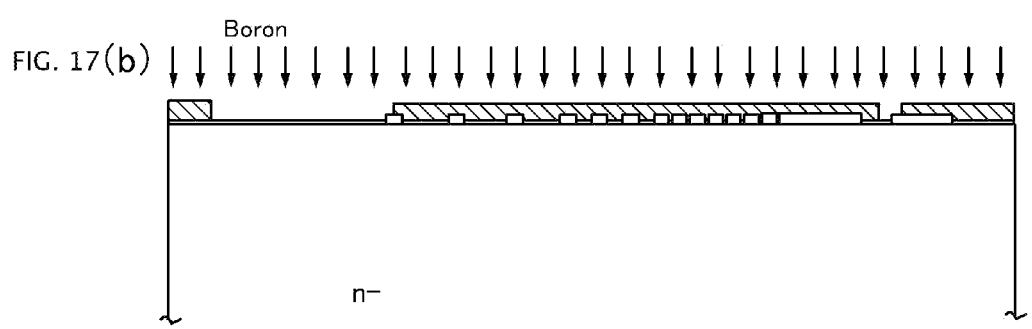
Figure 17C:
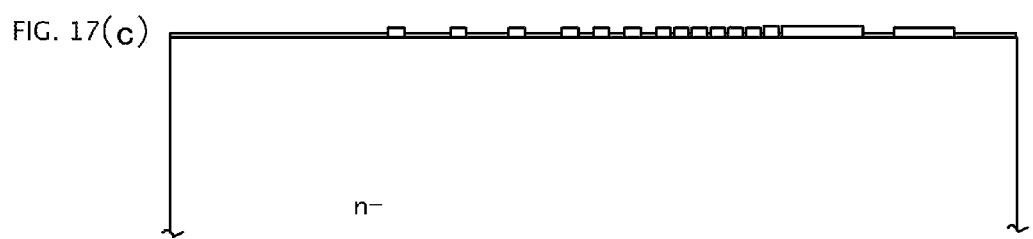
Figure 18A:
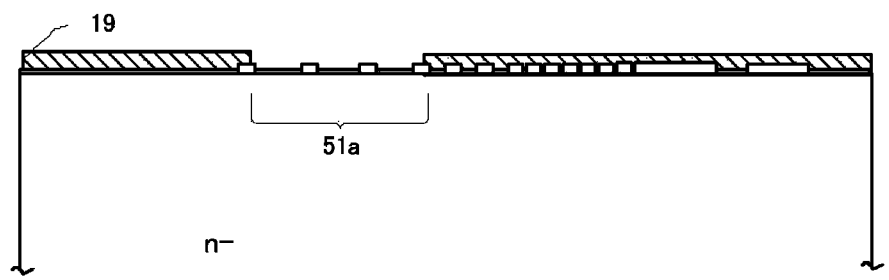
FIGS. 18A to 18C are sectional views of important part showing a process of producing the semiconductor device according to the embodiment of the invention.
Figure 18B:
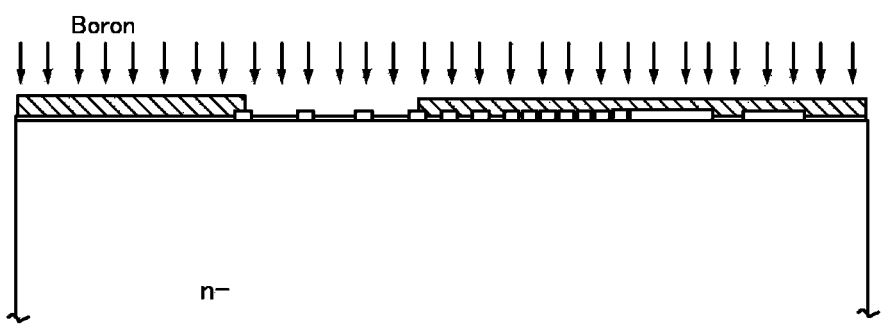
Figure 18C:
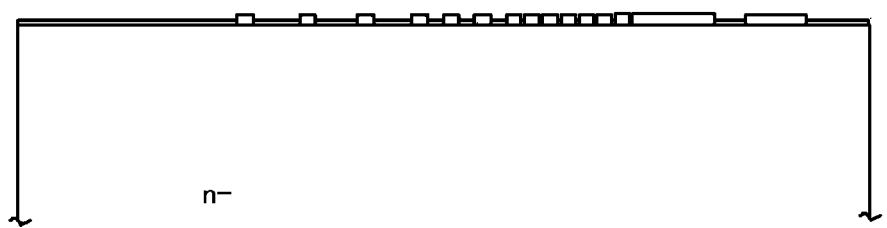
Figure 19:
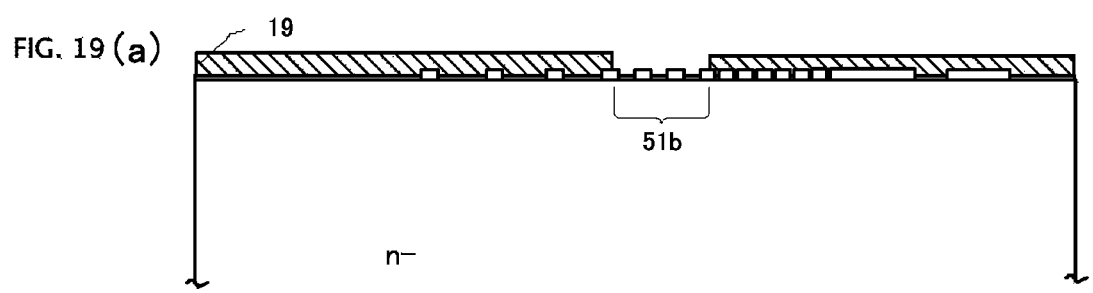
FIGS. 19A to 19C are sectional views of important part showing a process of producing the semiconductor device according to the embodiment of the invention.
Figure 19:
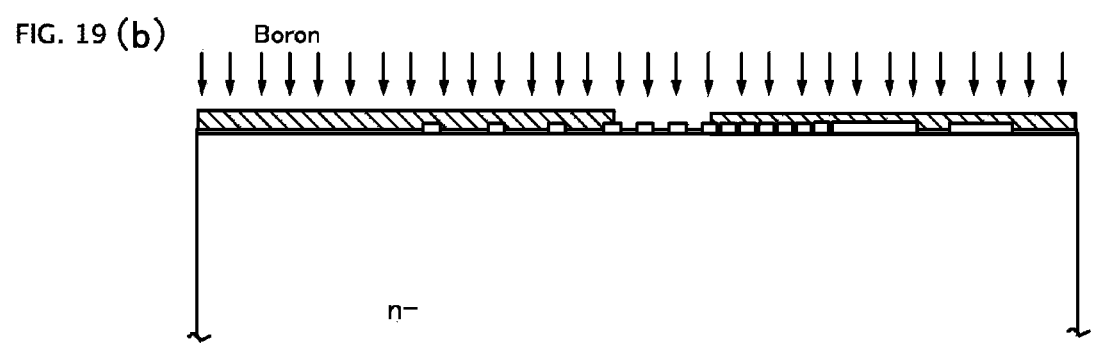
Figure 19:
Figure 20:
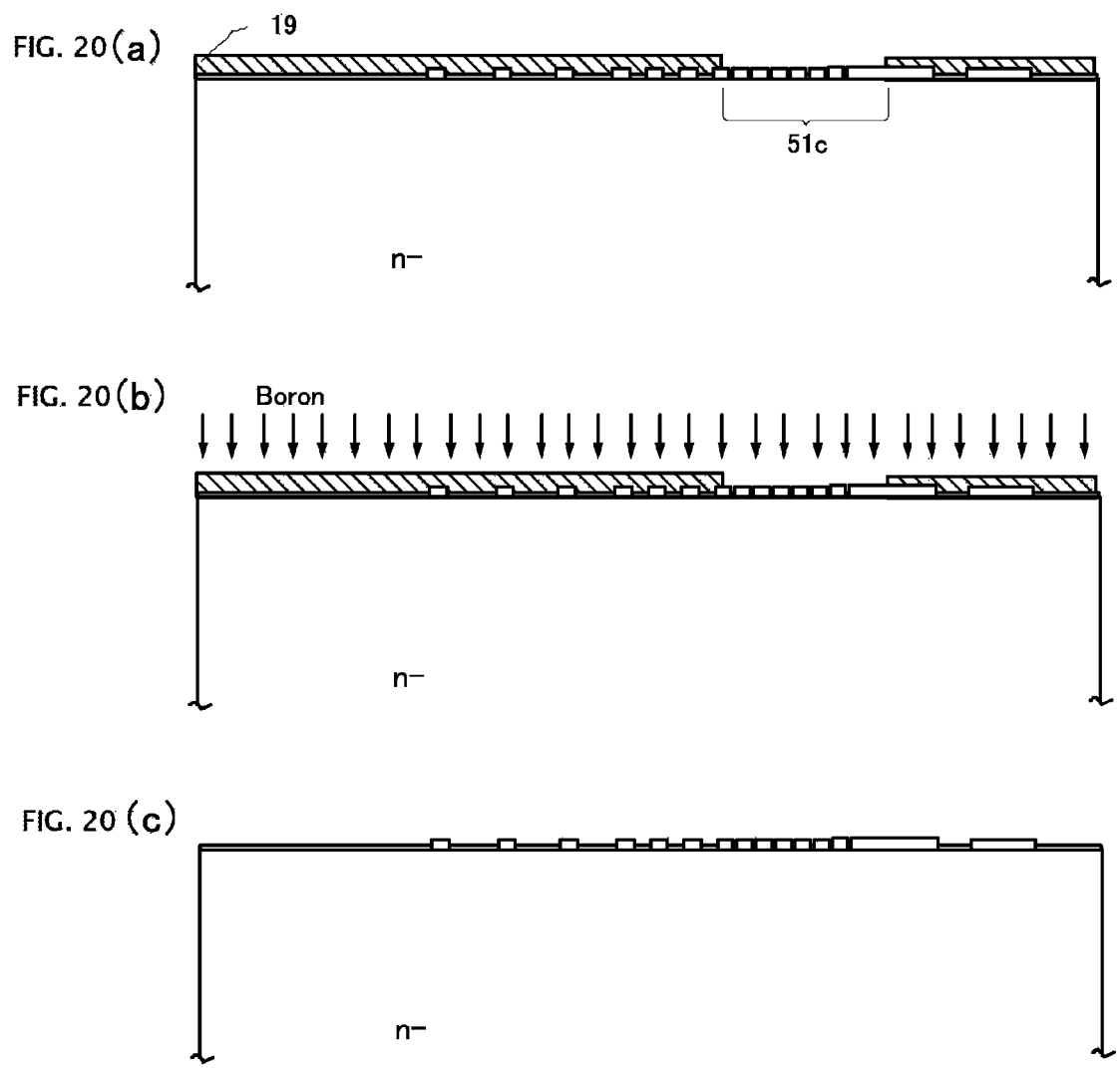
FIGS. 20A to 20C are sectional views of important part showing a process of producing the semiconductor device according to the embodiment of the invention.
Figure 21:
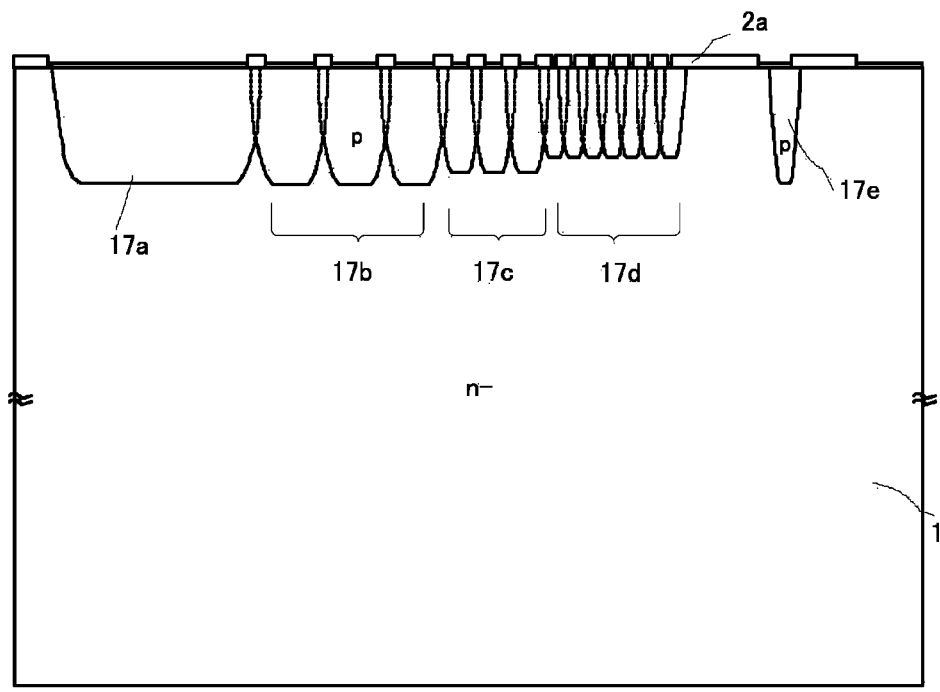
FIG. 21 is a sectional view of important part showing a process of producing the semiconductor device according to the embodiment of the invention.

(FIG. 12A) Successively, the photo resist is removed and the wafer is washed. (FIG. 12B) Then, boron implanted in FIG. 11B is activated, for example, by heat treatment at 970° C. for 30 minutes to thereby form $p^+$ regions 7, 7a, 7b and 7d.

(FIG. 13A) An interlayer insulating film 8 is deposited on the upper surface of the wafer. For example, the interlayer insulating film 8 is provided as a composite film formed from a chemical vapor deposition (CVD) high temperature oxide (HTO) film and a boron phosphorus silicate glass (BPSG) film. As an example of the thickness of the interlayer insulating film 8, for example, the HTO is 200 nm thick and the BPSG is 1000 nm thick. Successively, the composite film is annealed at 970° C. for 20 minutes in a nitrogen atmosphere. (FIG. 13B) Photolithography is performed so that a photo resist 19 is patterned to form resist opening portions 47d. (FIG. 13C) Successively, the interlayer insulating film 8 in the resist opening portions 47d is etched by anisotropic etching to thereby open contact portions between an electrode which will be formed later and silicon as a base material. (FIG. 13D) Then, the photo resist 19 is removed and the wafer is washed.

(FIG. 14A) A back-grinding tape 18 is stuck to the front surface of the wafer and chemical mechanical polishing (CMP) 48 is applied to the rear surface of the wafer to make the wafer thin. (FIG. 14B) Successively, n-type dopant ions (phosphorus, selenium, hydrogen, etc.) for forming an n-type field stop layer 9 are implanted in the rear surface of the wafer. The dose and acceleration energy of ion implantation are selected suitably. Successively, boron ion implantation is performed for forming a p-type collector layer 10. The dose and acceleration energy of boron ion implantation are selected suitably. (FIG. 14C) Then, the back-grinding tape 18 is removed and the n-type field stop layer 9 and the p-type collector layer 10 are activated by thermal driving or laser annealing. In the case of thermal driving, 950° C., 30 minutes and a nitrogen atmosphere are used as an example of a thermal budget.

Successively, though not shown, the wafer is washed and a natural oxide film on the contact bottom surface is removed by wet etching. (FIG. 15A) Then, a barrier metal (such as Ti/TiN 200 nm/500 nm) is sputtered and then an Al—Si electrode material is sputtered onto the front surface of the wafer to thereby form a metal film 49 for emitter electrode 11. Incidentally, the barrier metal may be dispensed with. Though not shown, after formation of the barrier metal, in accordance with necessity, a tungsten film may be deposited by a CVD method and a tungsten plug may be formed in a contact hole by etching-back or CMP before the Al—Si electrode material is sputtered to form an electrode layer on the front surface of the wafer. (FIG. 15B) Successively, photolithography is performed so that a photo resist 19 is patterned to form resist opening portions 47e. (FIG. 15C) Successively, etching is performed so that the metal film 49 in the resist opening portions 47e is removed to form an emitter electrode 11, a clip field plate 15a and a stopper field plate 15. Then, the photo resist 19 is removed.

(FIG. 16) A silicon nitride film having a composition close to $Si_3N_4$ is formed on the front surface of the wafer so that the film is provided as a passivation film 13 about 300 nm thick. Or a 28 μm-thick polyimide film for suppressing degradation due to cosmic radiation may be formed separately from the silicon nitride film. Pads for the emitter electrode 11 and a gate electrode not shown are formed via photolithography and an etching process. Finally, an Al—Si electrode material and Ti/Ni/Au, etc. necessary for good soldering to a package are sputtered onto the rear surface of the wafer to thereby form a collector electrode 14. Thus, a termination structure shown in FIG. 3 is completed.

Incidentally, it is preferable that the dose quantity of boron ion implantation for forming the VLD region in FIGS. 5A to 5E is smaller than the dose quantity of boron ion implantation for forming the p-type base layer 5 in FIGS. 9A to 9D. If the dose quantity for the VLD region is larger than the dose quantity for the p-type base layer 5, the higher concentration of the VLD region 17 makes spreading of the depletion layer hard when the depletion layer spreads in the VLD region 17 from the p-type base layer 5 toward the chip outer circumferential side. As a result, potential sharing to the three regions ((1) the VLD region 17, (2) the vicinity of the clip p layer 17e and (3) the region between the clip p layer 17e and the channel stopper layer 6) which is the operation of the invention cannot be performed. Because the depletion layer need spread easily toward the outer circumferential side in the VLD region, it is preferable that the dose quantity of boron in the VLD region is smaller than the dose quantity of boron in the p-type base layer 5. When the dose quantity of boron in the VLD region is set to be smaller than the dose quantity of boron in the p-type base layer 5, it is a matter of course that the concentration of the p-type base layer 5 high in acceptor concentration becomes higher than that of the VLD region. As a result, avalanche breakdown occurs in the p-type base layer 5 at a voltage lower than that of the VLD region. Consequently, as described above with reference to FIGS. 2A to 2D, an avalanche current flows in the active region 31. Accordingly, current concentration into the termination structure region 33 can be avoided.

A modification of the producing method according to Embodiment 1 of the invention will be described below.

FIGS. 17A to 17C, FIGS. 18A to 18C, FIGS. 19A to 19C, FIGS. 20A to 20C and FIG. 21 are sectional views of important part in respective steps concerned with the modification of the producing method according to Embodiment 1 of the invention. In the process shown in FIGS. 4A and 4B and FIGS. 5A to 5E, boron ion implantation for forming the VLD region 17 is performed once. The point of difference is in that boron ion implantation is divided into a plurality of times in this modification. First, steps from FIG. 4A to FIG. 5C are executed.

(FIG. 17A) Successively, a photo resist 19 is applied on the whole surface of the wafer again and photolithography is performed. On this occasion, the photo resist 19 is patterned so that only regions where the p-type diffusion layer 17a and the clip p layer 17e in FIG. 3 will be formed are opened. (FIG. 17B) Then, boron ions are implanted at 45 keV and $1E12/cm^2$. In the boron ion implantation, ions are implanted in the portion of the p-type diffusion layer 17a in FIG. 3. (FIG. 17C) Then, the photo resist 19 is removed and the wafer is washed.

(FIG. 18A) Successively, a photo resist 19 is applied on the whole surface of the wafer and photolithography is performed. On this occasion, the photo resist 19 is patterned to form an ion implantation opening portion 51a so that only a region where the p-type diffusion layer 17b in FIG. 3 will be formed is opened. (FIG. 18B) Then, boron ions are implanted at 45 keV and $1E12/cm^2$. In the boron ion implantation, ions are implanted into the portion of the p-type diffusion layer 17b in FIG. 3. (FIG. 18C) Then, the photo resist 19 is removed and the wafer is washed.

(FIG. 19A) Successively, a photo resist 19 is applied on the whole surface of the wafer again and photolithography is performed. On this occasion, the photo resist 19 is patterned to form an ion implantation opening portion 51b so that only a region where the p-type diffusion layer 17c in FIG. 3 will be formed is opened. (FIG. 19B) Then, boron ions are implanted at 45 keV and $0.5E12/cm^2$. In the boron ion implantation, ions are implanted into the portion of the p-type diffusion layer 17c in FIG. 3. (FIG. 19C) Then, the photo resist 19 is removed and the wafer is washed.

(FIG. 20A) Successively, a photo resist 19 is applied on the whole surface of the wafer again and photolithography is performed. On this occasion, the photo resist 19 is patterned to form an ion implantation opening portion 51c so that a region where the p-type diffusion layer 17d in FIG. 3 will be formed is opened. (FIG. 20B) Then, boron ions are implanted at 45 keV and $0.5E12/cm^2$. In the boron ion implantation, ions are implanted into the portion of the p-type diffusion layer 17d in FIG. 3. (FIG. 20C) Then, the photo resist 19 is removed and the wafer is washed.

(FIG. 21) Successively, after drive-in is performed at 1100° C. for 5 hours in a nitrogen atmosphere, a thermal oxide film region 2a about 600 nm thick is formed in the front surface of the n-type drift layer 1 by well-known pyrogenic oxidation at 1150° C. By the thermal budget of drive-in and pyrogenic oxidation, the p-type diffusion layers 17a to 17d and the clip p layer 17e in the VLD region are formed. The producing process after this step may go through the same procedure as on and after FIG. 6B.

In this modification, boron ion implantation is divided into a plurality of times (four times). For this reason, exactly, the average concentration distribution of the VLD region is slightly different from a processing result shown in FIGS. 4A-4B, 5A-5E, 6A-6D, 7A-7D, 8, 9A-9D, 10A-10E, 11A-11B, 12A-12B, 13A-13D, 14A-14C, 15A-15C and 16 but the total dose quantity and the function of electric field relaxation and potential sharing are equal. The number of times for ion implantation need not be limited to four in this embodiment. As described above, when boron ion implantation is divided into a plurality of times for forming the VLD region, the number of masking steps increases but the function of electric field relaxation and potential sharing can be tuned finely.

Figure 22:
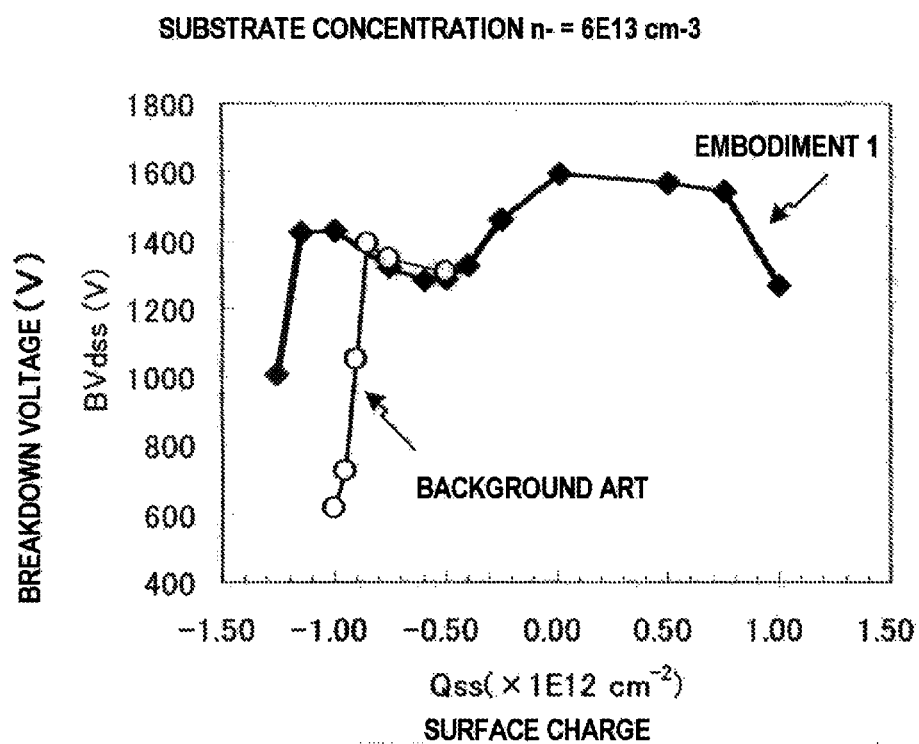
FIG. 22 is a characteristic graph showing electric characteristic of the semiconductor device according to the embodiment of the invention and electric characteristic of a semiconductor device according to the related art.

FIG. 22 is a graph showing surface charge dependence of breakdown voltage in Embodiment 1 and the background art. In the structure of the background art in which only the VLD region is formed, it is found that the breakdown voltage is reduced to 1200V or lower when the negative charge is particularly −0.9E12/cm$^2$ or lower. This is because, in the background art, the depletion layer punches through the channel stopper layer and shifts to the chip outer circumferential side so that the termination structure region 33 cannot breakdown the voltage when Qss is not higher than −0.9E12/cm$^2$.

On the other hand, in Embodiment 1, the breakdown voltage can be kept not lower than 1300V when Qss is not higher than −1.2E12/cm$^2$.

Figure 23:
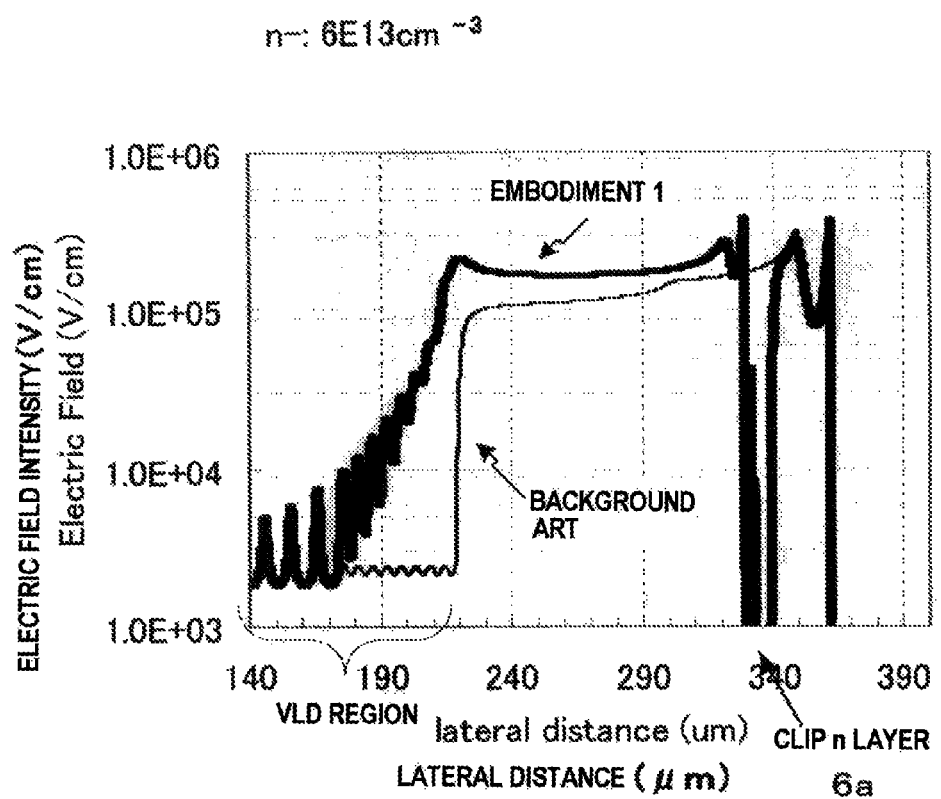
FIG. 23 is a characteristic graph showing electric characteristic of the semiconductor device according to the embodiment of the invention and electric characteristic of the semiconductor device according to the related art.

FIG. 23 shows an electric field intensity distribution in an Si surface of an SiO$_2$/Si interface at device breakdown (avalanche breakdown voltage) in each of Embodiment 1 and the background art. Qss is −1.0E12/cm$^2$. In the background art, electric field intensity is maximized on a side near the inside of the channel stopper layer 6 and decreases toward the VLD region. On the other hand, in Embodiment 1, electric field intensity increases in a section ranging from the clip p layer 17e to the VLD region. Moreover, the distribution is uniform with respect to lateral distance. In addition, though the depletion layer is apt to shift to the chip outer circumferential side because of negative external charge, electric field intensity in the VLD region is higher than that in the background art. That is, as described above, potential is shared to the three regions, that is, (1) the VLD region 17, (2) the vicinity of the clip p layer 17e and (3) the region between the clip p layer 17e and the channel stopper layer 6 as a result of formation of the clip p layer 17e.

Embodiment 2

A semiconductor device according to Embodiment 2 of the invention will be described with reference to FIG. 24.

Figure 24:
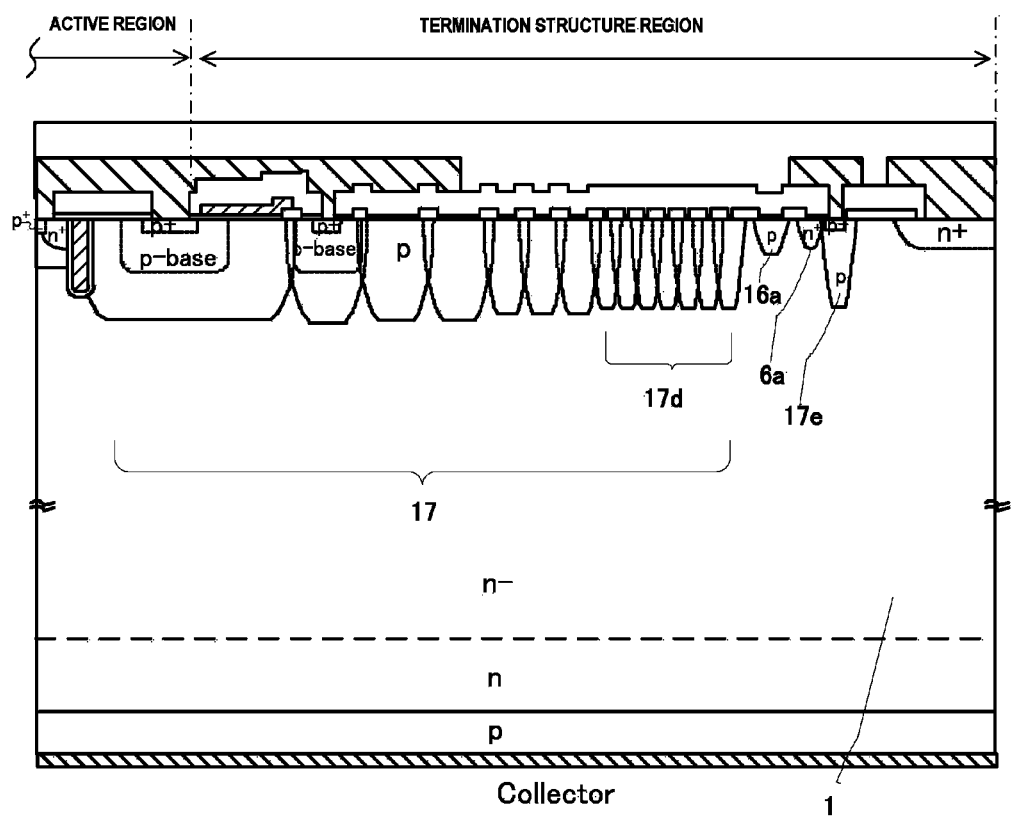
FIG. 24 is a sectional view showing important part of a semiconductor device according to an embodiment of the invention.

FIG. 24 is a sectional view showing important part of a semiconductor device according to Embodiment 2 of the invention. The point of difference of Embodiment 2 from Embodiment 1 (FIG. 3) lies in that a surface p-type field layer 16a higher in concentration than the n-type drift layer 1 is provided on the chip outer circumferential side of the p-type diffusion layer 17d in the VLD region 17. The surface p-type field layer 16a is separated from the p-type diffusion layer 17d and the clip p later 17e or the clip n layer 6a.

The length L of the surface p-type field layer 16a in a direction along the SiO$_2$/Si interface is 30 μm. The dose quantity of the surface p-type field layer 16a is 5.4E11/cm$^2$. When the concentration of the n-type drift layer 1 is 9E13/cm$^3$, the dose quantity of the surface p-type field layer 16a is preferably in a range of from 5 to 8E11/cm$^2$. The surface p-type field layer 16a is about 9.3 μm away from the p-type diffusion layer 17d.

When external charge is negative, the Si surface of the termination structure region 33 is positively charged and the depletion layer shifts to the chip outer circumferential side. Particularly when the concentration of the n-type drift layer 1 is low (for example, not higher than 6E13/cm$^3$), the absolute value of spatial charge density in the surface of the n-type drift layer 1 in the termination structure region 33 decreases more remarkably so that the depletion layer spreads easily. For this reason, the depletion layer is apt to punch through the n-type channel stopper layer 6 beyond the clip p layer 17e. By punching through, an electron storage layer channel is formed in the SiO$_2$/Si interface. As a result, the leakage current increases or the breakdown voltage decreases in accordance with change in spatial charge density. Accordingly, the surface p-type field layer 16a higher in concentration than the n-type drift layer 1 is formed to thereby suppress spreading of the depletion layer and exert an effect of cutting off the electron storage layer channel.

Embodiment 3

A semiconductor device according to Embodiment 3 of the invention will be described with reference to FIG. 25.

Figure 25:
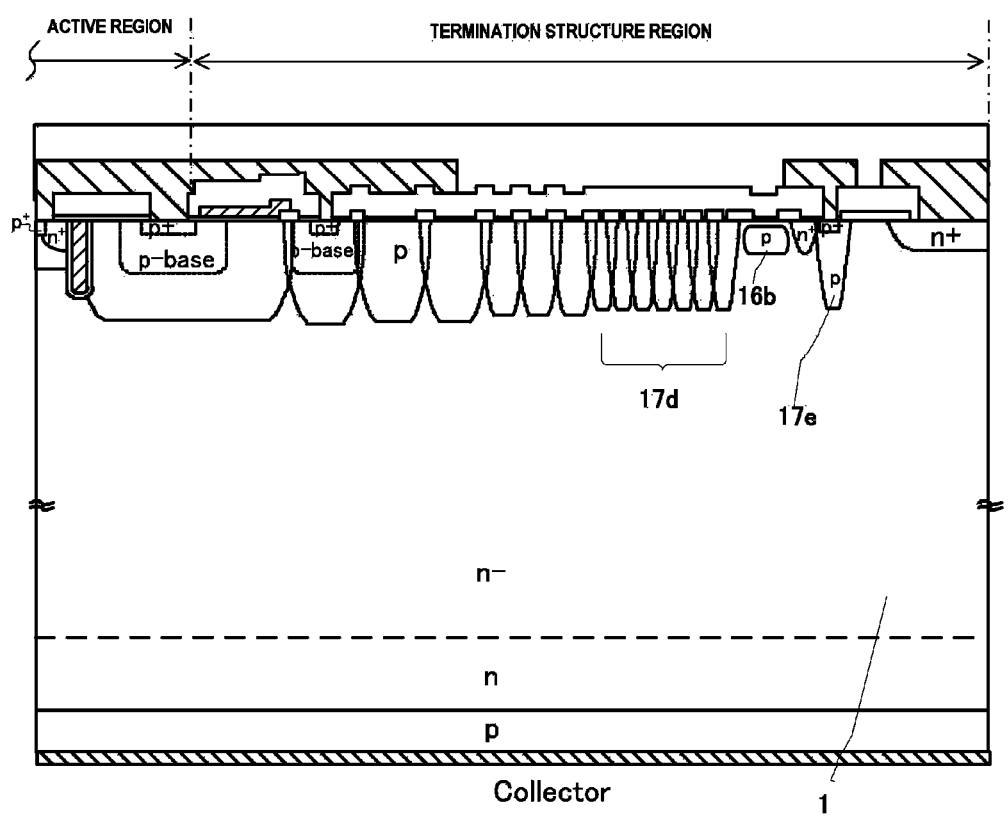
FIG. 25 is a sectional view showing important part of a semiconductor device according to an embodiment of the invention.
Figure 29:
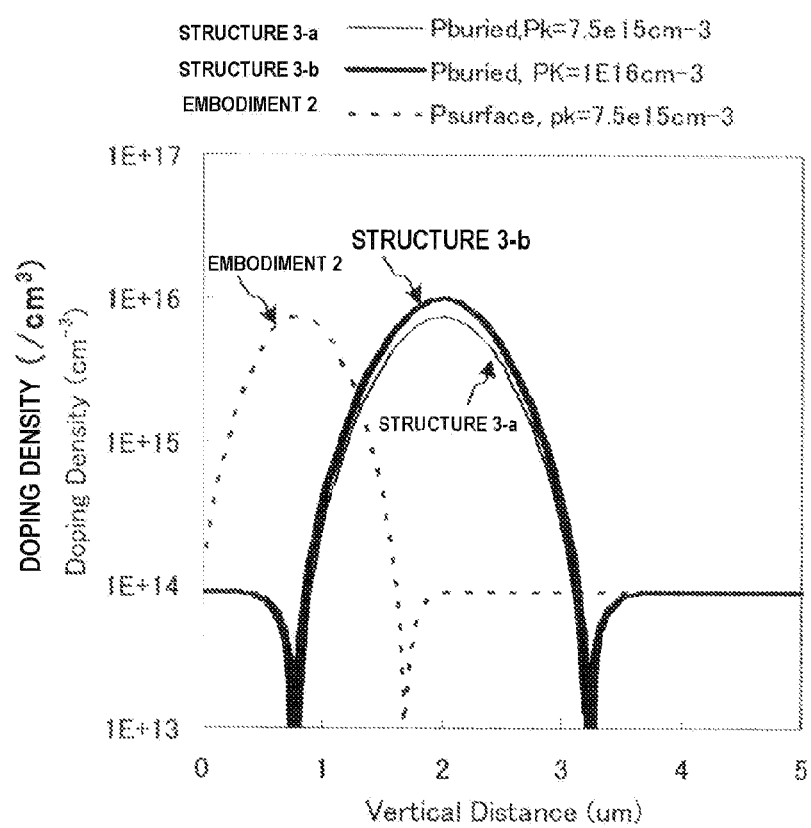
FIG. 29 is a graph showing doping concentration distributions of the semiconductor devices according to the embodiments of the invention.

FIG. 25 is a sectional view showing important part of a semiconductor device according to Embodiment 3 of the invention. The point of difference of Embodiment 3 from Embodiment 2 (FIG. 24) lies in that the position of the peak concentration of the surface p-type field layer 16a in FIG. 24 is shifted from the chip surface to the inside of the n-type drift layer 1 so that the surface p-type field layer 16a is changed to a so-called embedded layer. The embedded layer is called embedded p-type field layer 16b. The embedded p-type field layer 16b is separated from the p-type diffusion layer 17d and the clip p layer 17e or the clip n layer 6a. FIG. 29 is a graph showing a doping concentration distribution in a depth direction of each of the surface p-type field layer 16a in Embodiment 2 and the embedded p-type field layer 16b in Embodiment 3. As for Embodiment 3, the structure in which the peak concentration of the embedded p-type field layer 16b is 7.5E15/cm$^3$ is referred to as "structure 3-a". The dose quantity of the embedded p-type field layer 16b in the structure 3-a is 7.3E11/cm$^2$. On the other hand, the structure in which the peak concentration of the embedded p-type field layer 16b is 1E16/cm$^3$ is referred to as "structure 3-b". The dose quantity of the embedded p-type field layer 16b in the structure 3-b is 9.8E11/cm$^2$. The embedded p-type field layer 16b in either the structure 3-a or the structure 3-b is about 9.3 μm away from the p-type diffusion layer 17d.

The embedded p-type field layer 16b in the structure 3-a has a large effect on suppressing spreading of the depletion layer for negative external charge compared with the surface p-type field layer 16a in Embodiment 2. That is, as for the depletion layer spreading laterally in the vicinity of the surface of the termination structure region from the active region side, the equipotential surface is curved more largely as the highest concentration position becomes deeper from the surface. Because electric field intensity is proportional to spatial gradient of equipotential surface and conforms to the Poisson's equation (divE=ρ in which E is electric field intensity, and ρ is charge density), electric field intensity in the vicinity of the embedded p-type field layer 16b increases so that a larger voltage can be withstood.

Figure 26:
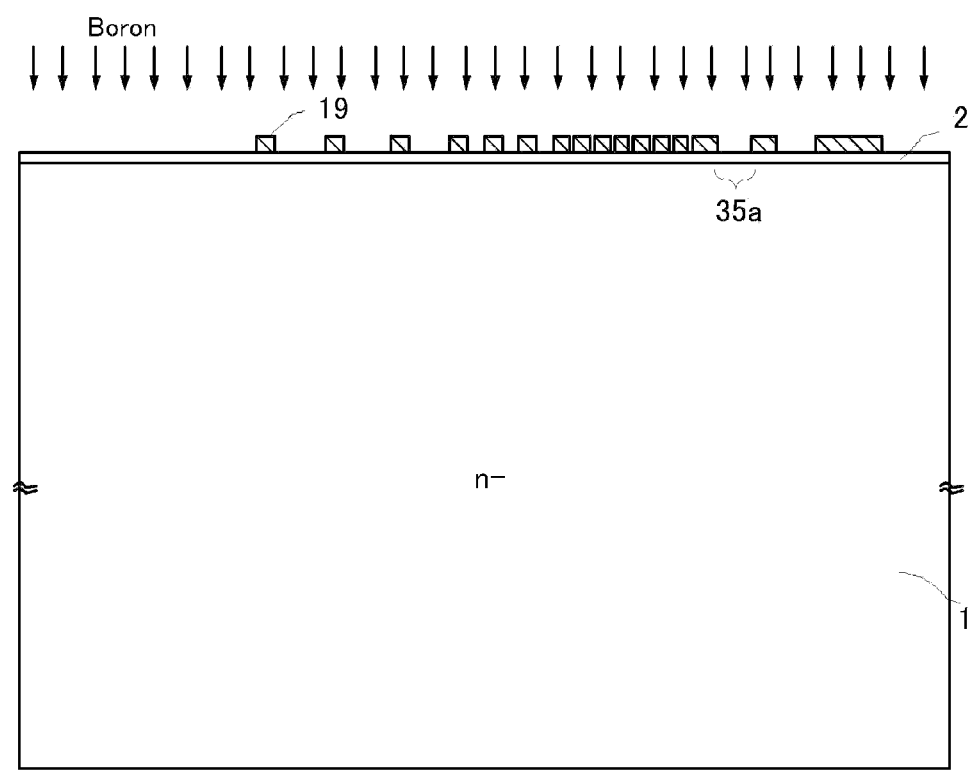
FIG. 26 is a sectional view of important part showing a process of producing the semiconductor device according to the embodiment of the invention.
Figure 27A:
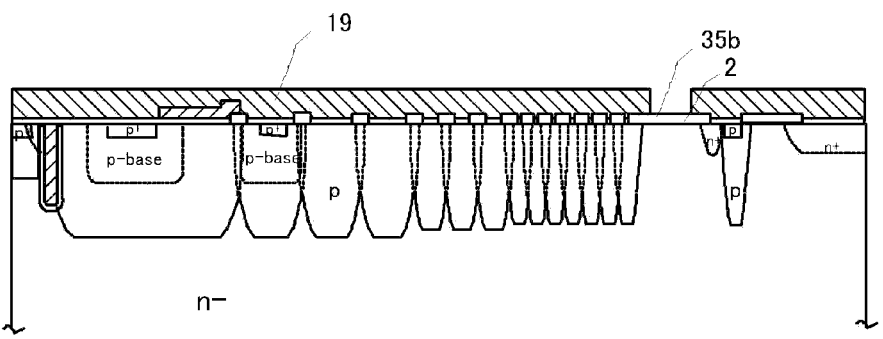
FIGS. 27A to 27D are sectional views of important part showing a process of producing the semiconductor device according to the embodiment of the invention.
Figure 27B:
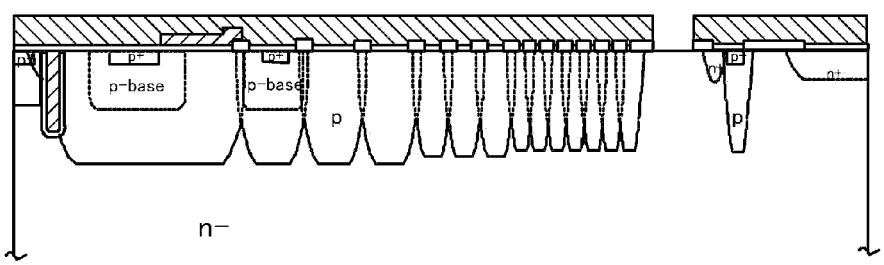
Figure 27C:
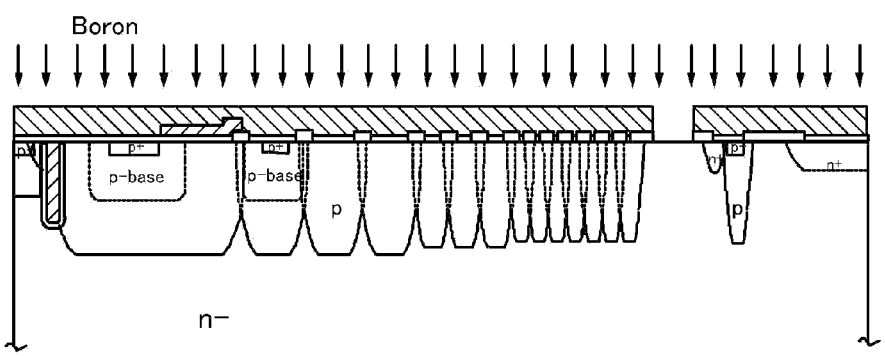
Figure 27D:
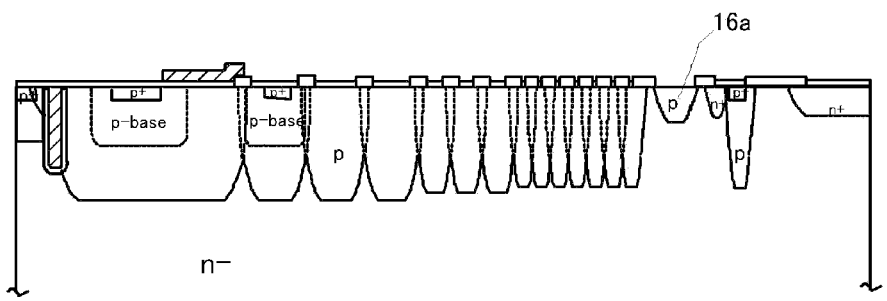

A method of producing the semiconductor device according to Embodiment 2 or 3 of the invention will be described next. The producing method in Embodiment 2 is mainly classified into two. One is a method in which a resist opening portion 35a is also formed in a region where the surface p-type field layer 16a will be formed, so that boron ions are implanted by the VLD region ion implantation process in Embodiment 1, as shown in FIG. 26. By this method, the surface p-type field layer 16a with the same concentration distribution as that of the VLD region is formed. The other method is as follows. First, as shown in FIG. 27A, after formation of the contact p$^+$ region 7, etc., a resist is applied and photolithography is performed to form an opening portion 35b in which the resist is opened only in a region where the surface p-type field layer 16a will be formed. Successively, as shown in FIG. 27B, the separation oxide film 2 is opened by etching. Then, as shown in FIG. 27C, boron ion implantation is performed additionally and then the photo resist 19 is removed. Successively, as shown in FIG. 27D, heat treatment at 950° C. is performed for about 30 minutes to form the surface p-type field layer 16a. The method of producing either the structure 3-a or the structure 3-b is the same as the producing method in Embodiment 2. Particularly in the case of the embedded p-type field layer 16b, the second method can form the embedded p-type field layer 16b singly because the position of the peak concentration of the embedded p-type field layer 16b is deep. For example, when acceleration energy of boron ion implantation is in a range of from 100 keV to 2.3 MeV, both inclusively, the embedded layer can be formed.

Figure 28:
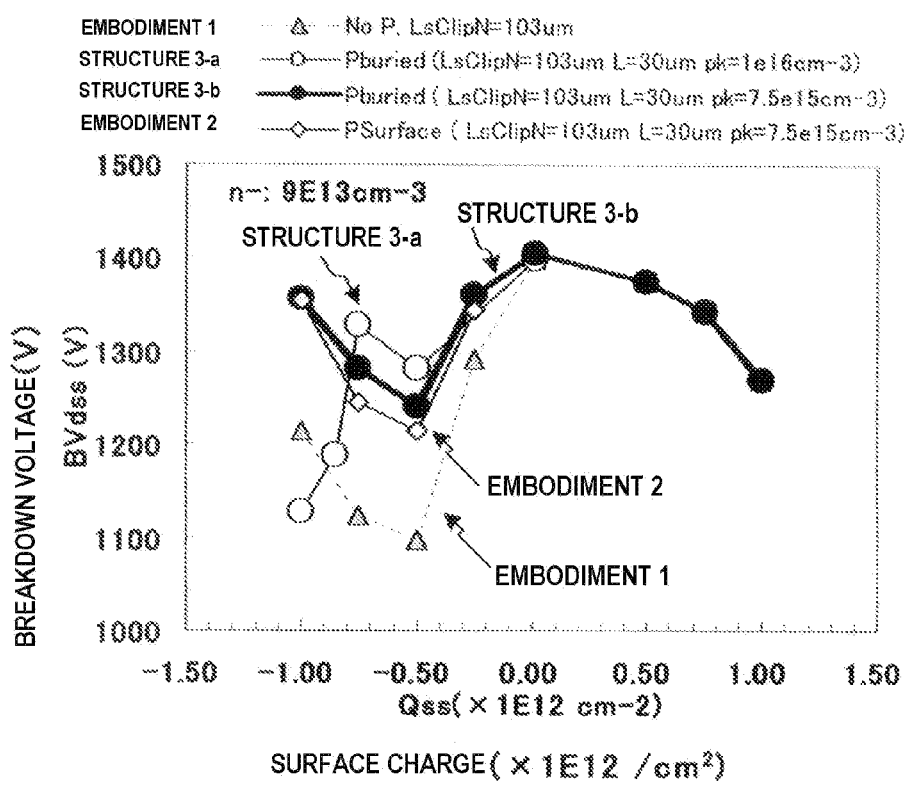
FIG. 28 is a characteristic graph showing electric characteristics of semiconductor devices according to embodiments of the invention and electric characteristics of semiconductor devices according to the related art.

FIG. 28 is a graph showing surface charge dependence of breakdown voltage in each of Embodiment 2, Embodiment 3 (structure 3-a and structure 3-b) and Embodiment 1. In Embodiment 1, surface charge dependence of breakdown voltage is improved compared with the background art as shown in FIG. 22 but the breakdown voltage is reduced to 1100V at $-0.5E12/cm^2$. On the other hand, when the surface p-type field layer 16a is provided as in Embodiment 2, a breakdown voltage of 1200V or higher is exhibited at the same charge as a result of the aforementioned operation. In the case of the embedded p-type field layer 16b, the breakdown voltage decreases at $-0.8E12/cm^2$ or lower when the dose quantity is $7.3E11/cm^2$, but reduction in breakdown voltage can be suppressed when the dose quantity is increased to $9.8E11/cm^2$.

Figure 30:
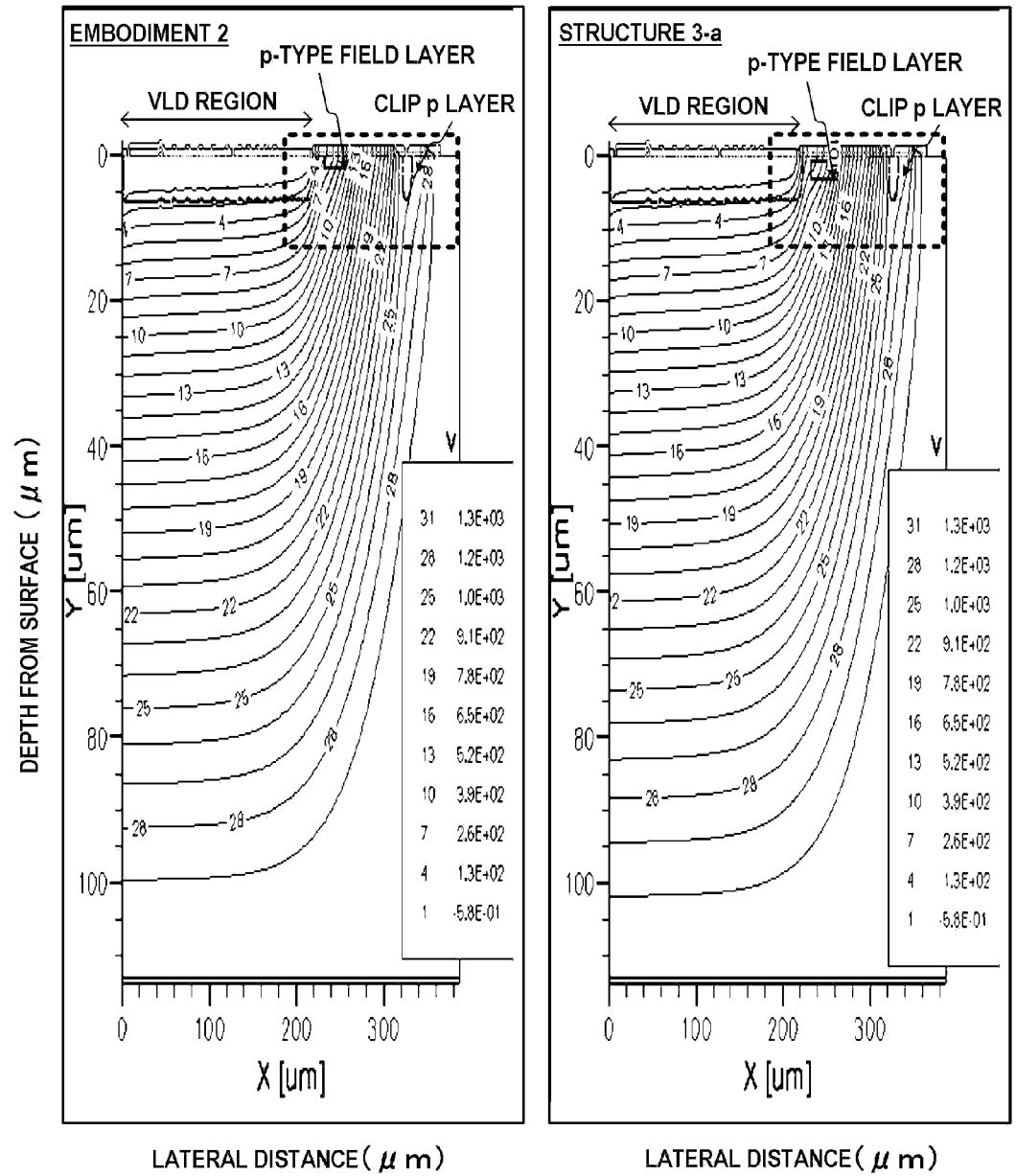
FIGS. 30A and 30B are characteristic graphs showing electric characteristics of the semiconductor devices according to the embodiments of the invention.

FIGS. 30A and 30B show electrostatic potential (equipotential surface) distributions at avalanche breakdown in Embodiment 2 and structure 3-a. FIG. 30A shows Embodiment 2, and FIG. 30B shows structure 3-a. Qss is $-7.5E11/cm^2$. The equipotential surface interval is 43.3V. The difference in equipotential surface distribution between Embodiment 2 and structure 3-a is observed in the vicinity of the p-type field layer in the surface (upper side in FIGS. 30A and 30B) enclosed by the solid broken line. That is, in the structure 3-a, it is found that the equipotential surface is curved at a deeper position. This curve permits electric field intensity to increase and a higher voltage to be withstood.

Incidentally, in either of Embodiment 2 and structure 3-a, it is found that the clip p layer is sandwiched between two equipotential surfaces. That is, the voltage shared to the clip p layer is substantially equal to the equipotential surface interval, that is, in a range of from 40 to 50V.

Embodiment 4

A semiconductor device according to Embodiment 4 of the invention will be described with reference to FIG. 31.

Figure 31:
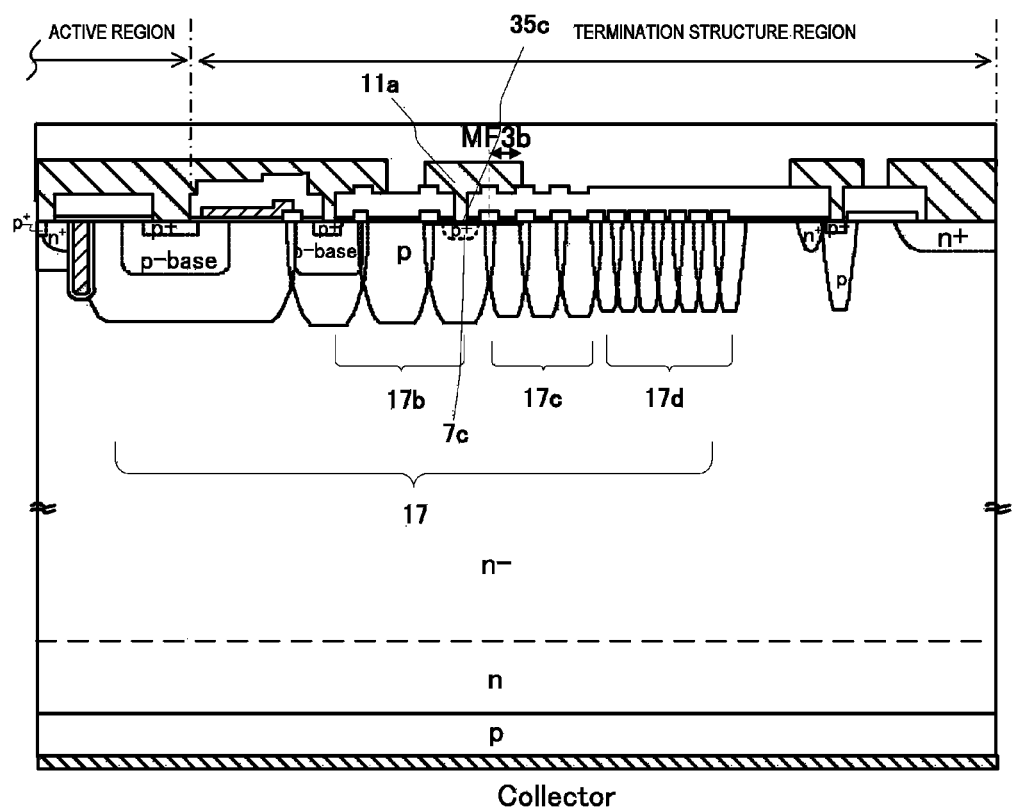
FIG. 31 is a sectional view showing important part of the semiconductor device according to the embodiment of the invention.

FIG. 31 is a sectional view showing important part of a semiconductor device according to Embodiment 4 of the invention. The difference of Embodiment 4 from Embodiment 1 (FIG. 3) is as follows. The separation oxide film 2 and the interlayer insulating film 8 formed on the surface of the p-type diffusion layer 17b are partially opened in the depth direction of the paper surface (hereinafter referred to as lengthwise direction) to form opening portions 35c. A VLD field plate 11a is newly provided together with a contact p$^+$ region 7c in each opening portion 35c. The length of a roof of a chip outer circumferential side of the VLD field plate 11a is MF3b.

It is preferable that the distance between opening portions 35c adjacent to each other in the lengthwise direction is larger than 16 times the width of the opening portion 35c in a direction of from the chip inner circumferential side to the chip outer circumferential side. For example, when the opening portion 35c is 6 μm long, the distance between opening portions 35c adjacent in the lengthwise direction is not smaller than 100 μm. When the SiO$_2$/Si interface is positively charged because of negative external charge coming flying, the depletion layer spreading to the VLD region 17 extends to the p$^+$ region 7c. On this occasion, extension of the depletion layer is suppressed in the place of the p$^+$ region 7c. Accordingly, if the p$^+$ region 7c is present in the all region in the lengthwise direction, a unique high electric field intensity region is generated in the vicinity of the p$^+$ region 7c so that the breakdown voltage is reduced. Therefore, when the p$^+$ region 7c is disposed partially, extension of the depletion layer is kept in the place surrounded by the p$^+$ regions 7c adjacent in the lengthwise direction. Accordingly, reduction in breakdown voltage can be suppressed.

This embodiment is further characterized in that the VLD field plates 11a connected to the p$^+$ regions 7c respectively are partially scattered on the interlayer insulating film 8 between the p$^+$ regions 7c adjacent to one another in the lengthwise direction so as to correspond to the p$^+$ regions 7c. By the VLD field plates 11a, electric field intensity between the p$^+$ region 7c and the p-type diffusion layer 17c or the n-type drift layer 1 slightly increases in the surface of the chip so that the breakdown voltage increases. The length of the VLD region 17 can be shortened in accordance with the improved value of the breakdown voltage. That is, the object of partially forming the VLD field plates 11a is to slightly increase electric field intensity in the inside of the VLD region 17 for positive external charge coming flying and relax electric field intensity to the chip outer circumferential side to suppress too strong increase of electric field intensity to thereby improve the breakdown voltage and shorten the length of the VLD region 17.

The process flow of the device according to this embodiment is the same as the process flow in Embodiment 1. The p$^+$ regions 7c are formed simultaneously with the formation of the p$^+$ regions 7, 7a and 7b. Contacts with the p$^+$ regions 7c are formed simultaneously with the formation of contacts with the interlayer insulating film 8. The VLD field plates 11a are formed simultaneously with the emitter electrode 11, the stopper field plate 15 and the clip field plate 15a.

Figure 32:
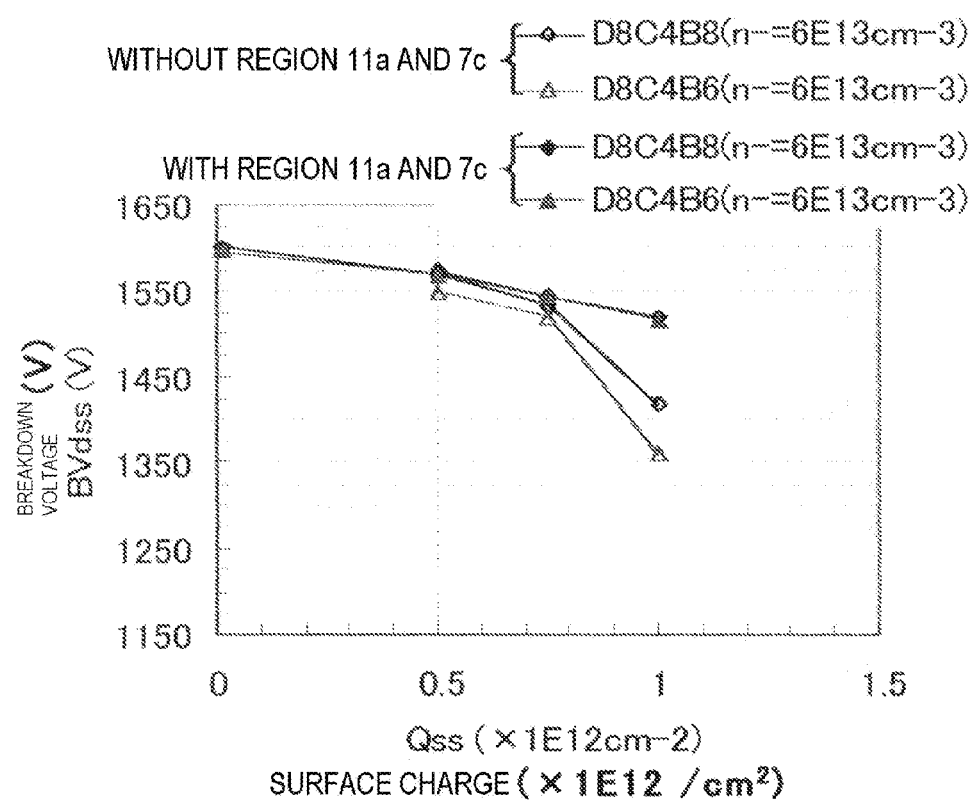
FIG. 32 is a characteristic graph showing electric characteristic of the semiconductor device according to the embodiment of the invention.

FIG. 32 is a graph showing surface charge dependence of breakdown voltage in Embodiment 4. The concentration of the n-type drift layer 1 is 6E13/cm$^3$. In a legend of FIG. 32, "D8C4B8" shows that eight p-type diffusion layers 17d, four p-type diffusion layers 17c and eight p-type diffusion layers 17b are provided in the VLD region. Other parameters except addition of VLD field plates 11a and p$^+$ regions 7c are the same as in Embodiment 1. In the legend, "D8C4B6" shows that eight p-type diffusion layers 17d, four p-type diffusion layers 17c and six p-type diffusion layers 17b less than D8C4B8 by two are provided in the VLD region. The configuration of the VLD region and other configurations except addition of VLD field plates 11a and p$^+$ regions 7c are the same as in Embodiment 1. With respect to the length of each VLD field plate 11a, the distance from the center of the separation oxide film 2 adjacent to the p$^+$ region 7c on the chip outer circumferential side of the p$^+$ region 7c to the chip outer circumferential side end portion of the VLD field plate 11a is regarded as MFP3b. The value of MFP3b is set to be 5 μm.

From FIG. 32, when positive external charge is 1E12/cm2, the provision of the VLD field plates 11a and the p$^+$ regions 7c permits the breakdown voltage of the element of D8C4B8 to increase by 58V and the breakdown voltage of the element of D8C4B6 to increase by 160V.

The reason why increase in breakdown voltage of the element of D8C4B6 having the VLD field plates 11a and the p+ regions 7c is large is as follows. In D8C4B8, six p-type diffusion layers 17b are disposed between the p+ region 7c and the p+ region 7b. Here, the distance from the chip outer circumferential side end portion of the p-type diffusion layer 17c in the chip surface to the chip outer circumferential side end portion of the p-type diffusion layer 17d is 93.3 µm. On the other hand, in D8C4B6 having the VLD field plates 11a and the p+ regions 7c, four p-type diffusion layers 17b are disposed between the p+ region 7c and the p+ region 7b. The distance from the chip outer circumferential side end portion of the p+ regions 7c in the chip surface to the chip outer circumferential side end portion of the p-type diffusion layer 17d is 93.3 µm. That is, in the element having VLD field plates 11a and p+ regions 7c, the breakdown voltage of the element of D8C4B6 becomes close to the breakdown voltage of the element of D8C4B8 because of the aforementioned operation and effect. As a result, the breakdown voltage can be kept even when the number of p-type diffusion layers 17b is reduced by two, so that the length of the termination structure region can be shortened by about 25 µm.

Embodiment 5

A semiconductor device according to Embodiment 5 of the invention will be described with reference to FIG. 33.

Figure 33:
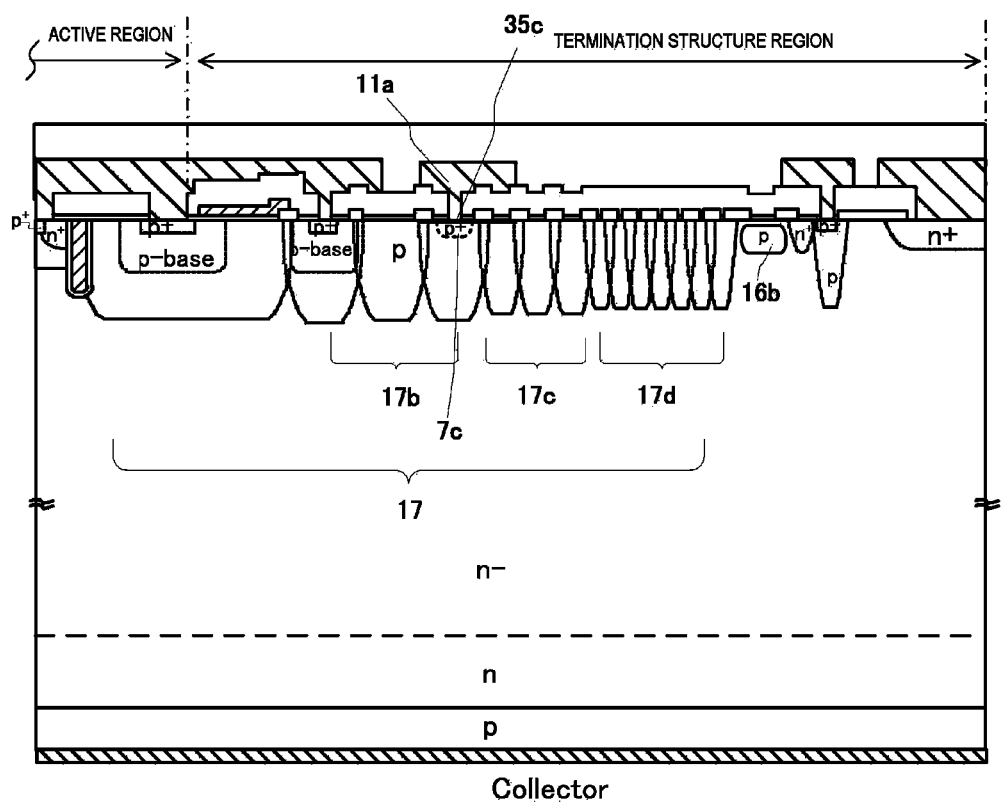
FIG. 33 is a sectional view showing important part of the semiconductor device according to the embodiment of the invention.

FIG. 33 is a sectional view showing important part of a semiconductor device according to Embodiment 5 of the invention. Embodiment 5 is characterized in that VLD field plates 11a shown in Embodiment 4 (FIG. 31) are provided in Embodiment 3 (FIG. 25) having the embedded p-type field layer 16b. Incidentally, it is a matter of course that VLD field plates 11a may be provided not in Embodiment 3 but in Embodiment 2 (FIG. 24) having the surface p-type field layer 16a. When the process flow in Embodiment 2 or 3 is incorporated in the process flow in Embodiment 4, production in Embodiment 5 can be performed easily.

Figure 34:
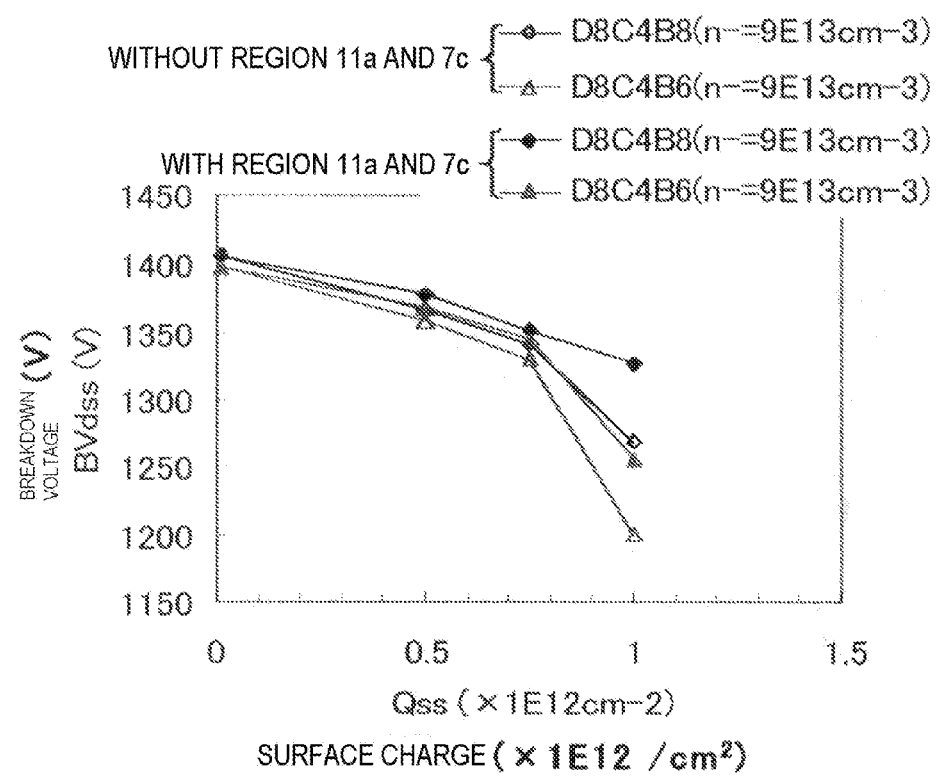
FIG. 34 is a characteristic graph showing electric characteristic of the semiconductor device according to the embodiment of the invention.

FIG. 34 is a graph showing surface charge dependence of breakdown voltage in Embodiment 5. The concentration of the n-type drift layer 1 is 9E13 $cm^{-3}$. Expressions "D8C4B8" and "D8C4B6" in the legend are the same as in Embodiment 4.

From FIG. 34, when positive external charge is 1E12 $cm^{-2}$, the provision of the VLD field plates 11a and the p+ regions 7c permits the breakdown voltage of the element of D8C4B8 to increase by 58V and the breakdown voltage of the element of D8C4B6 to increase by 55V.

The reason why increase in breakdown voltage of the element of D8C4B6 having the VLD field plates 11a and the p+ regions 7c is large is as follows. In D8C4B8, six p-type diffusion layers 17b are disposed between the p+ region 7c and the p+ region 7b. On the other hand, in D8C4B6 having the VLD field plates 11a and the p+ regions 7c, four p-type diffusion layers 17b are disposed between the p+ region 7c and the p+ region 7b. The distance from the chip outer circumferential side end portion of the p+ regions 7c in the chip surface to the chip outer circumferential side end portion of the p-type diffusion layer 17d is 93.3 µm in either case.

That is, in the element having VLD field plates 11a and p+ regions 7c, the breakdown voltage of the element of D8C4B6 becomes close to the breakdown voltage of the element of D8C4B8 because of the aforementioned operation and effect. As a result, the breakdown voltage can be kept even when the number of p-type diffusion layers 17b is reduced by two, so that the length of the termination structure region can be shortened by about 25 µm.

Embodiment 6

A semiconductor device according to Embodiment 6 of the invention will be described with reference to FIG. 35.

Figure 35:
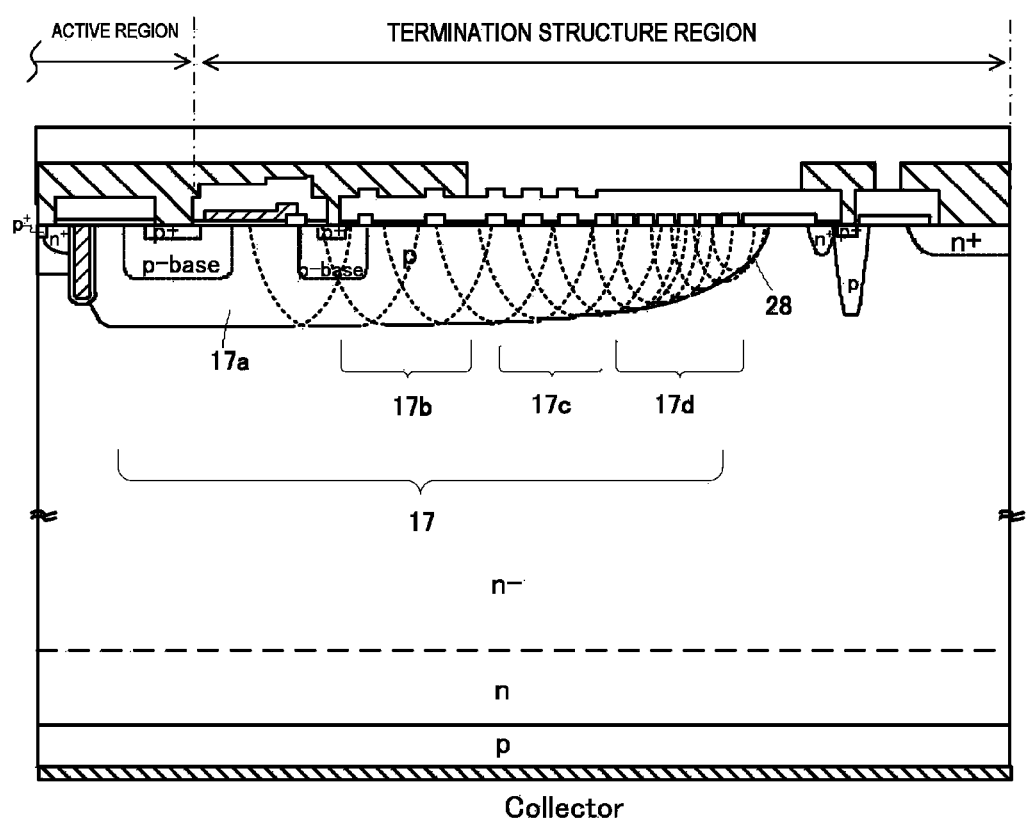
FIG. 35 is a sectional view showing important part of the semiconductor device according to the embodiment of the invention.

FIG. 35 is a sectional view showing important part of a semiconductor device according to Embodiment 6 of the invention. The difference of Embodiment 6 from Embodiment 1 (FIG. 3) lies in that pn junction surfaces of the p-type diffusion layers 17a to 17d in the VLD region 17 are not wavy as shown in Embodiment 1 but overlap one another broadly to form an envelope curve 28. As for the envelope curve 28, photo resist opening portions at ion implantation may be made narrower than the width of opening portions in Embodiment 1, etc. or the thermal budget of thermal diffusion may be made so high that overlapping of the lateral diffusion portions 34 adjacent to one another (in FIG. 1) is widened. As for the thermal budget, in the well known method, for example, the maximum temperature may be increased by 50-100° C. or the diffusing time may be increased by several hours. Or as will be described later, this embodiment can be also obtained by a method in which boron ion implantation for the VLD region 17 is performed via an oxide film having a tapered thickness (slope shape like an inclination of a mountain).

In this manner, the acceptor concentration distribution is smoothened more sufficiently so that the depletion layer is apt to spread into the VLD region more remarkably.

Embodiment 7

A semiconductor device according to Embodiment 7 of the invention will be described with reference to FIGS. 36 and 37.

Figure 36:
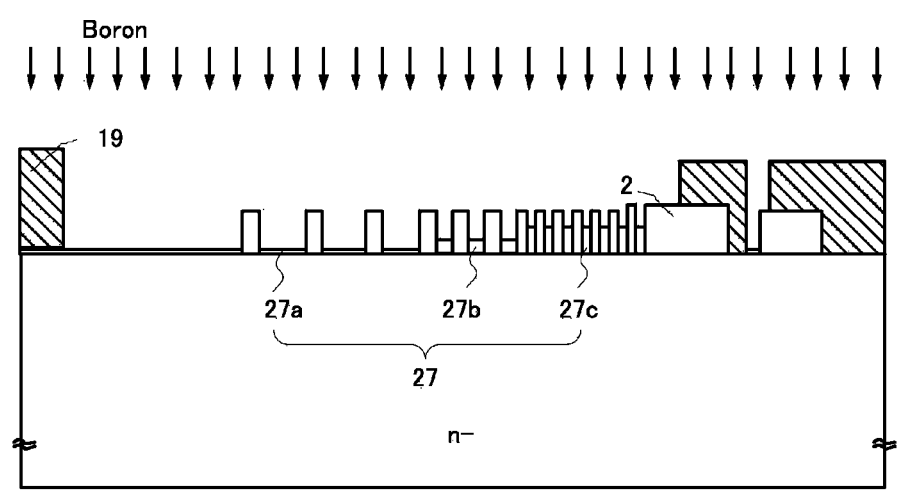
FIG. 36 is a sectional view of important part showing a process of producing the semiconductor device according to the embodiment of the invention.
Figure 37:
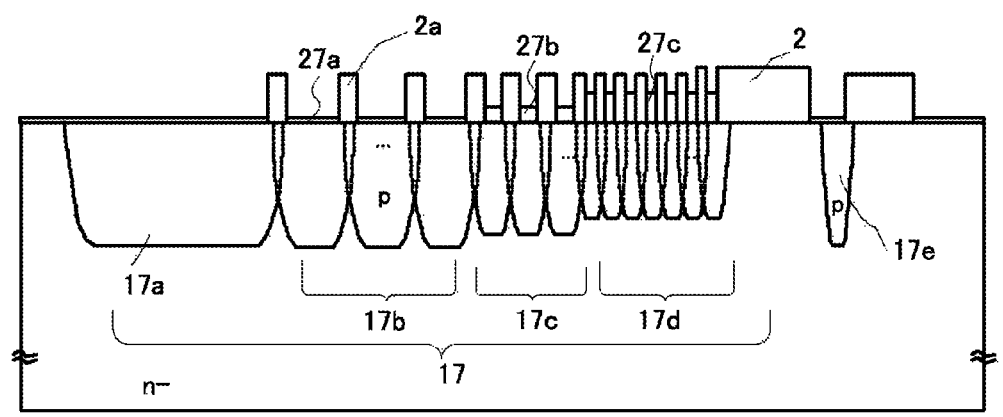
FIG. 37 is a sectional view of important part showing a process of producing the semiconductor device according to the embodiment of the invention.
Figure 38A:
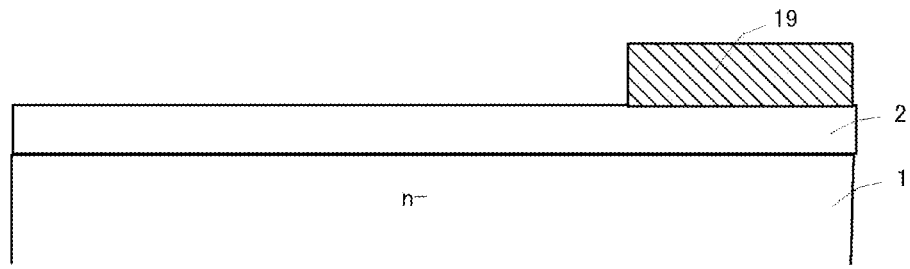
FIGS. 38A to 38E are sectional views of important part showing a process of producing the semiconductor device according to the embodiment of the invention.
Figure 38B:
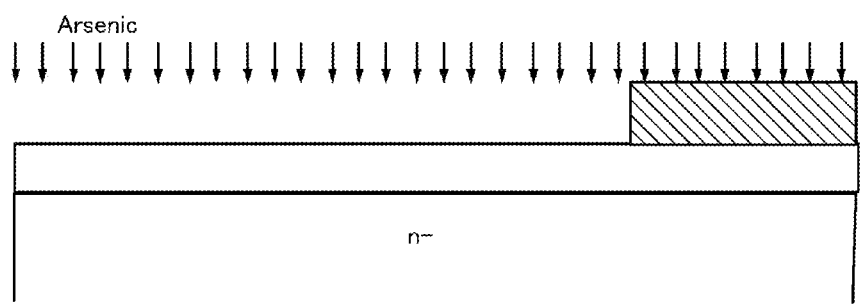
Figure 38C:
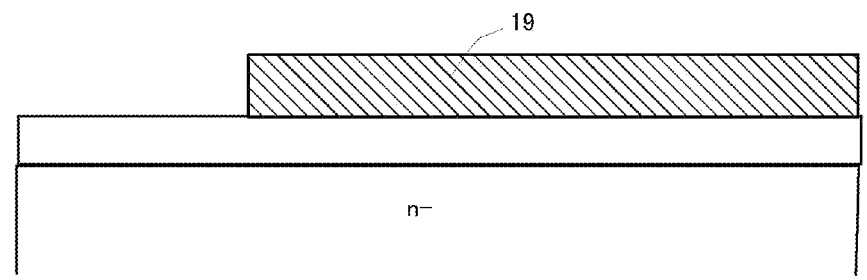
Figure 38D:
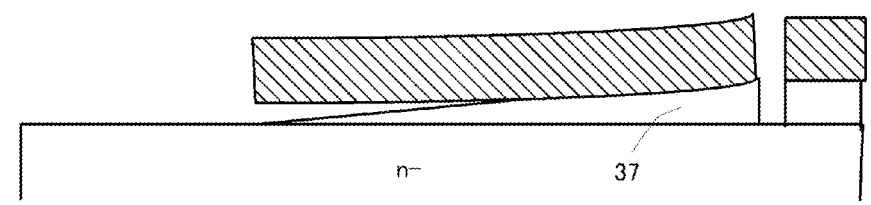
Figure 38E:
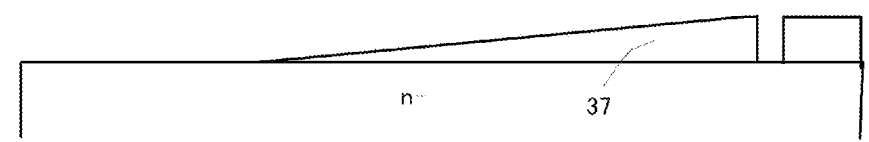
Figure 39A:
FIGS. 39A to 39D are sectional views of important part showing a process of producing the semiconductor device according to the embodiment of the invention.
Figure 39B:
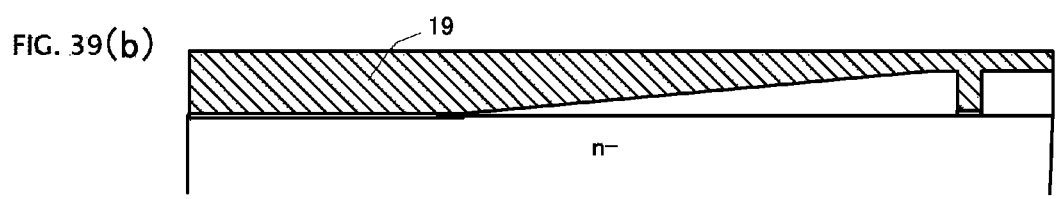
Figure 39C:
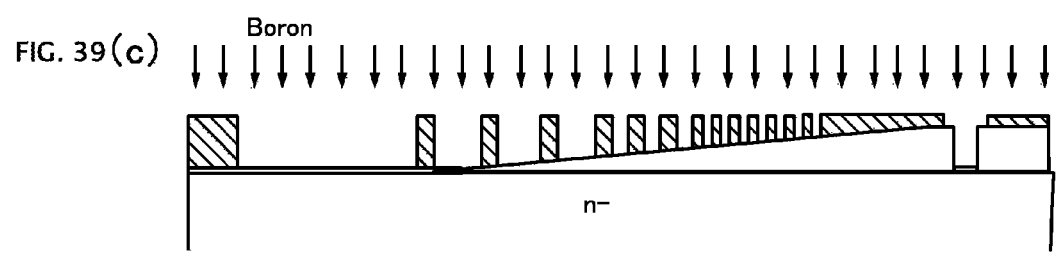
Figure 39D:
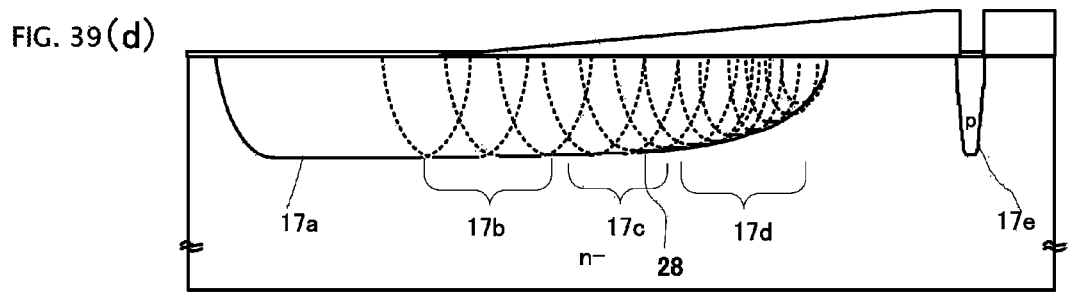

FIGS. 36 and 37 are sectional views of important part showing a process of producing a semiconductor device according to Embodiment 7 of the invention. The difference of Embodiment 7 from Embodiment 1 lies in that a thickness distribution is given to the screen oxide film 27 in FIG. 5C. That is, for example, assume that the highest concentration portions in the VLD region 17 in FIG. 35 are p-type diffusion layers 17a and 17b. Assume that the thickness of a screen oxide film 27a in a region for forming the p-type diffusion layers 17a and 17b is the same as in Embodiment 1. Next, the thickness of a screen oxide film 27b in a portion for forming the p-type diffusion layer 17c high in concentration is made larger. The thickness of a screen oxide film 27c in a portion for forming the p-type diffusion layer 17d lowest in concentration is made largest. In this manner, screen oxide films 27a to 27c having thicknesses as shown in FIG. 36 are formed. Boron ions are implanted as shown in FIG. 36. On this occasion, as the thickness of the screen oxide film increases, the range of implanted boron ions from the silicon surface becomes shallower. A VLD region 17 composed of p-type diffusion layers 17a to 17d and a clip p layer 17e as shown in FIG. 37 are then formed by a drive-in process.

Embodiment 8

A semiconductor device according to Embodiment 8 of the invention will be described with reference to FIGS. 38A to 38E and FIGS. 39A to 39D.

FIGS. 38A to 38E and FIGS. 39A to 39D are sectional views of important part showing a process of producing a semiconductor device according to Embodiment 8 of the invention. The difference of Embodiment 8 from Embodiment 1 lies in that a thickness distribution is given to the separation oxide film 2 in FIGS. 5A to 5E.

(FIG. 38A) Photolithography is applied to an upper surface of a separation oxide film 2 formed on a surface of an n-type drift layer 1 by thermal oxidation. (FIG. 38B) While a photo resist 19 is used as a mask, arsenic ions for damaging the surface of the separation oxide film 2 are implanted in a region where the VLD region will be formed. The condition for arsenic ion implantation is, for example, a dose quantity of 1E15 atoms/cm$^2$ and acceleration energy of 40 keV. Of course, the relation between acceleration energy and the thickness of the separation oxide film 2 is based on the assumption that implanted arsenic ions do not reach the n-type drift layer 1 but the range of arsenic ions reaches the surface of the separation oxide film 2. (FIG. 38C) Successively, the photo resist 19 is removed and a photo resist 19 is applied on the upper surface of the separation oxide film 2 again and patterned by photolithography. (FIG. 38D) Successively, while the photo resist 19 is used as a mask, the separation oxide film 2 is etched by wet etching. On this occasion, the etching rate in the upper surface of the separation oxide film 2 becomes very large only in the region damaged in FIG. 38B. For this reason, the surface of the separation oxide film 2 is tapered so that a tapered oxide film 37 is formed. (FIG. 38E) Then, the photo resist 19 is removed and the wafer is washed.

(FIG. 39A) Successively, a screen oxide film 27 is formed to have a thickness of 500 nm. (FIG. 39B) Then, a photo resist 19 is applied again. (FIG. 39C) Successively, the photo resist is patterned by photolithography and boron ions are implanted. The condition for boron ion implantation is, for example, acceleration energy of 45 keV and a dose quantity of 3E12/cm$^2$. (FIG. 39D) Then, after the photo resist 19 is removed, the wafer is washed and p-type diffusion layers 17$a$ to 17$d$ are formed via drive-in. The pn junction surfaces of the p-type diffusion layers 17$a$ to 17$d$ form an envelope curve 28 by reflecting the shape of the tapered oxide film.

What is claimed is:

1. A semiconductor device comprising:
   a first electrode formed on a first principal surface of a first conductivity type semiconductor substrate;
   a second electrode formed on a second principal surface of the semiconductor substrate;
   a base layer of a second conductivity type formed on the first principal surface of the semiconductor substrate and connected to the first electrode;
   a VLD region of the second conductivity type provided on an outer circumferential side of the base layer;
   a floating region of the second conductivity type provided on an outer circumferential side of the VLD region and separated from the VLD region; and
   a stopper layer of the first or second conductivity type provided on an outer circumferential side of the VLD region and separated from the VLD region,
   wherein the floating region further comprises:
   a field region of the second conductivity type provided on the outer circumferential side of the VLD region and separated from the VLD region and which is lower in impurity concentration than the VLD region, and
   a first clip layer of the second conductivity type which is provided between the field region and the stopper layer and separated from the field region and the stopper layer and which is higher in impurity concentration than the field region.

2. The semiconductor device according to claim 1, wherein the first clip layer is embedded in the semiconductor substrate.

3. The semiconductor device according to claim 1, wherein an electrostatic potential is shared among the VLD region, in the vicinity of the first clip layer and a region between the first clip layer and the stopper layer by forming a complementary high electric field intensity region in the vicinity of the first clip layer.

4. The semiconductor device according to claim 1, wherein a depth of the field region is shallower than a depth of the first clip region.

5. The semiconductor device according to claim 1, further comprising a second clip layer of the first conductivity type which is provided on the outer circumferential side of the VLD region and on an inner circumferential side of the first clip layer so as to be separated from the VLD region and which is higher in concentration than the semiconductor substrate.

6. The semiconductor device according to claim 5, wherein a depth of the second clip layer is shallower than a depth of the first clip layer.

7. The semiconductor device according to claim 5, wherein the second clip layer is adjacent to the first clip layer.

8. The semiconductor device according to claim 1, further comprising a first field plate formed on a surface of the first clip layer.

9. The semiconductor device according to claim 8, wherein a length of the first field plate toward an inner circumferential side of the first clip layer is larger than a length of the first field plate toward an outer circumferential side of the first clip layer.

10. The semiconductor device according to claim 8, wherein the second clip layer is covered with the first field plate over an insulating film.

11. The semiconductor device according to claim 1, wherein an outer circumferential side end portion of the VLD region is located outside an outer circumferential side end portion of the first electrode.

12. The semiconductor device according to claim 8, further comprising a second field plate which is provided in the stopper layer so that the first field plate is separated from the second field plate.

13. The semiconductor device according to claim 1, wherein a pn junction boundary between the VLD region and the semiconductor substrate has a wavy shape toward the outer circumferential side.

* * * * *